(12) United States Patent
Cantoro et al.

(10) Patent No.: US 10,937,700 B2
(45) Date of Patent: Mar. 2, 2021

(54) SEMICONDUCTOR DEVICES

(71) Applicant: SAMSUNG ELECTRONICS CO., LTD., Suwon-si (KR)

(72) Inventors: Mirco Cantoro, Suwon-si (KR); Yun-Il Lee, Anyang-si (KR); Hyung-Suk Lee, Suwon-si (KR); Yeon-Cheol Heo, Suwon-si (KR); Byoung-Gi Kim, Suwon-si (KR); Chang-Min Yoe, Seoul (KR); Seung-Chan Yun, Suwon-si (KR); Dong-Hun Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/583,167

(22) Filed: May 1, 2017

(65) Prior Publication Data
US 2018/0130713 A1 May 10, 2018

(30) Foreign Application Priority Data
Nov. 9, 2016 (KR) .................. 10-2016-0148704

(51) Int. Cl.
*H01L 27/082* (2006.01)
*H01L 27/24* (2006.01)
(Continued)

(52) U.S. Cl.
CPC ............ *H01L 21/823456* (2013.01); *H01L 21/823412* (2013.01); *H01L 21/823431* (2013.01); *H01L 21/823487* (2013.01); *H01L 21/84* (2013.01); *H01L 27/0886* (2013.01); *H01L 27/1203* (2013.01); *H01L 29/161* (2013.01);
(Continued)

(58) Field of Classification Search
CPC ........ H01L 29/78642; H01L 29/42392; H01L 21/823487; H01L 27/0825; H01L 27/0828; H01L 21/8224; H01L 21/82285; H01L 27/0652; H01L 27/0658; H01L 27/0664; H01L 27/0716; H01L 27/0755–0777; H01L 27/0821; H01L 27/0823–0828; H01L 29/66333–66348; H01L 29/732–7327; H01L 29/7371–7378; H01L 29/7395–7398
See application file for complete search history.

(56) References Cited

U.S. PATENT DOCUMENTS

| | | | | |
|---|---|---|---|---|
| 3,384,833 A | * | 5/1968 | Hitt | ......................... H03F 3/217 330/9 |
| 6,632,712 B1 | * | 10/2003 | Ang | .................. H01L 21/82388 257/328 |

(Continued)

FOREIGN PATENT DOCUMENTS

JP    4826036    11/2011

*Primary Examiner* — Mary A Wilczewski
*Assistant Examiner* — Tsz K Chiu
(74) *Attorney, Agent, or Firm* — F. Chau & Associates, LLC

(57) ABSTRACT

A semiconductor device includes a first semiconductor pattern doped with first impurities on a substrate, a first channel pattern on the first semiconductor pattern, second semiconductor patterns doped with second impurities contacting upper edge surfaces, respectively, of the first channel pattern, and a first gate structure surrounding at least a portion of a sidewall of the first channel pattern.

4 Claims, 54 Drawing Sheets

(51) Int. Cl.

| | | |
|---|---|---|
| *H01L 27/115* | (2017.01) | |
| *H01L 21/8234* | (2006.01) | |
| *H01L 27/12* | (2006.01) | |
| *H01L 29/423* | (2006.01) | |
| *H01L 29/417* | (2006.01) | |
| *H01L 29/66* | (2006.01) | |
| *H01L 21/84* | (2006.01) | |
| *H01L 29/786* | (2006.01) | |
| *H01L 27/088* | (2006.01) | |
| *H01L 29/161* | (2006.01) | |
| *H01L 29/24* | (2006.01) | |
| *H01L 29/267* | (2006.01) | |
| *H01L 29/78* | (2006.01) | |

(52) U.S. Cl.
 CPC ............ *H01L 29/24* (2013.01); *H01L 29/267* (2013.01); *H01L 29/41733* (2013.01); *H01L 29/42384* (2013.01); *H01L 29/66666* (2013.01); *H01L 29/66742* (2013.01); *H01L 29/66772* (2013.01); *H01L 29/78642* (2013.01); *H01L 29/78696* (2013.01); *H01L 29/785* (2013.01); *H01L 29/7827* (2013.01)

(56) References Cited

U.S. PATENT DOCUMENTS

| | | | |
|---|---|---|---|
| 8,097,513 B2 | 1/2012 | Hong et al. | |
| 8,115,243 B2 | 2/2012 | Forbes | |
| 8,274,110 B2 * | 9/2012 | Sandhu | H01L 27/2463 257/329 |
| 8,372,713 B2 | 2/2013 | Masuoka et al. | |
| 9,142,660 B2 | 9/2015 | Guo et al. | |
| 9,177,924 B2 | 11/2015 | Colinge et al. | |
| 9,306,063 B2 | 4/2016 | Doyle et al. | |
| 9,373,620 B2 | 6/2016 | Wang et al. | |
| 9,437,503 B1 * | 9/2016 | Mallela | H01L 21/8238 |
| 9,607,899 B1 * | 3/2017 | Cheng | H01L 29/7827 |
| 9,711,618 B1 * | 7/2017 | Cheng | H01L 29/66545 |
| 10,164,056 B2 * | 12/2018 | Cheng | H01L 29/4966 |
| 10,312,151 B1 * | 6/2019 | Balakrishnan | H01L 29/1066 |
| 10,811,528 B2 * | 10/2020 | Ebrish | H01L 29/0653 |
| 2004/0135187 A1 * | 7/2004 | Bonart | H01L 27/10864 257/301 |
| 2005/0056892 A1 * | 3/2005 | Seliskar | H01L 21/84 257/348 |
| 2005/0285204 A1 * | 12/2005 | Kim | H01L 21/84 257/368 |
| 2008/0128797 A1 * | 6/2008 | Dyer | H01L 29/785 257/328 |
| 2014/0210010 A1 * | 7/2014 | Liu | H01L 21/82 257/368 |
| 2015/0318213 A1 * | 11/2015 | Tsai | H01L 29/42376 257/9 |
| 2016/0093608 A1 | 3/2016 | Chu et al. | |
| 2016/0104705 A1 | 4/2016 | Chung et al. | |
| 2016/0268256 A1 * | 9/2016 | Yang | H01L 27/088 |
| 2017/0365712 A1 * | 12/2017 | Bu | H01L 29/7827 |
| 2018/0068903 A1 * | 3/2018 | Adusumilli | H01L 21/28568 |
| 2019/0067459 A1 * | 2/2019 | Balakrishnan | H01L 29/66356 |
| 2020/0098867 A1 * | 3/2020 | Li | H01L 29/42364 |

* cited by examiner

FIG. 12
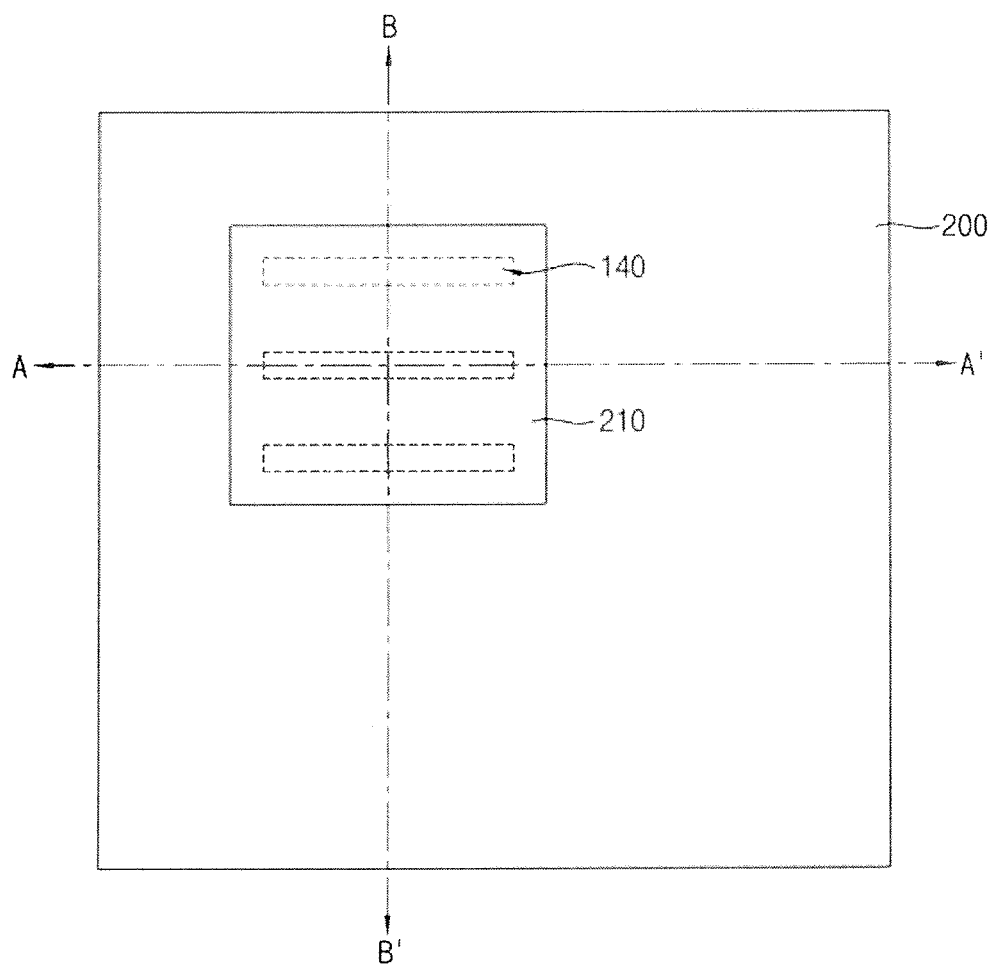
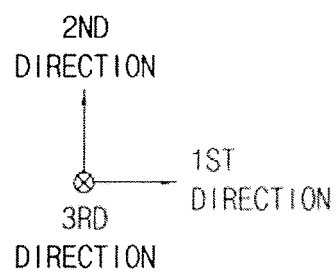

FIG. 20A
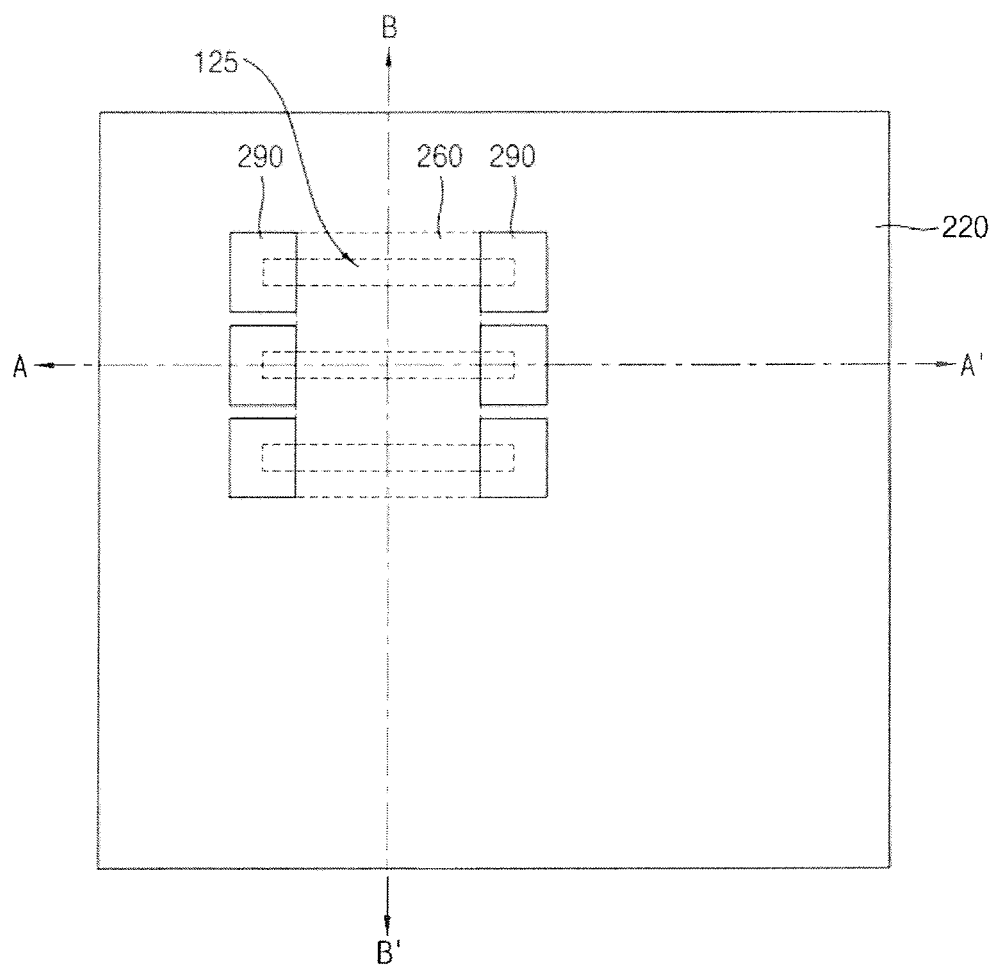
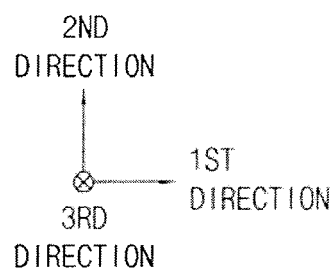

SEMICONDUCTOR DEVICES

CROSS-REFERENCE TO RELATED APPLICATION

This application claims priority under 35 USC § 119 to Korean Patent Application No. 10-2016-0148704, filed on Nov. 9, 2016 in the Korean Intellectual Property Office, the disclosure of which is incorporated by reference herein in its entirety.

TECHNICAL FIELD

Exemplary embodiments of the present inventive concept relate to semiconductor devices. More particularly, exemplary embodiments relate to transistors of logic devices.

DISCUSSION OF THE RELATED ART

In logic devices having a core and input/output drivers, a core transistor and an input/output transistor require different characteristics. For example, the input/output transistor needs a gate length greater than that of the core transistor. When the transistors have a finFET structure, an additional patterning process using an additional mask is needed in order to implement different gate lengths in the core transistor and the input/output transistor.

SUMMARY

According to an exemplary embodiment of the present inventive concept, a semiconductor device includes a first semiconductor pattern doped with first impurities on a substrate, and a first channel pattern on the first semiconductor pattern. The semiconductor device further includes second semiconductor patterns doped with second impurities. The second semiconductor patterns contact upper edge surfaces, respectively, of the first channel pattern. The semiconductor device still further includes a first gate structure that surrounds at least a portion of a sidewall of the first channel pattern.

According to an exemplary embodiment of the present inventive concept, a semiconductor device includes a first transistor on a substrate. The first transistor includes a first semiconductor pattern doped with first impurities, and a first channel pattern on the first semiconductor pattern. The first transistor further includes second semiconductor patterns which contact upper edge surfaces, respectively, of the first channel pattern. Each of the second semiconductor patterns is doped with second impurities. The first transistor still further includes a first gate structure that surrounds at least a portion of a sidewall of the first channel pattern. The semiconductor device also includes a second transistor on a substrate. The second transistor includes a third semiconductor pattern doped with third impurities, and a second channel pattern on the third semiconductor pattern. The second transistor further includes fourth semiconductor patterns doped with fourth impurities contacting upper edge surfaces, respectively, of the second channel pattern. Each of the fourth semiconductor patterns is doped with fourth impurities. The second transistor still further includes a second gate structure that surrounds at least a portion of a sidewall of the second channel pattern.

According to an exemplary embodiment of the present inventive concept, a method of forming a semiconductor device includes forming a first semiconductor pattern doped with first impurities. The method further includes forming a first channel pattern on the first semiconductor pattern. The first channel may include a first gate length. The method also includes forming second semiconductor patterns on respective edge surfaces of the first channel pattern. Each of the second semiconductor patterns may be doped with second impurities. The method further includes forming a first gate structure for surrounding at least a portion of a sidewall of the first channel pattern. The method still further includes forming a third semiconductor pattern doped with third impurities. The method further includes forming a second channel pattern on the third semiconductor pattern. The second channel may include a second gate length, and the second channel may be formed in a direction perpendicular to the first channel. The method also includes forming fourth semiconductor patterns on respective edge surfaces of the second channel pattern. Each of the fourth semiconductor patterns may be doped with fourth impurities. The method further includes forming a second gate structure for surrounding at least a portion of a sidewall of the first channel pattern.

In the semiconductor device in accordance with exemplary embodiments, a transistor to which a relatively increased voltage may be applied may have a relatively increased gate length and a horizontal channel, and a transistor to which a relatively decreased voltage may be applied may have a relatively decreased gate length and a vertical channel.

BRIEF DESCRIPTION OF THE DRAWINGS

The above and other features of the inventive concept will become more apparent by describing in detail exemplary embodiments thereof, with reference to the accompanying drawing, which:

FIGS. 3 to 23 are plan views and cross-sectional views illustrating stages of a method of manufacturing a semiconductor device in accordance with exemplary embodiments of the present inventive concept;

DESCRIPTION OF EMBODIMENTS

Exemplary embodiments of the present inventive concept will be described more fully hereinafter with reference to the accompanying drawings. The present disclosure may, however, be embodied in many different forms and should not be construed as limited to the embodiments set forth herein.

Figure 1:
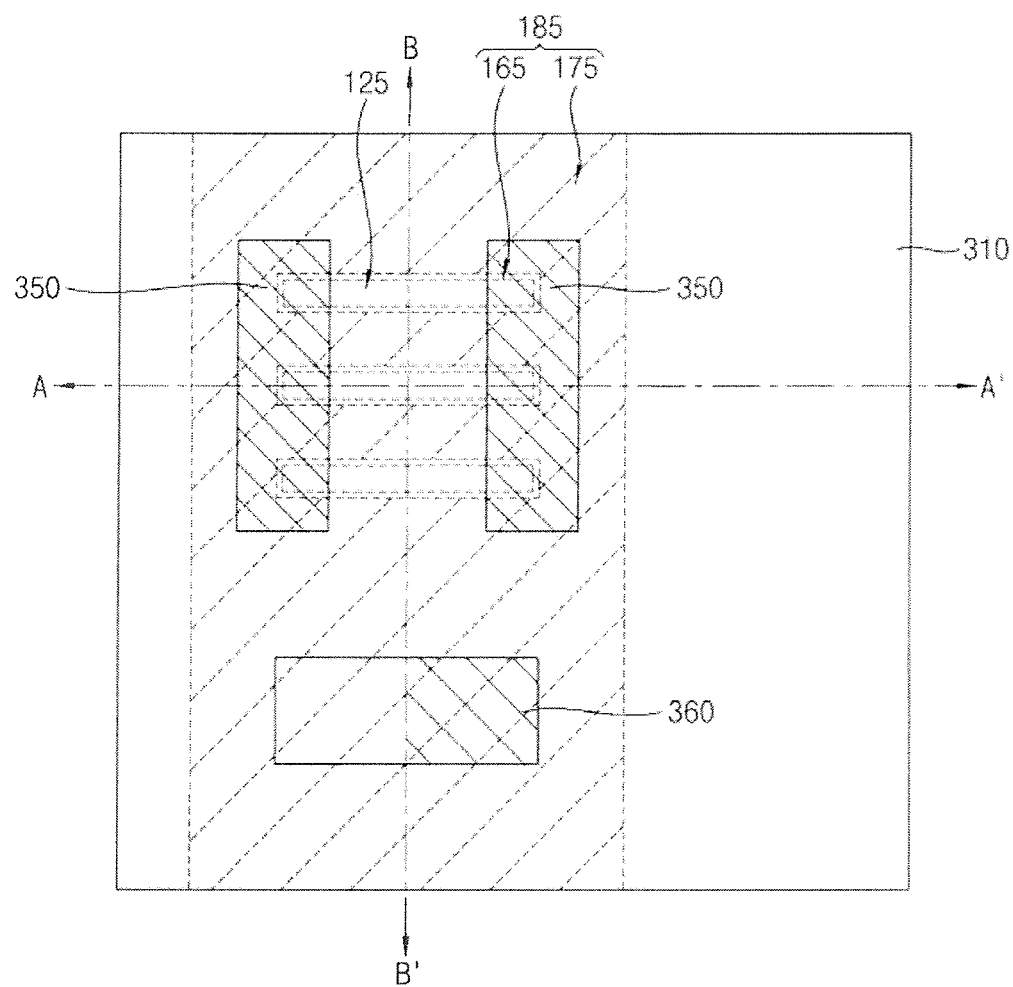
FIGS. 1 and 2 are a plan view and a cross-sectional view illustrating a semiconductor device in accordance with exemplary embodiments of the present inventive concept.
Figure 2:
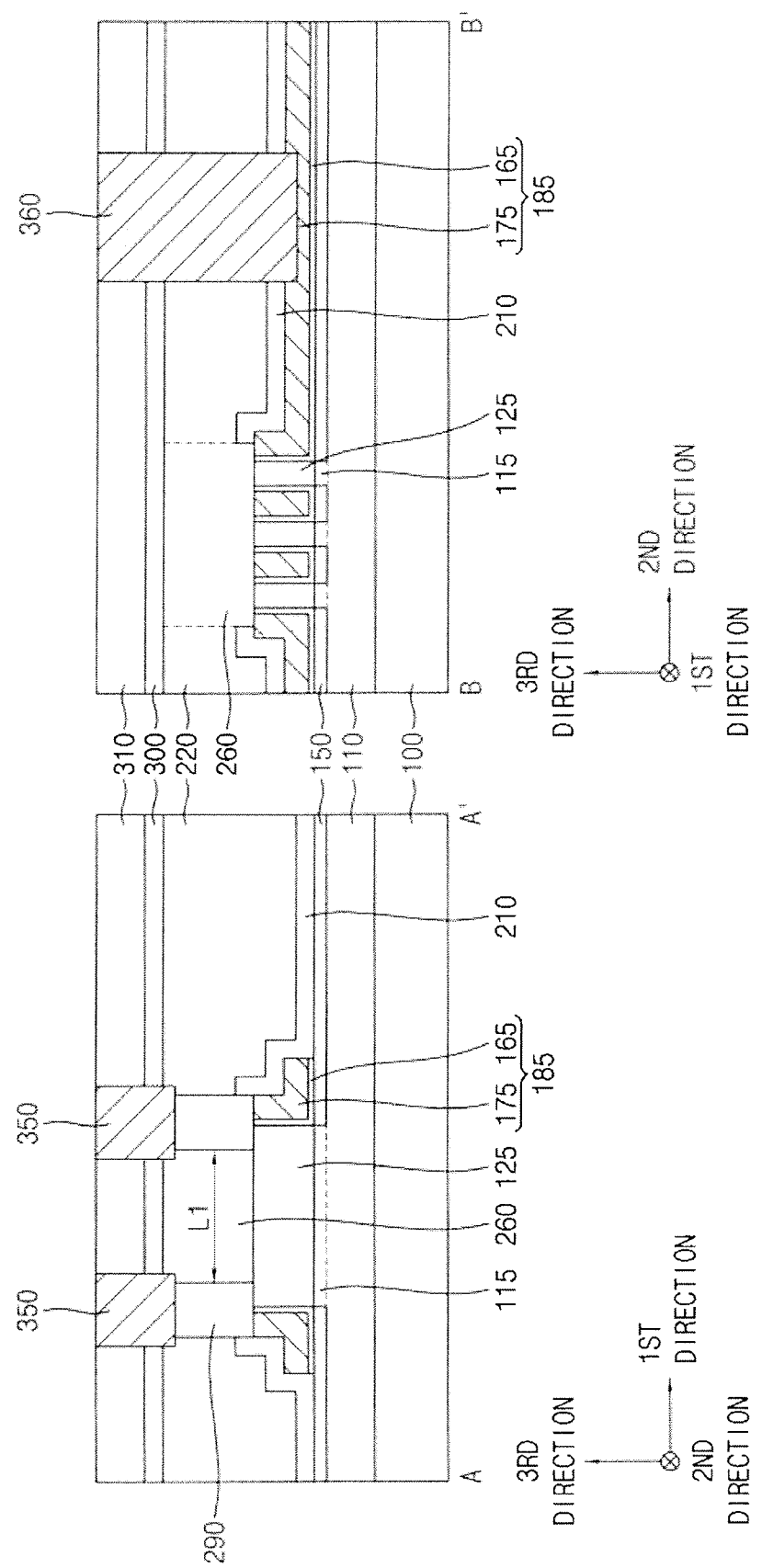

FIGS. 1 and 2 are a plan view and a cross-sectional view illustrating a semiconductor device in accordance with exemplary embodiments of the present inventive concept, respectively. FIG. 2 includes cross-sections taken along lines A-A' and B-B', respectively, of FIG. 1.

Hereinafter, directions substantially parallel to an upper surface of a substrate and crossing each other are defined as first and second directions, respectively, and a direction substantially perpendicular to the upper surface of the substrate is defined as a third direction. In an exemplary embodiment of the present inventive concept, the first and second directions may be substantially perpendicular to each other.

Referring to FIGS. 1 and 2, the semiconductor device may include a first semiconductor pattern 115, a first channel pattern 125, and a third semiconductor pattern 290, which may be sequentially stacked on a substrate 100, and a first gate structure 185 surrounding a sidewall of the first channel pattern 125. The semiconductor device may further include a first semiconductor layer 110, first and second insulation patterns 150 and 260, a first capping layer 210, first and second insulating interlayers 220 and 310, an etch stop layer 300, and first and second contact plugs 350 and 360.

The substrate 100 may include a semiconductor material, e.g., silicon, germanium, silicon-germanium, etc., or III-V semiconductor compounds, e.g., gallium phosphide (GaP), gallium arsenide (GaAs), gallium antimonide (GaSb), etc. In some embodiments, the substrate 100 may be a silicon-on-insulator (SOI) substrate, or a germanium-on-insulator (GOI) substrate.

The first semiconductor layer 110 may be disposed at an upper portion of the substrate 100 or on an upper surface of the substrate 100. In an exemplary embodiment of the present inventive concept, the first semiconductor layer 110 may include a semiconductor material, e.g., silicon, germanium, etc., and may further include first impurities. In an exemplary embodiment of the present inventive concept, the first semiconductor layer 110 may include a material substantially the same as that of the substrate 100. The first impurities may include n-type impurities, e.g., phosphorus, arsenic, etc., or p-type impurities, e.g., boron, aluminum, etc.

The first semiconductor pattern 115 may protrude from an upper surface of the first semiconductor layer 110, and may include a material substantially the same as that of the first semiconductor layer 110 so that the first semiconductor pattern 115 may be integrated with the first semiconductor layer 110. Thus, the first semiconductor pattern 115 may also include the first impurities that may be substantially the same as the first impurities in the first semiconductor layer 110.

In an exemplary embodiment of the present inventive concept, the first semiconductor pattern 115 may extend in the first direction, and a plurality of first semiconductor patterns 115 may be disposed in the second direction with a predetermined spacing between the pluralities of the first semiconductor patterns 115. FIG. 1 shows three first semiconductor patterns 115 disposed in the second direction, however, the inventive concepts may not be limited thereto.

The first insulation pattern 150 may be disposed on the first semiconductor layer 110, and may cover a sidewall of the first semiconductor pattern 115. In an exemplary embodiment of the present inventive concept, an upper surface of the first insulation pattern 150 may be substantially coplanar with or slightly higher than an upper surface of the first semiconductor pattern 115. The first insulation pattern 150 may include an insulating material, e.g., silicon nitride, silicon oxide, etc.

The first channel pattern 125 may be disposed on the upper surface of the first semiconductor pattern 115, and may extend in the first direction. In an exemplary embodiment of the present inventive concept, the first channel pattern 125 may have a shape and an area substantially the same as those of the first semiconductor pattern 115 when viewed in the third direction.

In an exemplary embodiment of the present inventive concept, the first channel pattern 125 may include undoped semiconductor material. For example, in an exemplary embodiment of the present inventive concept, the semiconductor material included in the first channel pattern 125 may be substantially the same as that of the first semiconductor layer 110 or of the first semiconductor pattern 115.

The first gate structure 185 may cover at least a portion of the sidewall of the first channel pattern 125. In an exemplary embodiment of the present inventive concept, the first gate structure 185 may cover the entire sidewall of the first channel pattern 125, and may fill a space between neighboring first channel patterns 125 that are disposed with a predetermined spacing in the second direction. Alternatively, in an exemplary embodiment of the present inventive concept, the first gate structure 185 may cover only a lower portion of the sidewall of the first channel pattern 125.

In an exemplary embodiment of the present inventive concept, the first gate structure 185 may extend in the second direction. The first gate structure 185 may be electrically insulated from the first semiconductor layer 110 by means of the first insulation pattern 150.

The first gate structure 185 may include a first gate insulation pattern 165 and a first gate electrode 175 that is disposed on the first gate insulation pattern 165. The first gate insulation pattern 165 may have a uniform thickness on the sidewall of the first channel pattern 125 and an upper surface of the first insulation pattern 150. Further, the thickness of the first gate insulation pattern 165 on the sidewall of the first channel pattern 125 may be substantially the same as that on the upper surface of the first insulation pattern 150. Each of the first gate insulation pattern 165 and the first gate electrode 175 may have a cross-section taken along the first direction or the second direction, which may have an "L-like" shape or "U-like" shape.

The third semiconductor patterns 290 may contact opposite end portions of the first channel patterns 125 that are extending in the first direction, and the third semiconductor patterns 290 disposed in parallel relationship on the respective opposite end portions of the first channel pattern 125 may be spaced apart from each other by a first length L1. The third semiconductor pattern 290 may also contact at least a portion of an upper surface of the first gate structure 185 that is disposed next to the end portion of the first channel pattern 125 in the first direction.

Figure 20B:
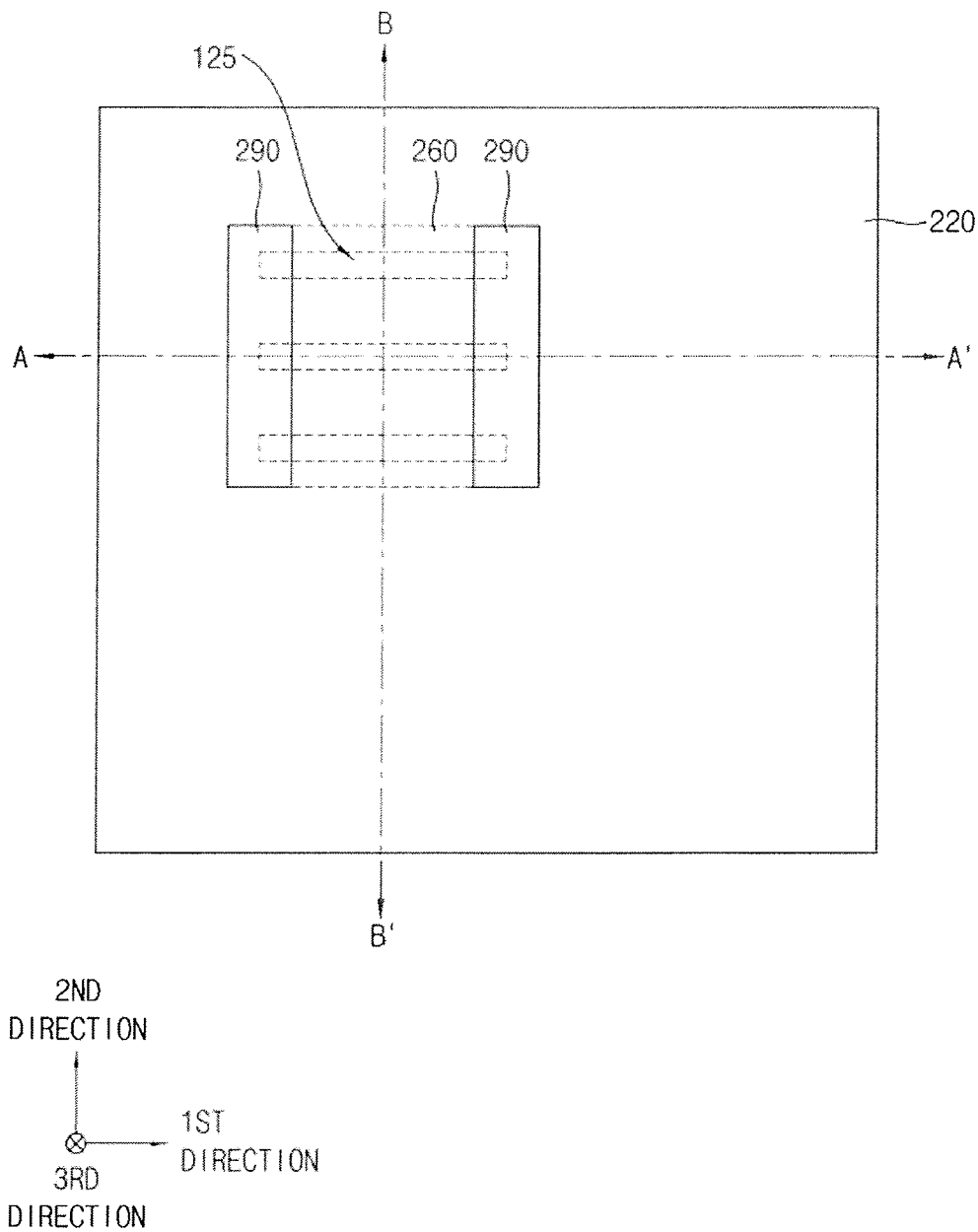

In an exemplary embodiment of the present inventive concept, the third semiconductor patterns 290 may be disposed on the plurality of first channel patterns 125 disposed in the second direction, with the third semiconductor patterns 290 being spaced apart from each other by a predetermined spacing in the second direction. For example, as shown in FIG. 20A, two third semiconductor patterns 290 may be disposed on the end portions of one of the first channel patterns 125. Alternatively, the third semiconductor patterns 290 may be disposed on the plurality of first channel patterns 125 disposed in the second direction, where the third semiconductor patterns 290 may form a single structure extending in the second direction. For example, as shown in FIG. 20B, two third semiconductor patterns 290 may be disposed on the end portions of the plurality of first channel patterns 125.

The third semiconductor pattern 290 may include a material substantially the same as that of the first channel pattern 125, and may further include third impurities. In an exemplary embodiment of the present inventive concept, the third impurities may have a conductivity type opposite that of the first impurities of the first semiconductor pattern 115. When the first impurities include n-type impurities, the third impurities may include p-type impurities, and the semiconductor device may include a positive-channel metal oxide semiconductor (PMOS) transistor. When the first impurities include p-type impurities, the third impurities may include n-type impurities, and the semiconductor device may include a negative-channel metal oxide semiconductor (NMOS) transistor.

The first capping layer 210 may cover at least partially the first gate structure 185, and may further cover at least a lower portion of a sidewall of the third semiconductor pattern 290. In exemplary embodiment of the present inventive concept, the first capping layer 210 may cover substantially most portions of an upper surface and a sidewall of the first gate structure 185, and may further cover a lower portion of an outer sidewall of the third semiconductor pattern 290. The first capping layer 210 may further cover an upper surface of the first insulation pattern 150. The first capping layer 210 may include a nitride, e.g., silicon nitride.

The first insulating interlayer 220 may be disposed on the first capping layer 210, and the second insulation pattern 260 may be disposed on the first channel pattern 125 and the first gate structure 185 between the third semiconductor patterns 290. The first insulating interlayer 220 and the second insulation pattern 260 may include an oxide, e.g., silicon oxide. In an exemplary embodiment of the present inventive concept, the first insulating interlayer 220 and the second insulation pattern 260 may include substantially the same material, and thus may be merged with each other.

The etch stop layer 300 and the second insulating interlayer 310 may be disposed on the first insulating interlayer 220 and the second insulation pattern 260. The etch stop layer 300 may include a nitride, e.g., silicon nitride, and the second insulating interlayer 310 may include an oxide, e.g., silicon oxide.

The first contact plug 350 may extend through the second insulating interlayer 310 and the etch stop layer 300, and may contact an upper surface of the third semiconductor pattern 290. In an exemplary embodiment of the present inventive concept, the first contact plug 350 may extend partially through portions of the first insulating interlayer 220 and the second insulation pattern 260 adjacent the third semiconductor pattern 290.

The second contact plug 360 may extend through the second insulating interlayer 310, the etch stop layer 300, the first insulating interlayer 220, and the first capping layer 210, and may contact an upper surface of the first gate electrode 175. In an exemplary embodiment of the present inventive concept, the second contact plug 360 may extend partially through an upper portion of the first gate electrode 175.

Each of the first and second contact plugs 350 and 360 may include a metal, e.g., tungsten, copper, etc. Each of the first and second contact plugs 350 and 360 may further include a barrier layer (not shown) including a metal nitride, e.g., tantalum nitride, titanium nitride, tungsten nitride, etc.

In the semiconductor device, when a voltage is applied to the first contact plugs 350, a current may flow through the third semiconductor patterns 290 contacting both the first contact plugs 350 and the first channel pattern 125. Thus, a channel may be generated in the first direction, i.e., in a horizontal direction through the first channel pattern 125. Herein, a gate length may be defined as a distance between neighboring ones of the third semiconductor patterns 290 spaced apart from each other in the first direction, which may be the first length L1.

For example, in case the semiconductor device comprises an input/output device (I/O device) of a logic device, an increased voltage may be applied to the first contact plugs 350, which may require an increased gate length. The increased gate length may be implemented by elongating the first channel pattern 125 in the first direction so that the first length L1 between the third semiconductor patterns 290 on the upper edge surfaces of the first channel pattern 125 may increase.

When the semiconductor device comprises the I/O device to which an increased voltage may be applied, the first gate structure 185 may need a gate insulation layer with increased thickness. In this case, the first gate structure 185 may further include a silicon oxide layer on a sidewall of the first channel pattern 125.

FIGS. 3 to 23 are plan views and cross-sectional views illustrating stages of a method of manufacturing a semiconductor device in accordance with exemplary embodiments of the present inventive concept. For example, FIGS. 3, 5, 8, 10, 12, 14, 16, 18, 20 and 22 are plan views, and FIGS. 4, 6-7, 9, 11, 13, 15, 17, 19, 21 and 23 are cross-sectional views. Each cross-sectional view may include cross-sections taken along lines A-A' and B-B', respectively, of a corresponding plan view.

Figure 3:
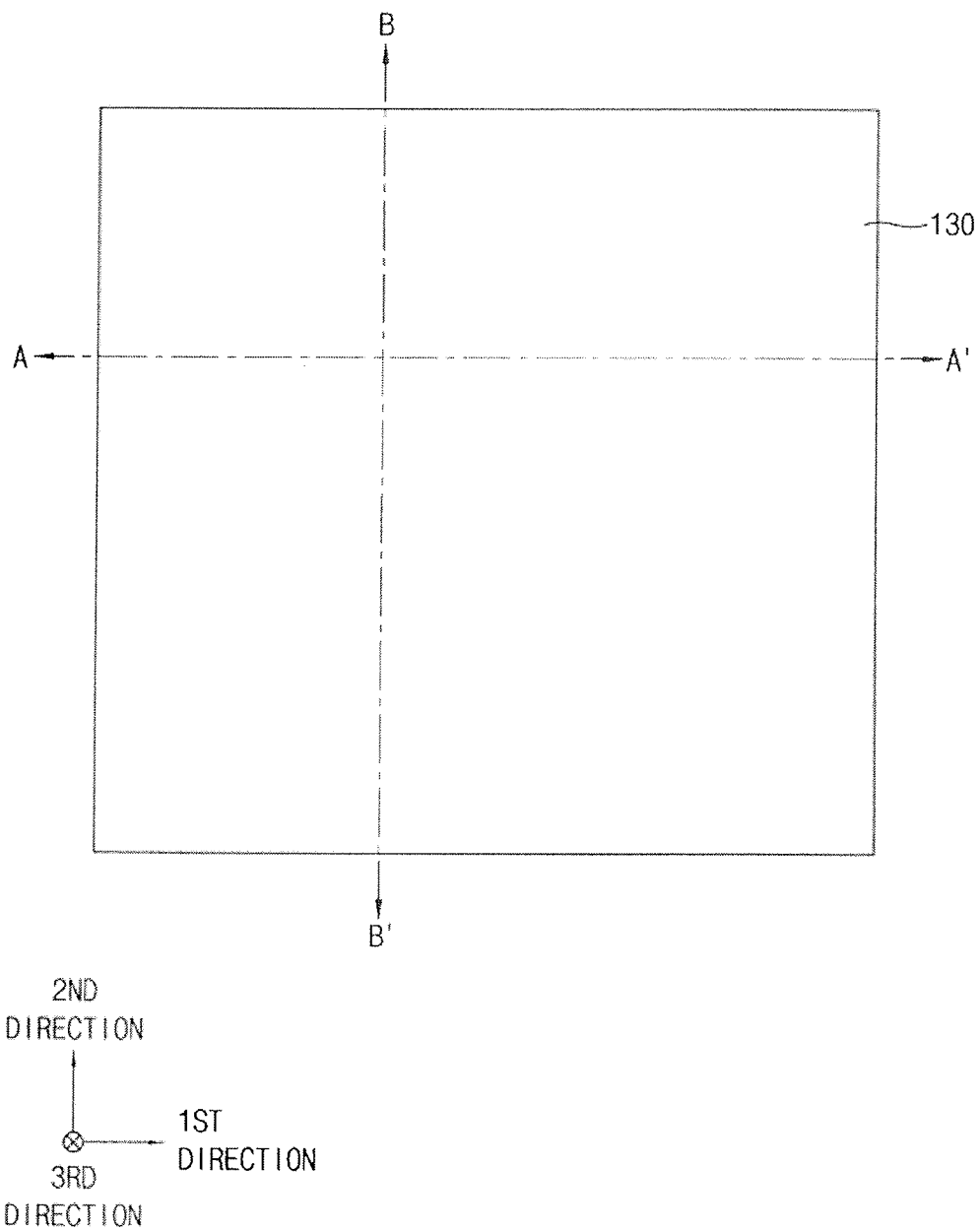
Figure 4:
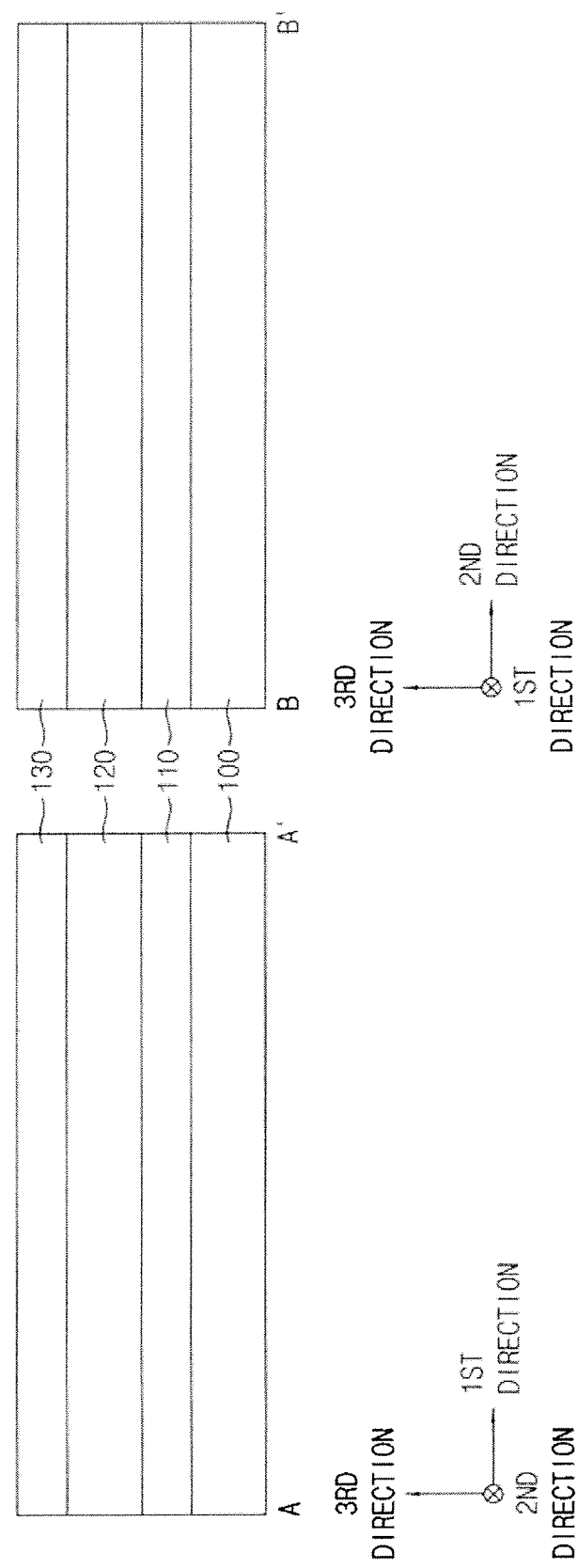

Referring to FIGS. 3 and 4, a first semiconductor layer 110, a first channel layer 120, and a second semiconductor layer 130 may be sequentially disposed on a substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate, or a GOI substrate.

In an exemplary embodiment of the present inventive concept, the first semiconductor layer 110 may be disposed by implanting first impurities into an upper portion of the substrate 100. Alternatively, the first semiconductor layer 110 may be disposed by a selective epitaxial growth (SEG) process using an upper surface of the substrate 100 as a seed, and an impurity source gas including the first impurities may be also used to form the first semiconductor layer 110 doped with the first impurities.

In an exemplary embodiment of the present inventive concept, the first channel layer 120 may be disposed by the SEG process using the first semiconductor layer 110 as a seed. In an exemplary embodiment of the present inventive concept, the first channel layer 120 may not be doped with impurities.

In an exemplary embodiment of the present inventive concept, the second semiconductor layer 130 may be disposed by implanting second impurities into an upper portion of the first channel layer 120. Alternatively, the second semiconductor layer 130 may be disposed by a SEG process using an upper surface of the first channel layer 130 as a seed, and an impurity source gas including the second impurities may be also used to form the second semiconductor layer 130 doped with the second impurities.

In an exemplary embodiment of the present inventive concept, the first and second impurities may have the same conductivity type. Each of the first and second impurities may include n-type impurities, e.g., phosphorus, arsenic, etc., or p-type impurities, e.g., boron, aluminum, etc.

Figure 5:
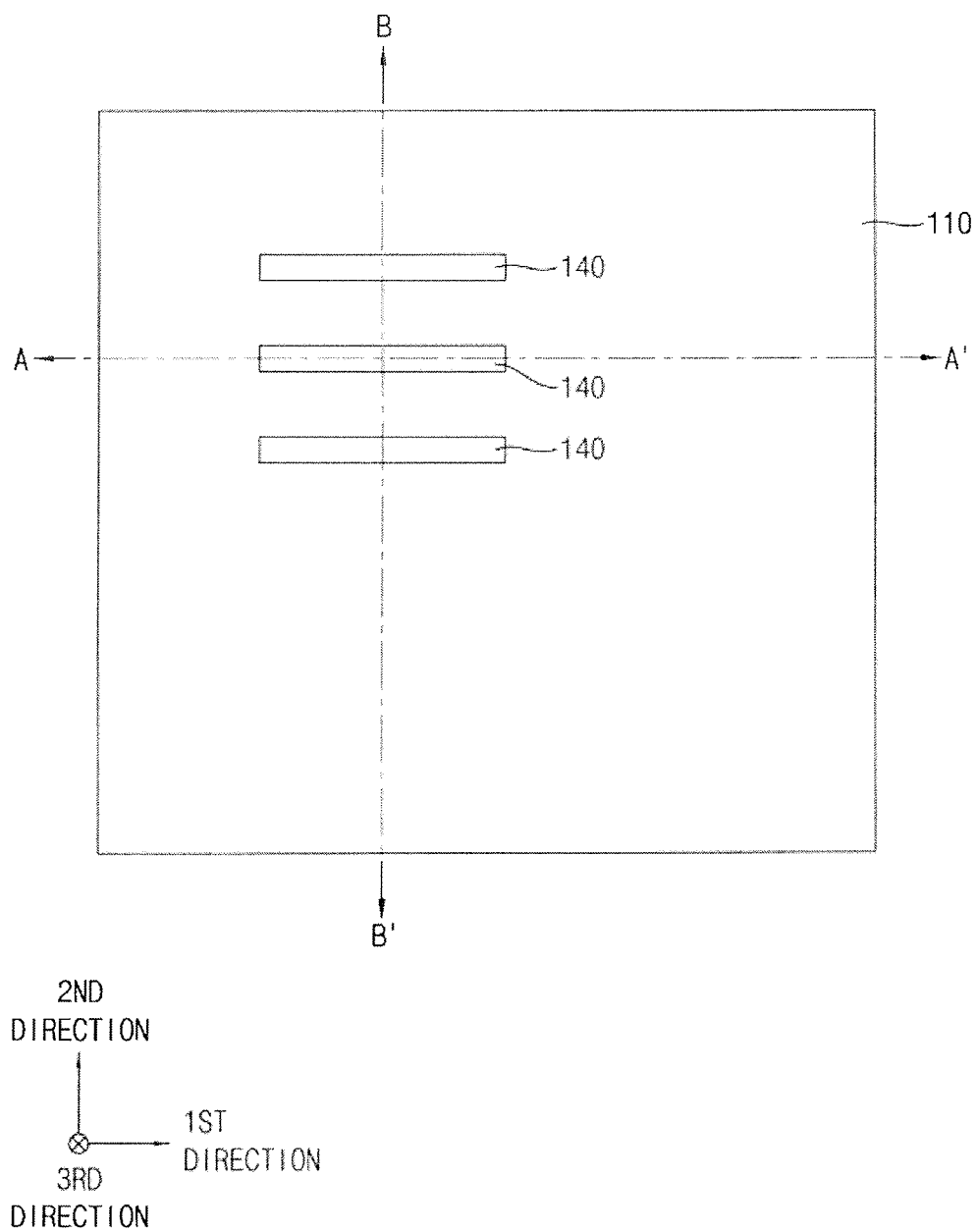
Figure 6:
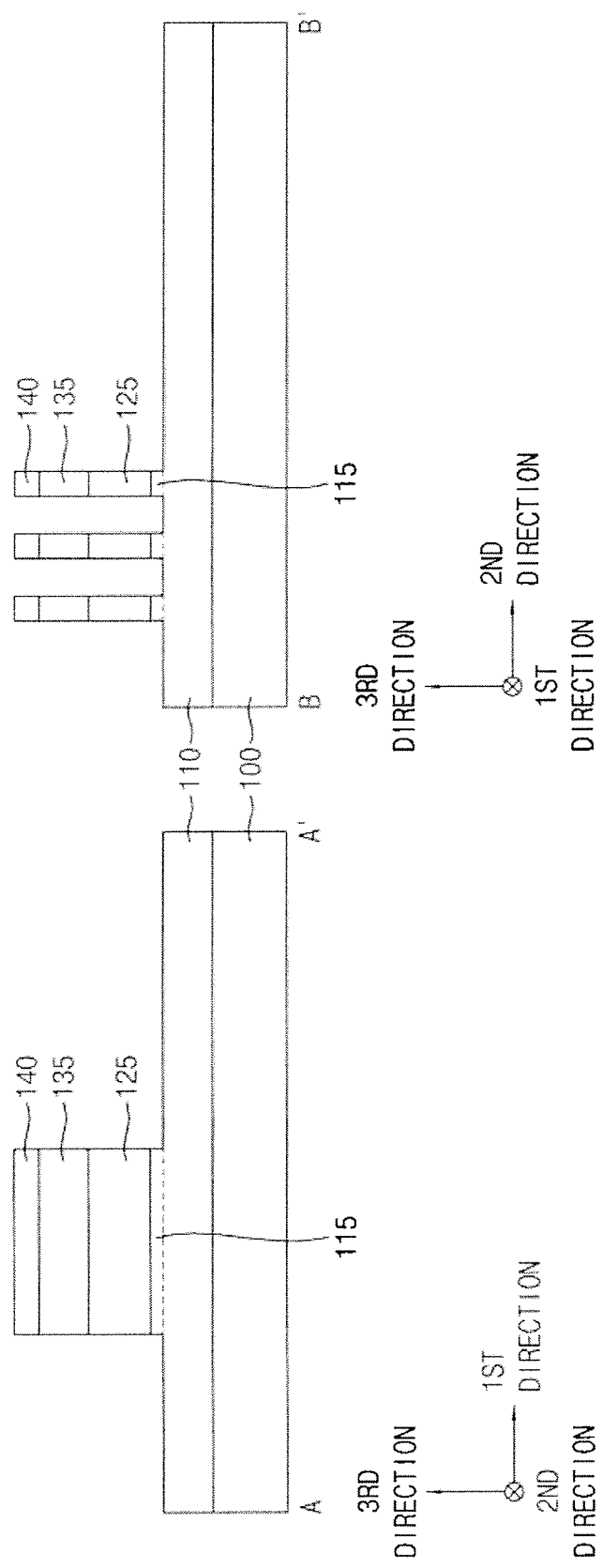

Referring to FIGS. 5 and 6, a first mask 140 may be disposed on the second semiconductor layer 130, and the second semiconductor layer 130, the first channel layer 120, and an upper portion of the first semiconductor layer 110 may be etched using the first mask 140 as an etching mask.

Thus, the first semiconductor layer 110 may include a first semiconductor pattern 115 protruding from an upper surface of the first semiconductor layer 110, and a first channel pattern 125, a second semiconductor pattern 135, and the first mask 140 may be sequentially stacked on the first semiconductor pattern 115. Hereinafter, the first semiconductor pattern 115, the first channel pattern 125, the second semiconductor pattern 135, and the first mask 140 sequentially stacked may be referred to as a first structure.

In an exemplary embodiment of the present inventive concept, the first structure may extend in the first direction, and a plurality of first structures may be disposed in the second direction. FIGS. 5 and 6 show three first structures disposed in the second direction, however, the inventive concepts may not be limited thereto. For example, more than or less than three first structures may be disposed in the second direction.

Figure 7:
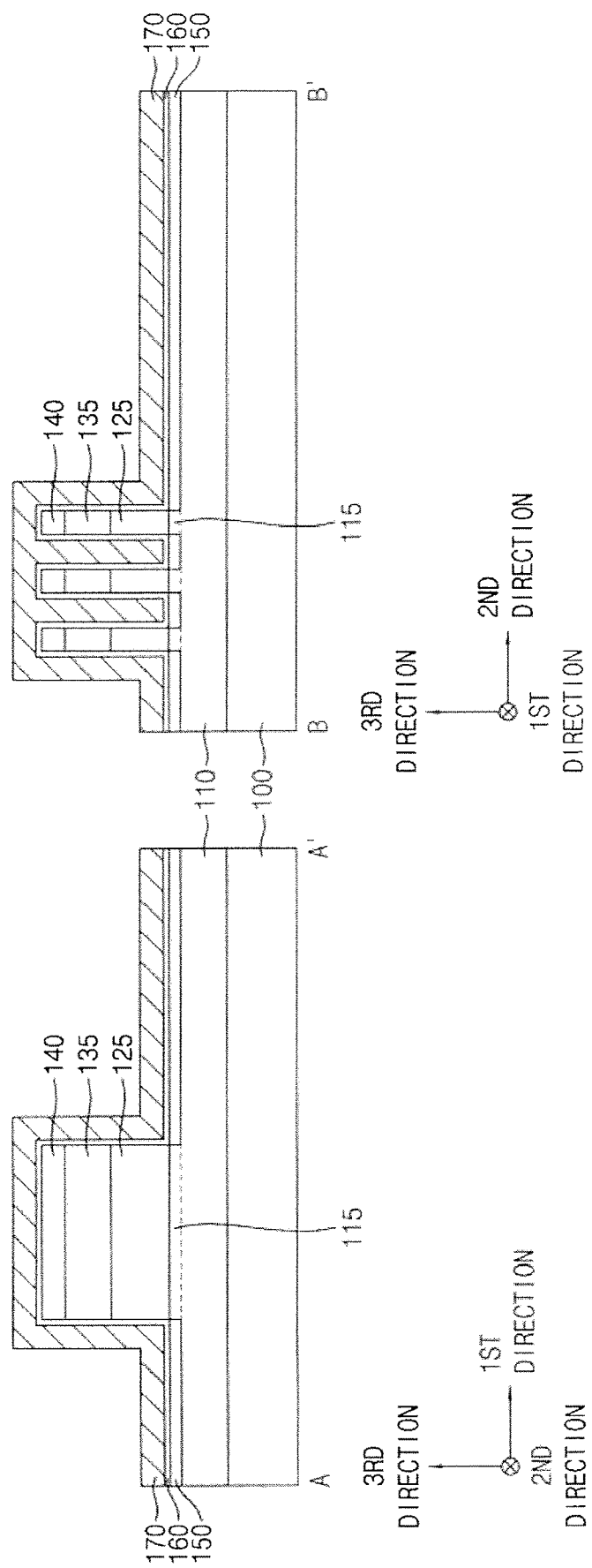

Referring to FIG. 7, a first insulation pattern 150 may be disposed on the first semiconductor layer 110. A first gate insulation layer 160 may cover the first structure, and a first gate electrode layer 170 may be disposed on the first insulation pattern 150.

In an exemplary embodiment of the present inventive concept, the first insulation pattern 150 may be disposed to have a thickness so that an upper surface of the first insulation pattern 150 may be substantially coplanar with or higher than an upper surface of the first semiconductor pattern 115. The first insulation pattern 150 may include an insulating material, e.g., silicon nitride, silicon oxide, etc.

The first gate insulation layer 160 may be conformally disposed on a sidewall and an upper surface of the first structure, and an upper surface of the first semiconductor layer 110. The first gate electrode layer 170 may be disposed to have a thickness so that the first gate electrode layer 170 may fill a space between the first structures.

The first gate insulation layer 160 may include a metal oxide having a high dielectric constant, e.g., hafnium oxide, tantalum oxide, zirconium oxide, etc., and the first gate electrode layer 170 may include a low resistance metal, e.g., aluminum, copper, tantalum, etc., and/or a nitride thereof.

A workfunction control layer (not shown) including a metal nitride or a metal alloy, e.g., titanium nitride, titanium aluminum, titanium aluminum nitride, tantalum nitride, tantalum aluminum nitride, etc., may be further disposed between the first gate insulation layer 160 and the first gate electrode layer 170.

When the semiconductor device needs a gate insulation layer with increased thickness as illustrated with reference to FIGS. 1 and 2, before forming the first gate insulation layer 160 and the first gate electrode layer 170, a thermal oxidation process may be performed on the first structure to further form a silicon oxide layer (not shown) on a sidewall of the first structure.

Figure 8:
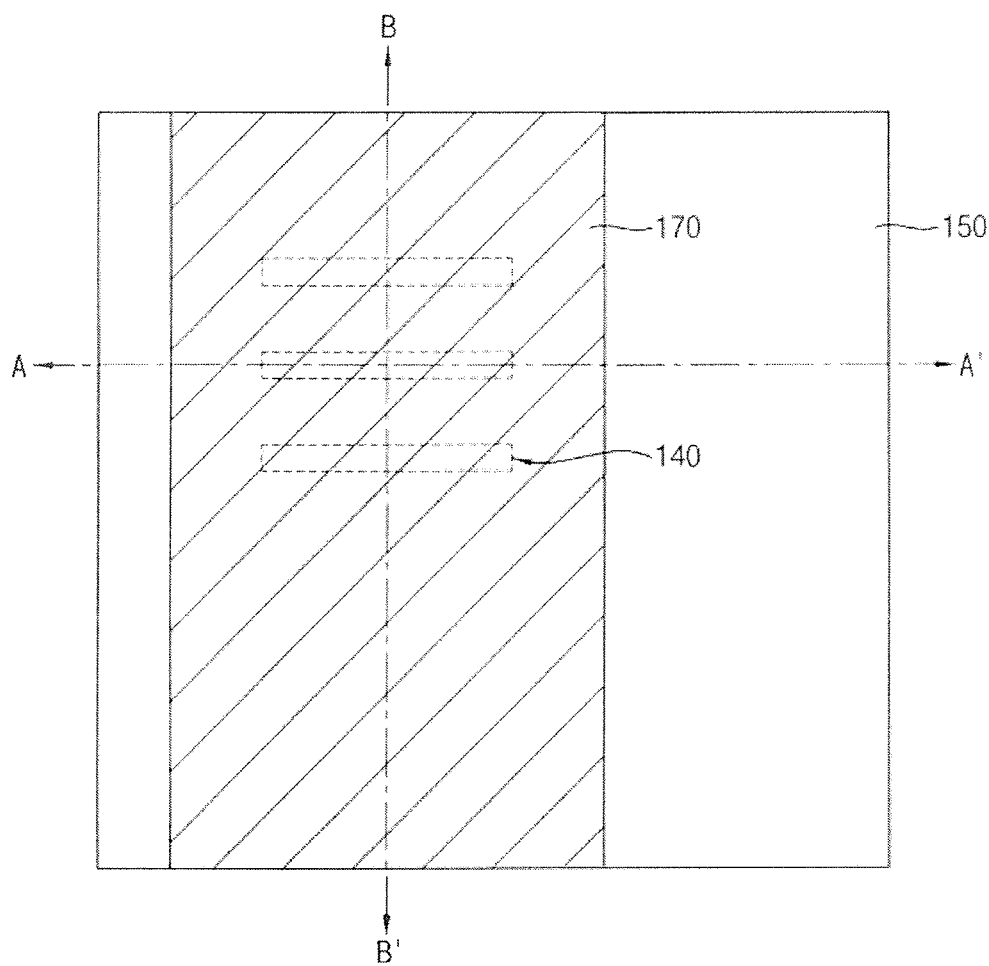
Figure 9:
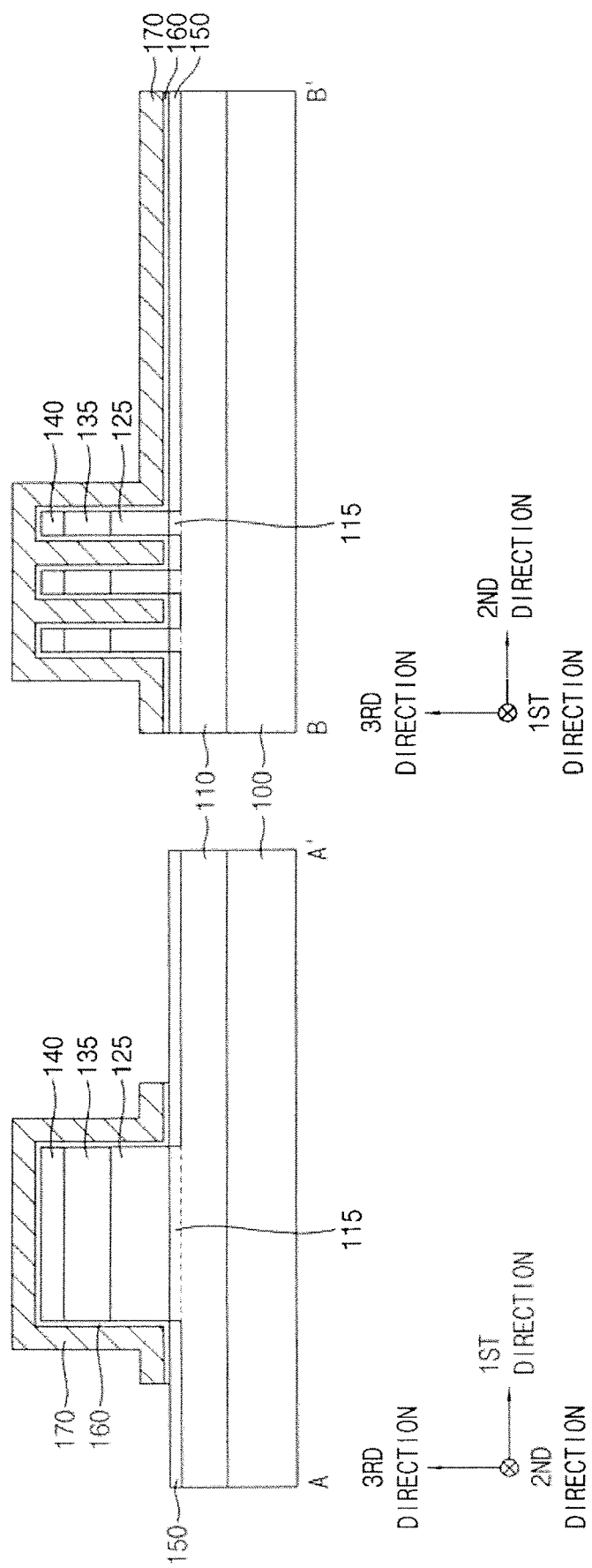
Figure 10:
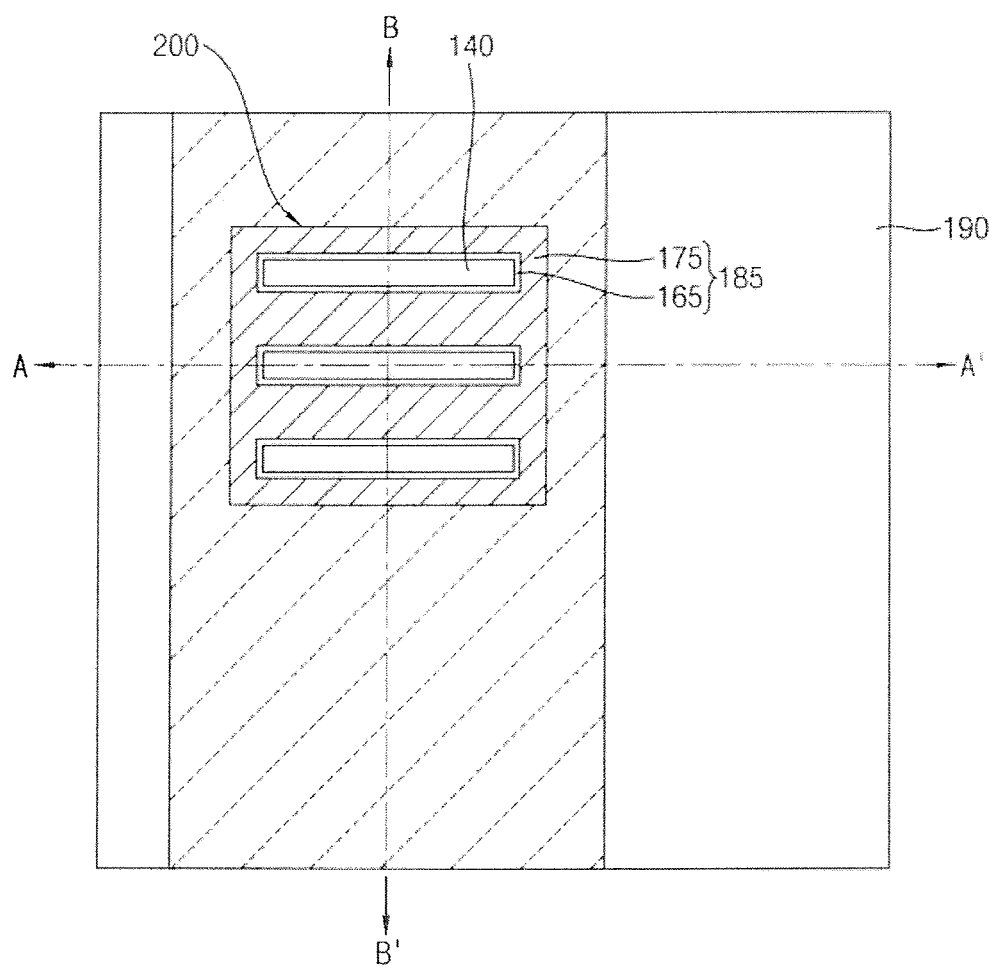

Referring to FIGS. 8 and 9, the first gate electrode layer 170 and the first gate insulation layer 160 may be partially etched, and thus an upper surface of the first insulation pattern 150 may be partially exposed.

In an exemplary embodiment of the present inventive concept, each of the first gate electrode layer 170 and the first gate insulation layer 160 may extend in the second direction to cover the first structures, and each of the first gate electrode layer 170 and the first gate insulation layer 160 may have a width in the first direction that may be greater than that of the first structure.

Figure 11:
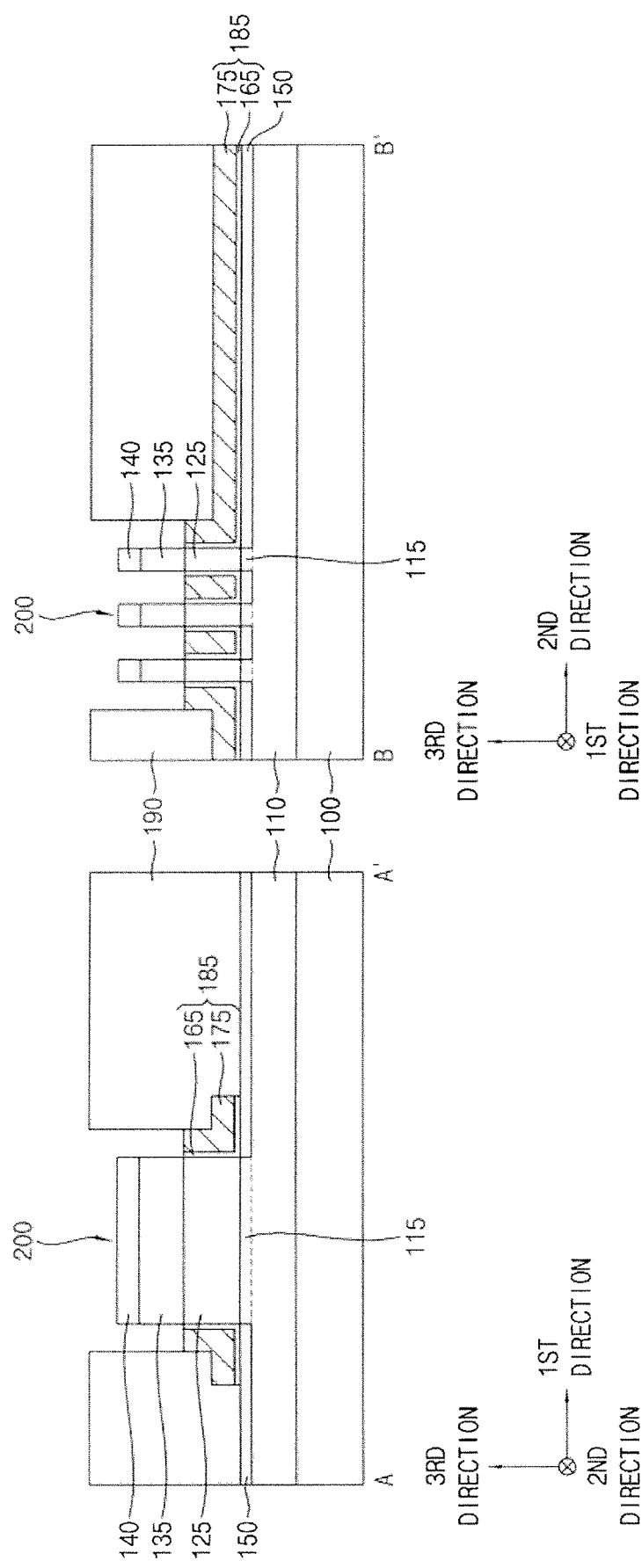

Referring to FIGS. 8 and 11, a sacrificial layer 190 may be disposed on the first gate electrode layer 170, and an upper portion of the sacrificial layer 190 may be planarized to expose a portion of the first gate electrode layer 170 on the upper surface of the first structure.

The sacrificial layer 190 may include an oxide, e.g., silicon oxide. In exemplary embodiment of the present inventive concept, the planarization process may be performed by a chemical mechanical polishing (CMP) process and/or an etch back process.

The exposed portion of the first gate electrode layer 170 and a portion of the first gate insulation layer 160, as shown, for example, in FIG. 9, may be partially etched to form a first gate electrode 175 and a first gate insulation pattern 165, respectively. The first gate insulation pattern 165 and the first gate electrode 175 may form a first gate structure 185.

The first gate structure 185 may be formed by a dry etching process or a wet etching process, and a first opening 200 may be formed in the sacrificial layer 190 by the etching process to expose an upper portion of the first structure. The first mask 140 and the second semiconductor pattern 135 of the first structure may be exposed by the first opening 200.

In an exemplary embodiment of the present inventive concept, an upper surface of the first gate structure 185 may be substantially coplanar with an upper surface of the first channel pattern 125. However, the inventive concepts may not be limited thereto, and the upper surface of the first gate structure 185 may be higher or lower than the upper surface of the first channel pattern 125.

Figure 13:
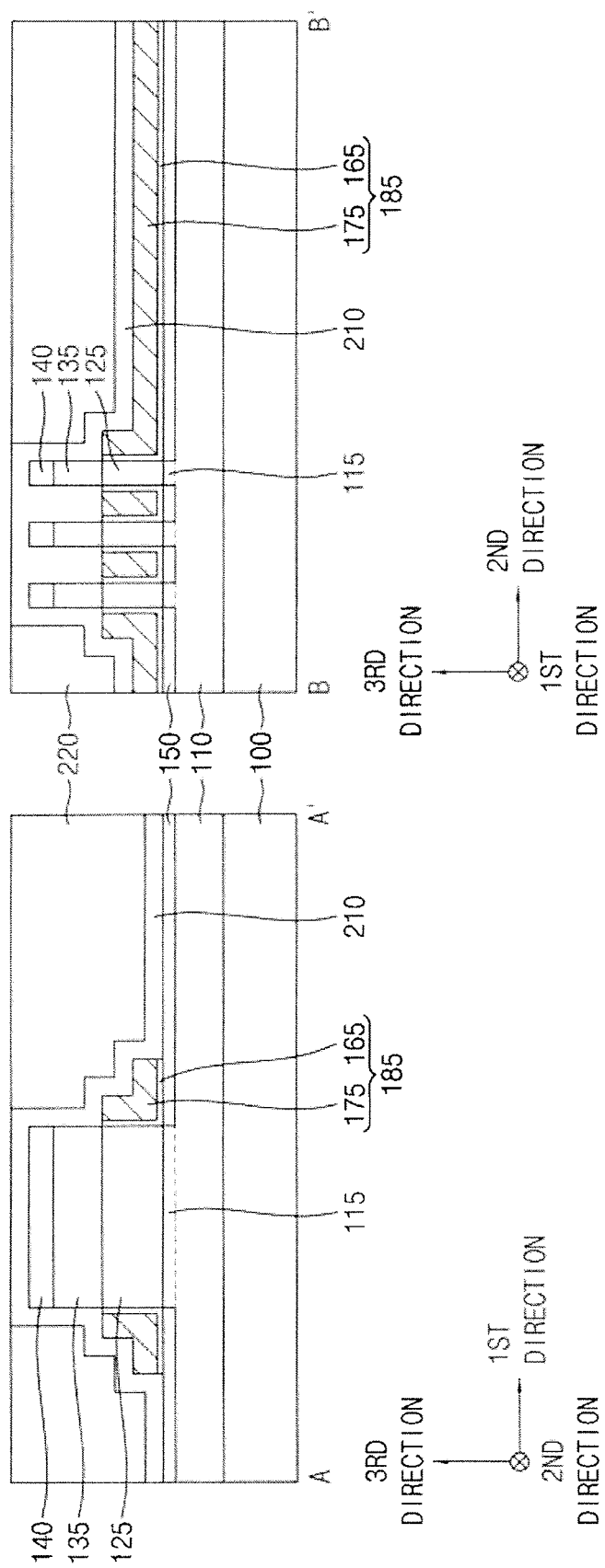

Referring to FIGS. 12 and 13, after removing the sacrificial layer, a first capping layer 210 may be formed on the first insulation pattern 150 to cover the exposed upper portion of the first structure and the exposed upper and side portions of the first gate structure 185.

In an exemplary embodiment of the present inventive concept, the first capping layer 210 may be conformally disposed on the exposed upper and side portions of the first structure, on the exposed upper and side portions of the first gate structure 185, and the exposed upper portion of the first insulation pattern 150. However, the first capping layer 210 may also fill a space formed between the exposed portions of the first structures. The first capping layer 210 may include a nitride, e.g., silicon nitride.

A first insulating interlayer 220 may be disposed on the first capping layer 210, and an upper portion of the first insulating interlayer 220 may be planarized until an upper surface of the first capping layer 210 may be exposed. The first insulating interlayer 220 may include an oxide, e.g., silicon oxide.

Figure 14:
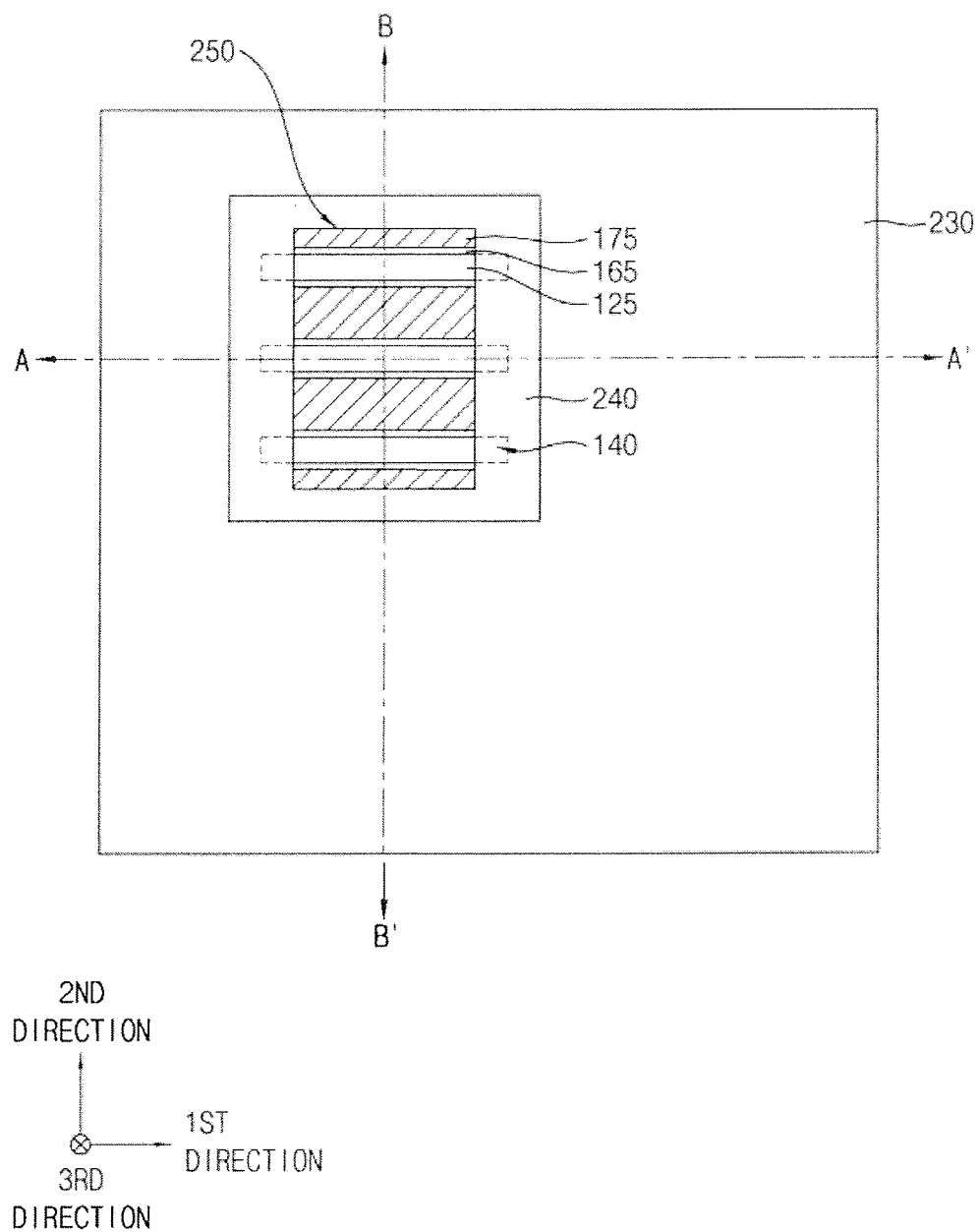
Figure 15:
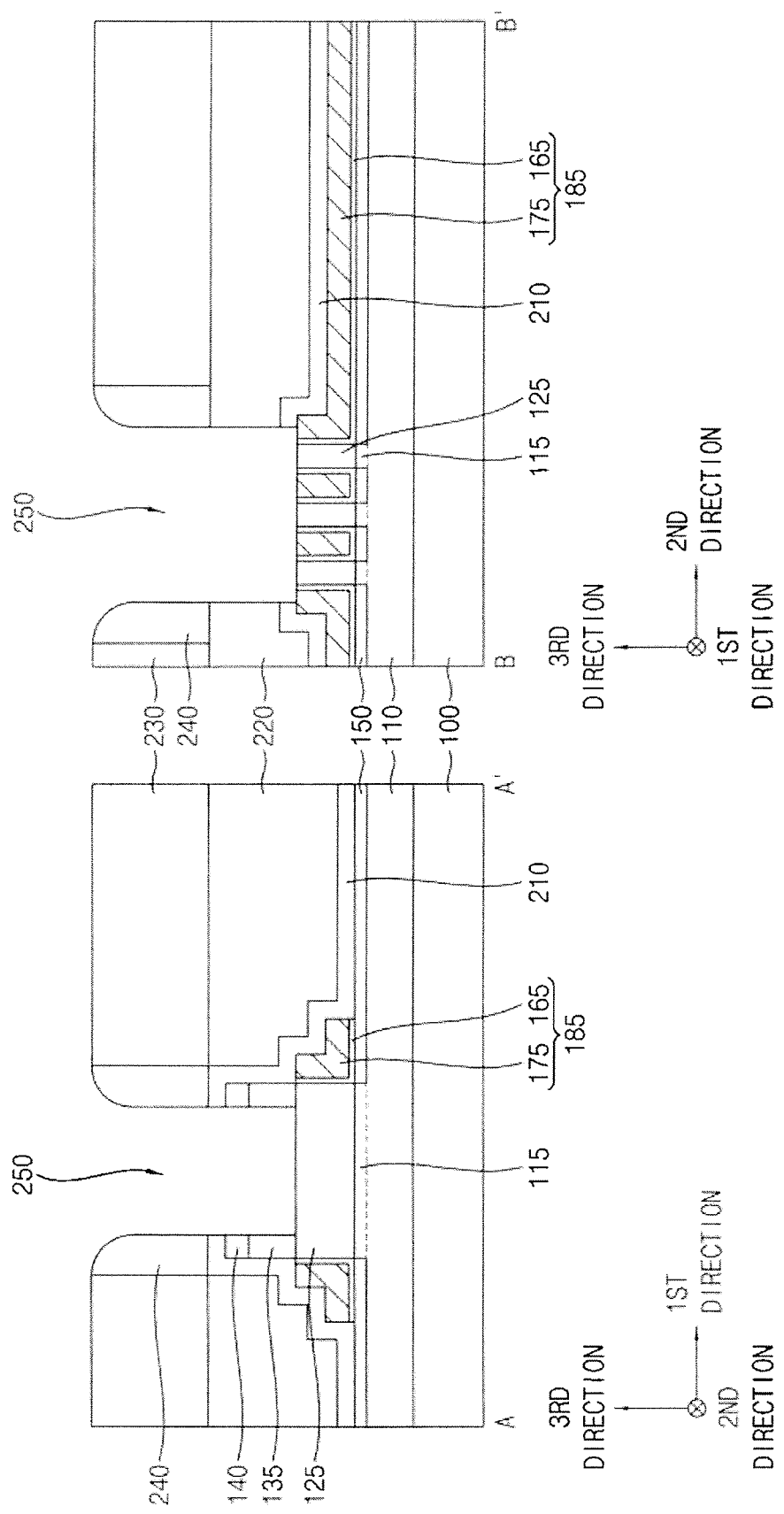

Referring to FIGS. 14 and 15, a second mask 230 having a second opening 250 exposing the exposed upper surface of the first capping layer 210 may be disposed on the first insulating interlayer 220, and a first spacer 240 may be formed on a sidewall of the second mask 230 having the second opening 250.

In an exemplary embodiment of the present inventive concept, the first spacer 240 may be disposed by disposing a first spacer layer on the exposed upper surface of the first capping layer 210, a sidewall of the second opening 250, and the second mask 230, and anisotropically etching the first spacer layer.

The second mask 230 may include an insulating material, e.g., spin-on-hardmask (SOH), and the first spacer layer may include an oxide, e.g., silicon oxide.

An etching process using the second mask 230 and the first spacer 240 as an etching mask may be performed to etch the exposed portion of the first capping layer 210, and portions of the underlying first mask 140 and the second semiconductor pattern 135, and thus the second opening 250 may be enlarged downwardly. An upper surface of the first channel pattern 125 and an upper surface of the first gate structure 185 surrounding the first channel pattern 125 may be partially exposed by the enlarged second opening 250.

In an exemplary embodiment of the present inventive concept, in the etching process, opposite end portions of each of the second semiconductor pattern 135 and the first mask 140 in the first direction may not be removed but remain.

Figure 16:
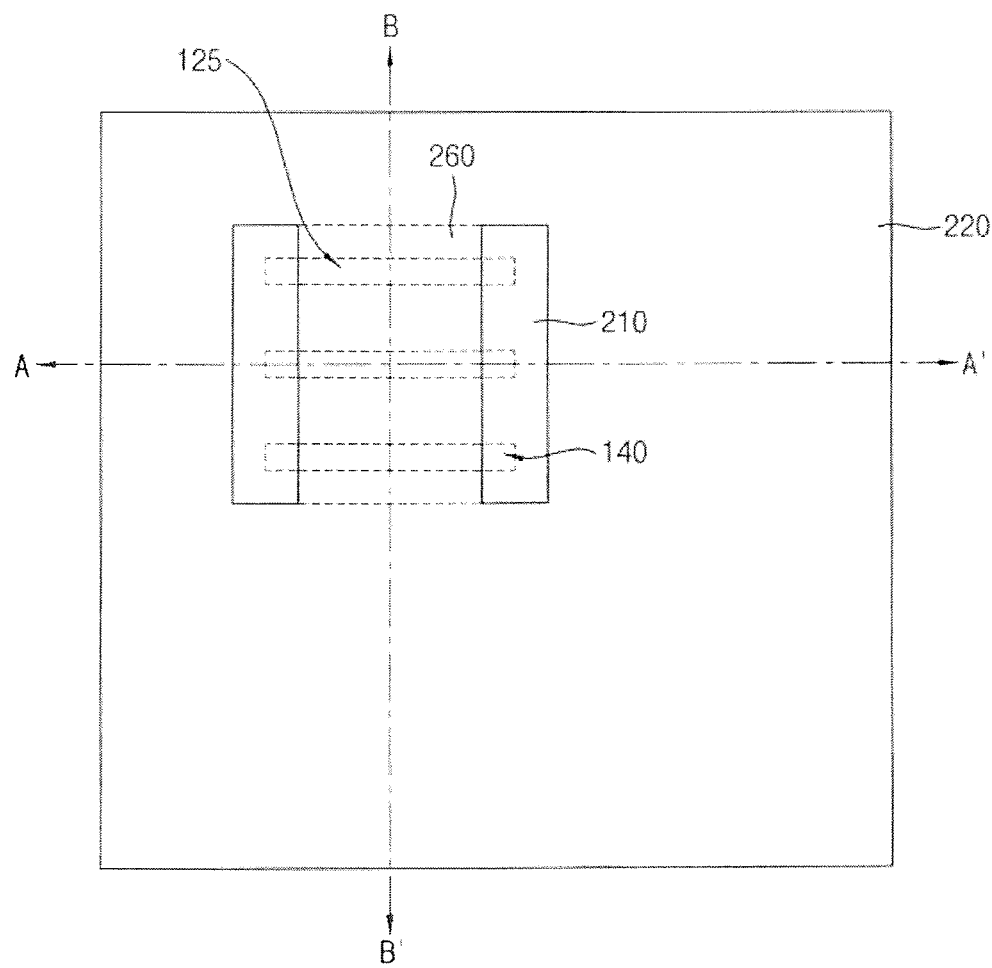
Figure 17:
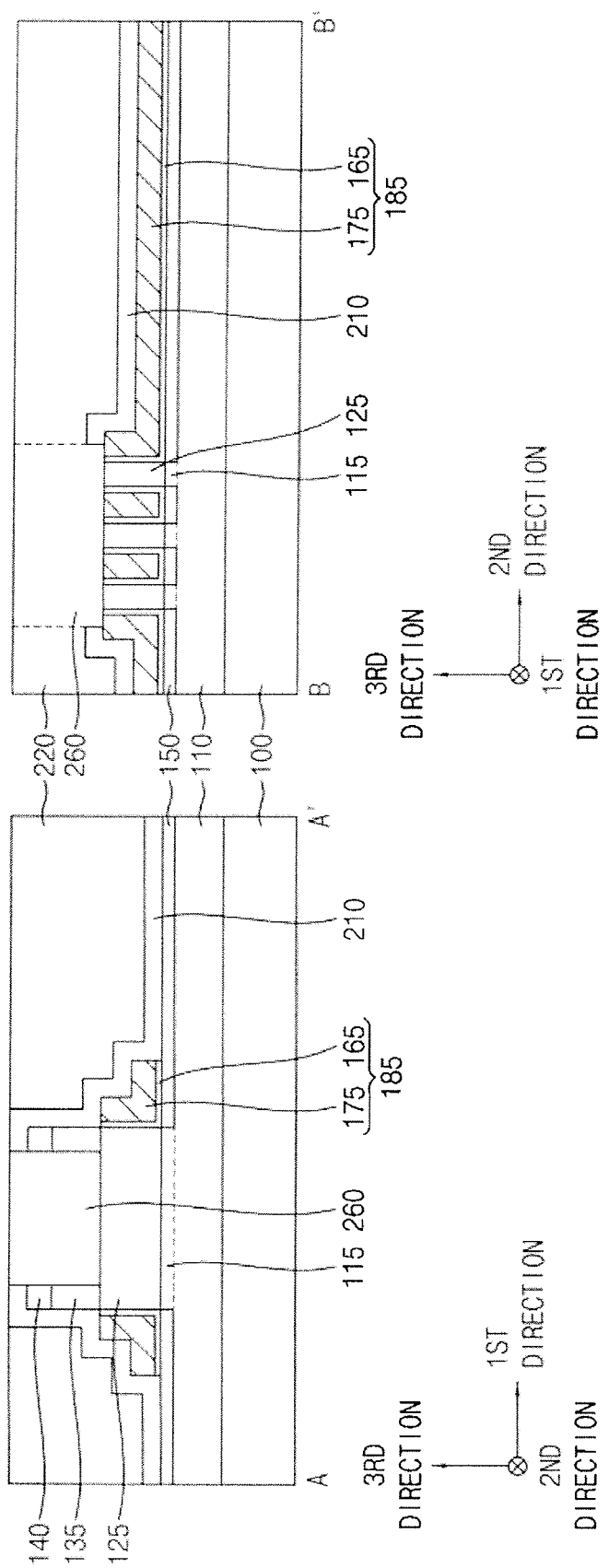

Referring to FIGS. 16 and 17, the second mask 230 and the first spacer 240 may be removed, and a second insulation pattern 260 may fill the second opening 250.

In an exemplary embodiment of the present inventive concept, the second insulation pattern 260 may be formed by disposing a second insulation layer on the exposed upper surface of the first channel pattern 125, the first gate structure 185, and on an upper surface of the first insulating interlayer 220 to fill the second opening 250, and planarizing the second insulation layer until the upper surfaces of the first capping layer 210 and the first insulating interlayer 220 may be exposed.

The second insulation layer may include an oxide, e.g., silicon oxide. In an exemplary embodiment of the present inventive concept, the second insulation layer may include a material substantially the same as that of the first insulating interlayer 220, thus the second insulation pattern 260 may be merged with the first insulating interlayer 220.

Figure 18:
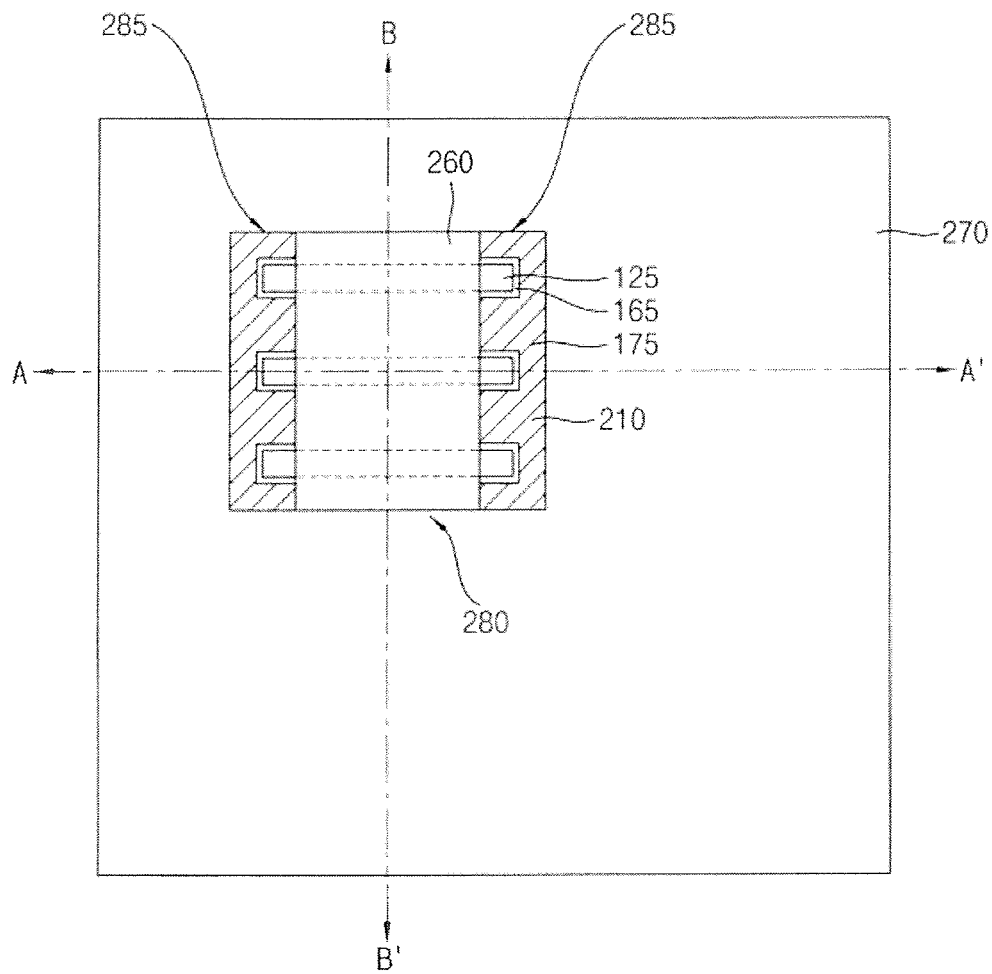
Figure 19:
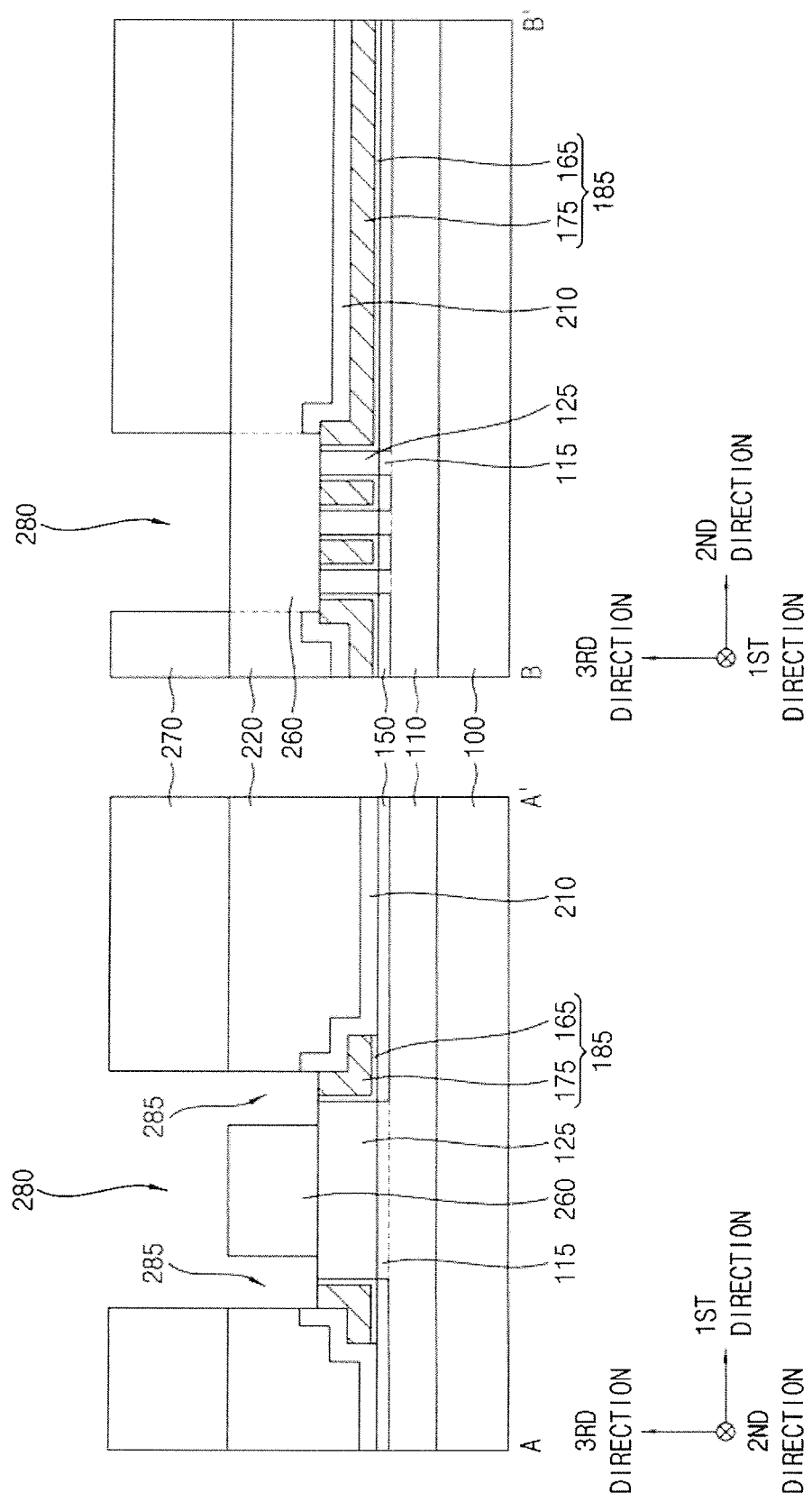

Referring to FIGS. 18 and 19, a third mask 270 having a third opening 280 exposing upper surfaces of the second insulation pattern 260 and the first capping layer 210 may be disposed on the first insulating interlayer 220, and an etching process using the third mask 270 as an etching mask may be performed to remove an upper portion of the first capping layer 210, and the remaining portions of the first mask 140 and the second semiconductor pattern 135 thereunder may be removed.

The third mask 270 may include, e.g., SOH or photoresist pattern.

Thus, fourth openings 285 exposing upper surfaces of the first channel pattern 125 and the first gate structure 185 and being in communication with the third opening 280 may be formed in the first direction between each of opposite sides, respectively, of the second insulation pattern 260 and the first insulating interlayer 220.

Figure 21:
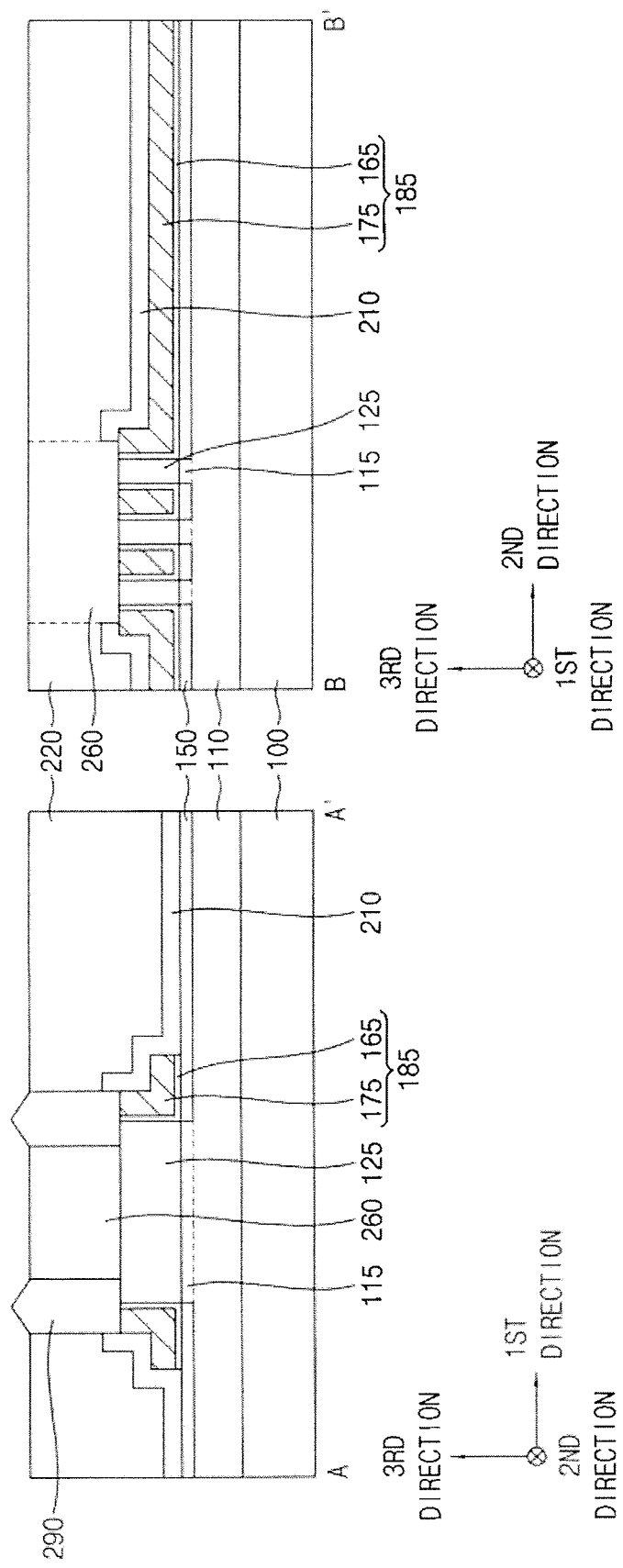

Referring to FIGS. 20A and 21, the third mask 270 may be removed, and a SEG process may be performed using the exposed upper surface of the first channel pattern 125 formed by the formation of the fourth openings 285 as a seed to form a third semiconductor pattern 290 doped with third impurities.

In an exemplary embodiment of the present inventive concept, the SEG process may be performed using an impurity source gas including the third impurities. In an exemplary embodiment of the present inventive concept, the third impurities included in the third semiconductor pattern 290 may have a conductivity type different from that of the first impurities included in the first semiconductor pattern 115. When the first semiconductor pattern 115 includes n-type impurities, the third semiconductor pattern 290 may include p-type impurities, and when the first semiconductor pattern 115 includes p-type impurities, the third semiconductor pattern 290 may include n-type impurities.

Due to the characteristics of the SEG process, the third semiconductor pattern 290 may grow both in horizontal and vertical directions to fill the fourth openings 285, and may protrude from the fourth openings 285 to have an upper surface slanted with respect to the upper surface of the substrate 100.

Thus, the third semiconductor pattern 290 may contact not only the upper surface of the first channel pattern 125 but also the exposed upper surface of the first gate structure 185 formed by the fourth opening 285. The third semiconductor pattern 290 may further grow in the second direction, and thus may have an area that is greater than the area of each of opposite end portions of the first channel pattern 125 exposed by the fourth opening 285 in a plan view.

FIG. 20A shows the third semiconductor patterns 290 on the first channel patterns 125, respectively, disposed in the second direction are spaced apart from each other by a predetermined spacing, however, the inventive concepts may not be limited thereto.

Referring to FIG. 20B, the third semiconductor patterns 290 may further grow in the second direction so that neighboring ones of the third semiconductor patterns 290 extending in the second direction may be merged with each other to form a single structure. Hereinafter, only the third semiconductor patterns 290 shown in FIG. 20A will be illustrated.

As illustrated above, the third semiconductor pattern 290 may be coupled to each of opposite end portions of the first channel pattern 125, and may include the third impurities having a conductivity type opposite that of the first impurities included in the first semiconductor pattern 115. The third semiconductor pattern 290 may be disposed by the SEG process.

Figure 22:
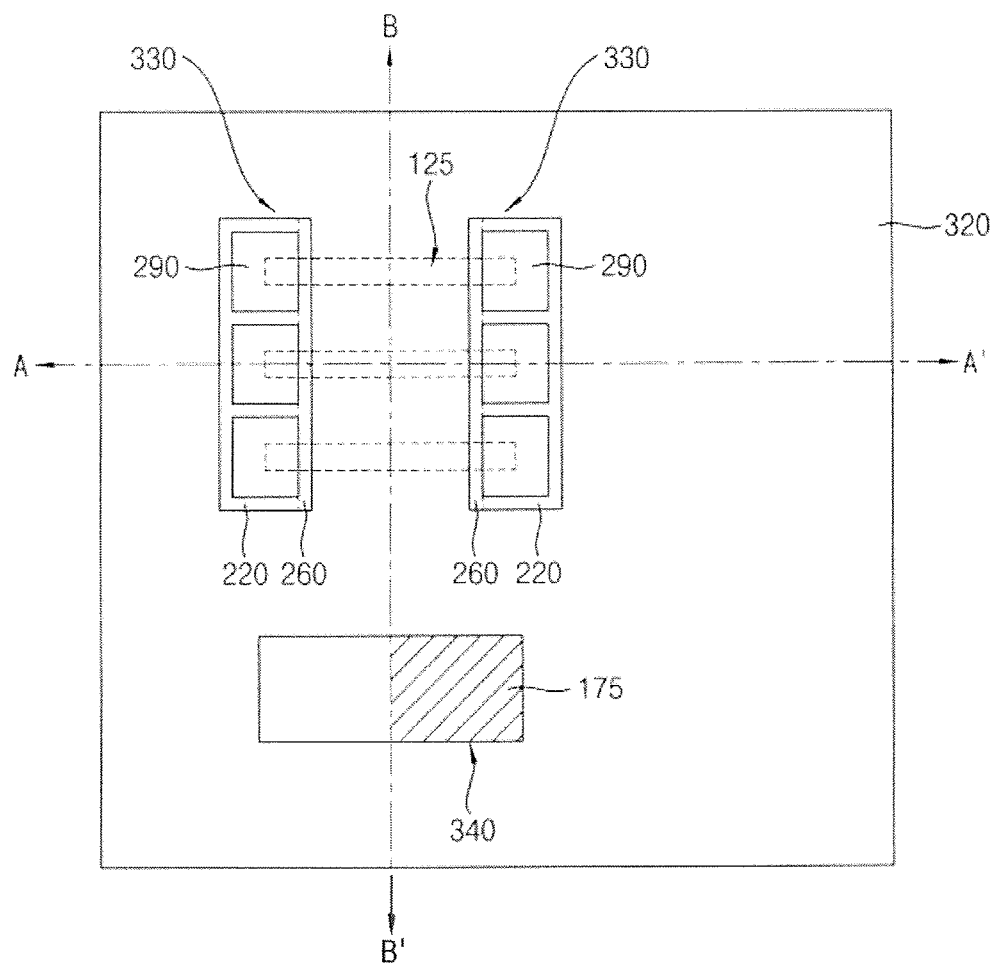
Figure 23:
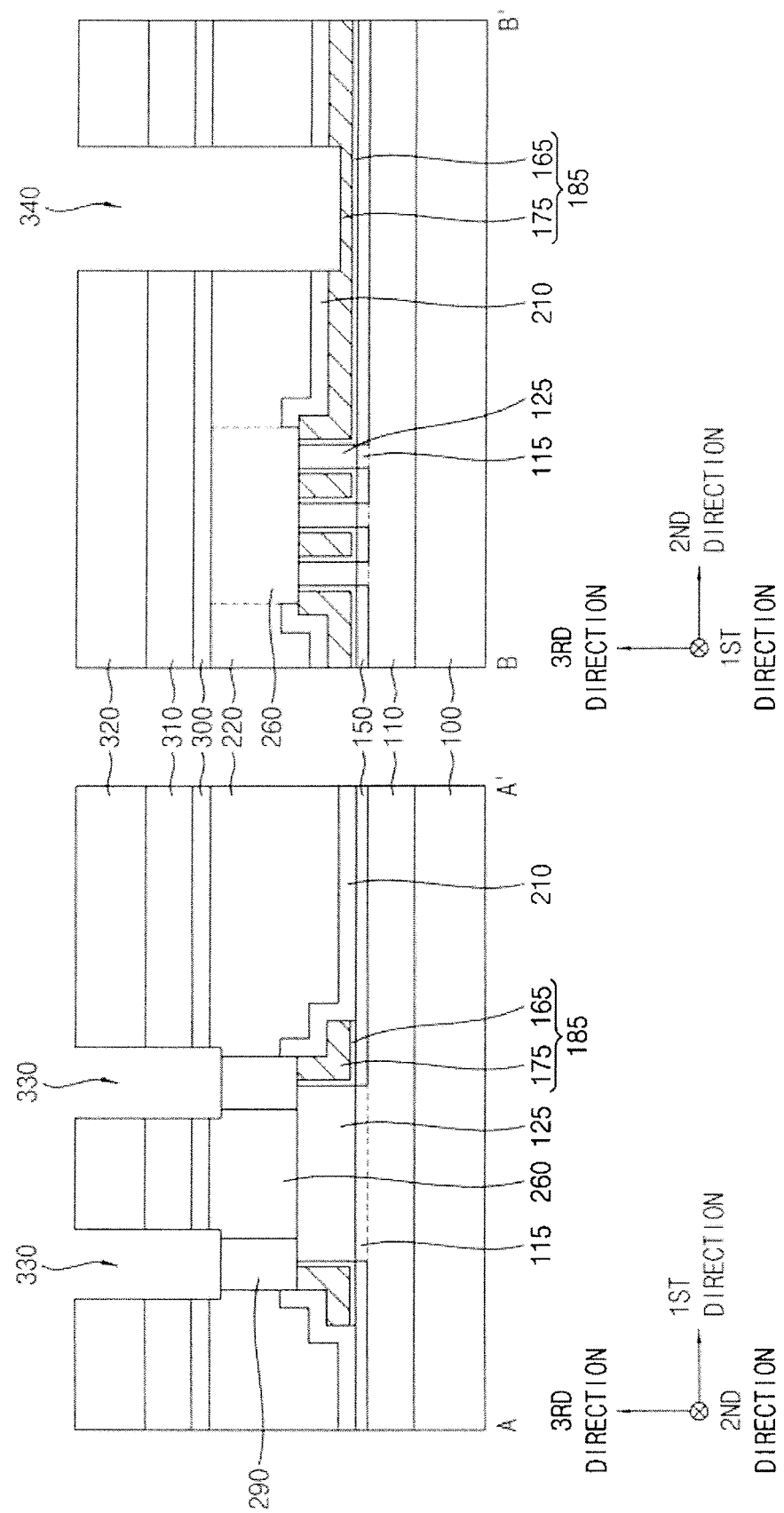

Referring to FIGS. 22 and 23, an upper portion of each of the third semiconductor patterns 290 may be planarized until the upper surface of the first insulating interlayer 220 may be exposed, and an etch stop layer 300 and the second insulating interlayer 310 may be sequentially disposed on the planarized third semiconductor patterns 290 and the first insulating interlayer 220.

The etch stop layer 300 may include a nitride, e.g., silicon nitride, and the second insulating interlayer 310 may include an oxide, e.g., silicon oxide.

A fourth mask 320 may be disposed on the second insulating interlayer 310, and an etching process may be performed using the fourth mask 320 as an etching mask to form fifth openings 330 exposing the third semiconductor patterns 290, respectively, through the underlying second insulating interlayer 310 and the etch stop layer 300, and a sixth opening 340 exposing the first gate electrode 175 through the second insulating interlayer 310, the etch stop layer 300, the first insulating interlayer 220, and the first capping layer 210.

The fourth mask 320 may include, e.g., SOH or photoresist pattern.

When the fifth openings 330 are disposed, an upper portion of the third semiconductor pattern 290, and upper portions of the first insulating interlayer 220 and the second insulation pattern 260 adjacent thereto may be also partially removed, and when the sixth opening 340 is disposed, an upper portion of the first gate electrode 175 may be also partially removed.

Referring back to FIGS. 1 and 2, the fourth mask 320 may be removed, and a first contact plug 350 filling each fifth opening 330 and a second contact 360 filling the sixth opening 340 may be disposed.

In an exemplary embodiment of the present inventive concept, the first and second contact plugs 350 and 360 may be disposed by disposing a conductive layer on the exposed third semiconductor pattern 290 and the first gate electrode 175 and the second insulating interlayer 310, and planarizing the conductive layer until an upper surface of the second insulating interlayer 310 may be exposed. A barrier layer (not shown) may be further disposed before disposing the conductive layer.

The first contact plugs 350 may contact the third semiconductor patterns 290, respectively, to be electrically connected thereto, and the second contact plug 360 may contact the first gate electrode 175 to be electrically connected thereto.

The conductive layer may include a metal, e.g., tungsten, copper, etc., and the barrier layer may include a metal nitride, e.g., tantalum nitride, titanium nitride, tungsten nitride, etc.

The semiconductor device may be manufactured by the above processes.

Figure 24:
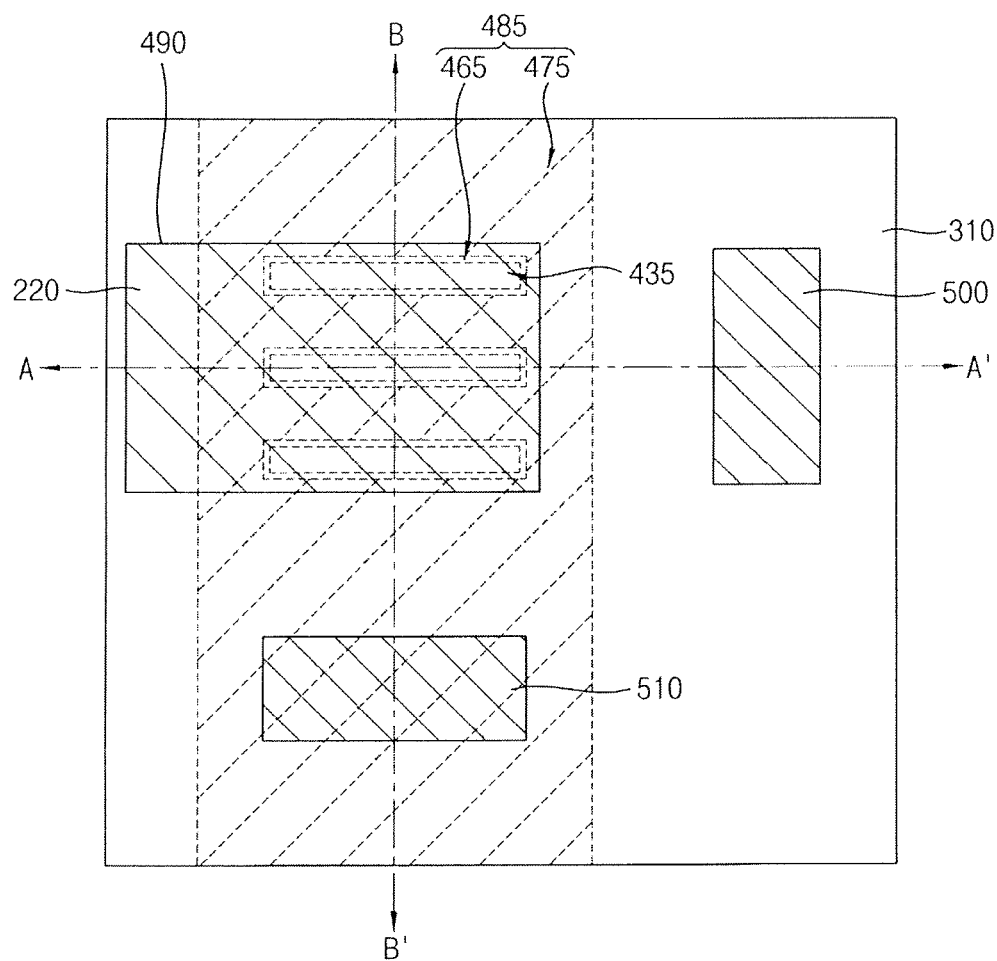
FIGS. 24 and 25 are a plan view and a cross-sectional view illustrating a semiconductor device in accordance with exemplary embodiments of the present inventive concept.
Figure 25:
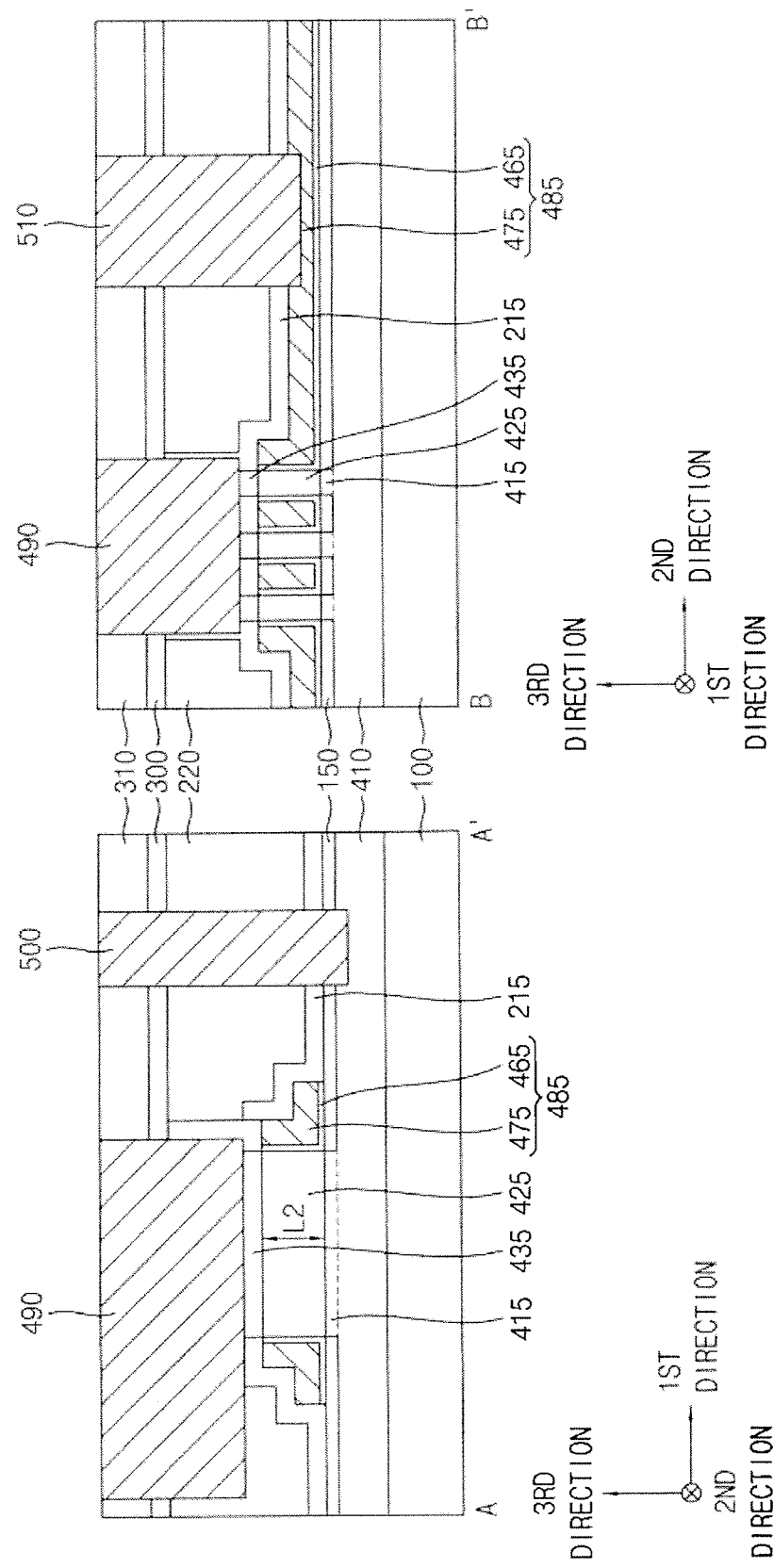

FIGS. 24 and 25 are a plan view and a cross-sectional view illustrating a semiconductor device in accordance with exemplary embodiments of the present inventive concept. FIG. 25 includes cross-section views taken along lines A-A' and B-B', respectively, of FIG. 24. This semiconductor device may include elements substantially the same as or similar to those of FIGS. 1 and 2, and thus detailed descriptions thereon may be omitted below in the interest of brevity.

Referring to FIGS. 24 and 25, the semiconductor device may include a fourth semiconductor pattern 415, a second channel pattern 425 and a fifth semiconductor pattern 435 sequentially stacked on the substrate 100, and a second gate structure 485 surrounding a sidewall of the second channel pattern 425. The second gate structure 485 may include a second gate insulation pattern 465 and a second gate electrode 475 sequentially stacked. The semiconductor device may further include a fourth semiconductor layer 410, the first insulation pattern 150, a second capping layer 215, the first and second insulating interlayers 220 and 310, the etch stop layer 300, and third to fifth contact plugs 490, 500 and 510.

The fourth semiconductor layer 410 and the fourth semiconductor pattern 415 may include a semiconductor material doped with fourth impurities, the second channel pattern 425 may include an undoped semiconductor material, and the fifth semiconductor pattern 435 may include a semiconductor material doped with fifth impurities. The fourth and fifth impurities may have the same conductivity type.

In an exemplary embodiment of the present inventive concept, a second structure including the fourth semiconductor pattern 415, the second channel pattern 425, and the fifth semiconductor pattern 435 sequentially stacked may extend in the first direction, and a plurality of second structures may be disposed in the second direction.

The second capping layer 215 may cover an upper surface and a sidewall of the second gate structure 485, and a sidewall of the fifth semiconductor pattern 435. The second capping layer 215 may further cover an upper surface of the first insulation pattern 150.

The third contact plug 490 may extend through the second insulating interlayer 310, the etch stop layer 300, and an upper portion of the second capping layer 215, and may contact an upper surface of the fifth semiconductor pattern 435. In an exemplary embodiment of the present inventive concept, the third contact plug 490 may further contact an upper surface of the second capping layer 215 adjacent the fifth semiconductor pattern 435, and may partially extend through a portion of the first insulating interlayer 220 adjacent thereto.

The fourth contact plug 500 may extend through the second insulating interlayer 310, the etch stop layer 300, the first insulating interlayer 220, the second capping layer 215, and the first insulation pattern 150, and may contact an upper surface of the fourth semiconductor layer 410. In an exemplary embodiment of the present inventive concept, the fourth contact plug 500 may further partially extend through an upper portion of the fourth semiconductor layer 410.

The fifth contact plug 510 may extend through the second insulating interlayer 310, the etch stop layer 300, the first insulating interlayer 220, and the second capping layer 215, and may contact an upper surface of the second gate electrode 475. In an exemplary embodiment of the present inventive concept, the fifth contact plug 510 may further partially extend through an upper portion of the first gate electrode 175.

In the semiconductor device, when a voltage is applied to the third and fourth contact plugs 490 and 500, a current may flow through the fifth semiconductor pattern 435 and the second channel pattern 425 contacting the fifth semiconductor pattern 435. Thus, a channel may be generated in the third direction, i.e., in the vertical direction in the second channel pattern 425. Herein, a gate length may be a distance between the fourth and fifth semiconductor patterns 415 and 435 spaced apart from each other in the third direction, i.e., a second length L2.

For example, when the semiconductor device is a core device of a logic device, a decreased voltage may be applied to the third and fourth contact plugs 490 and 500, and thus a short gate length is enough. The short gate length may be implemented by a thickness of the second channel pattern 425, i.e., the second length L2.

As described above, the semiconductor device of FIGS. 1 and 2 may be an I/O device to which an increased voltage may be applied, and an increased gate length may be implemented by the horizontal channel in the first channel pattern 125, while the semiconductor device of FIGS. 24 and 25 may be a core device to which a decreased voltage may be applied, and a decreased gate length may be implemented by the vertical channel in the second channel pattern 425.

Figure 26:
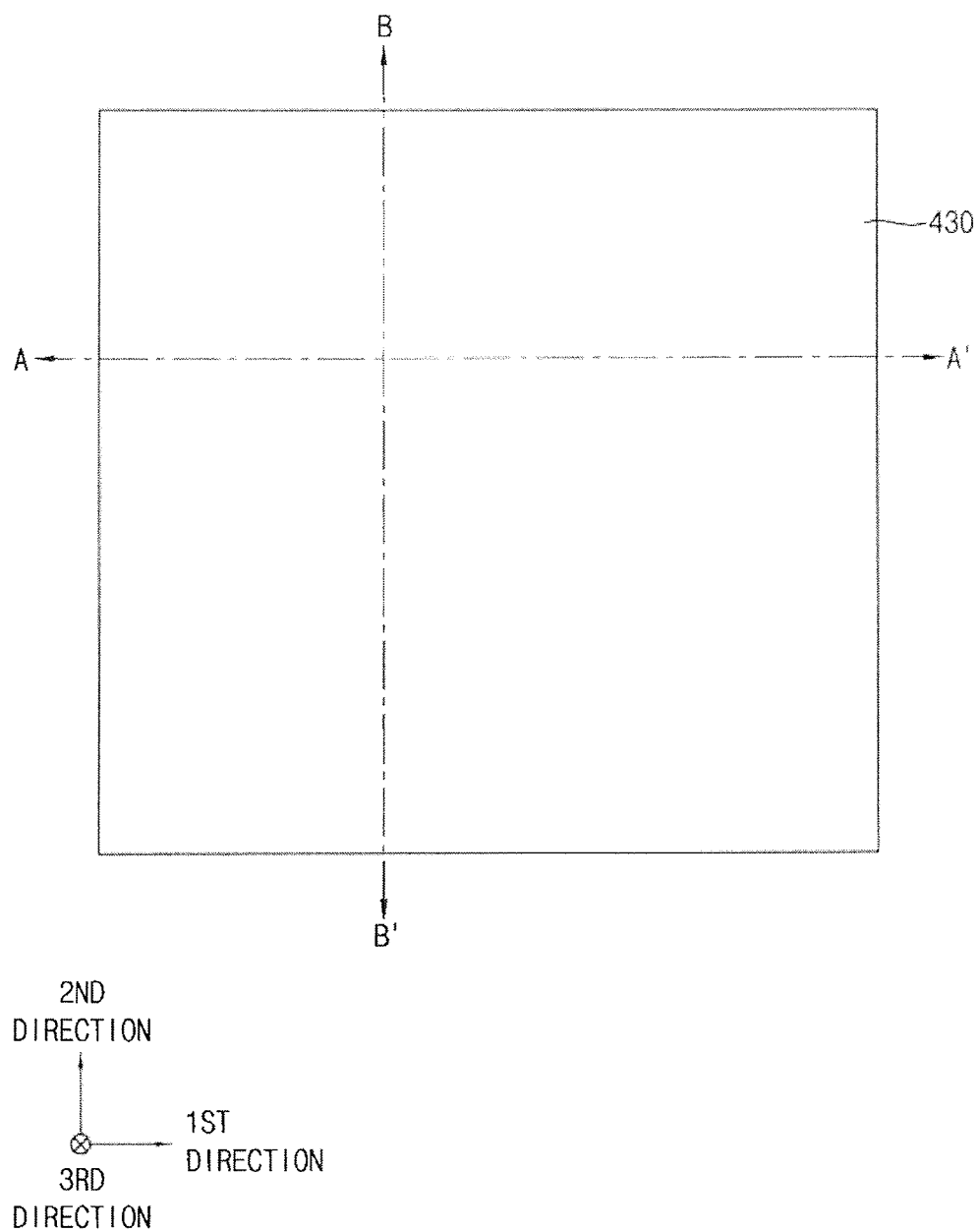
FIGS. 26 to 29 are plan views and cross-sectional views illustrating stages of a method of manufacturing a semiconductor device in accordance with exemplary embodiments of the present inventive concept.
Figure 27:
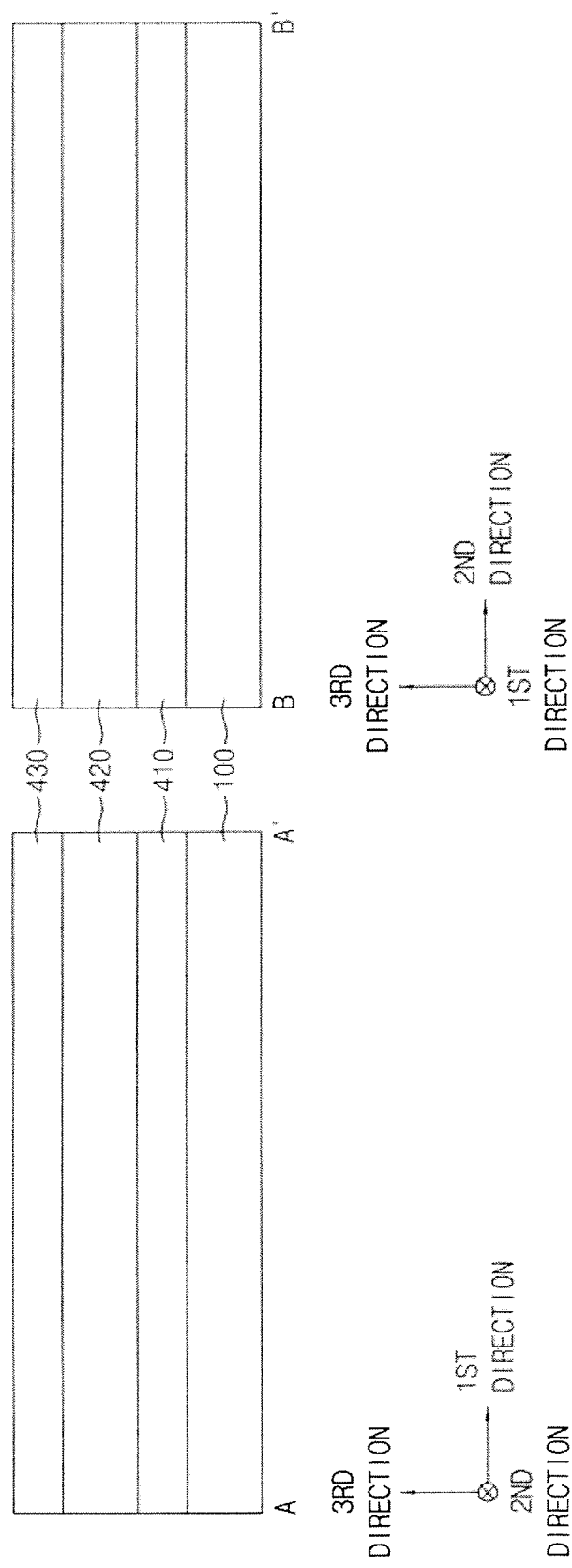
Figure 28:
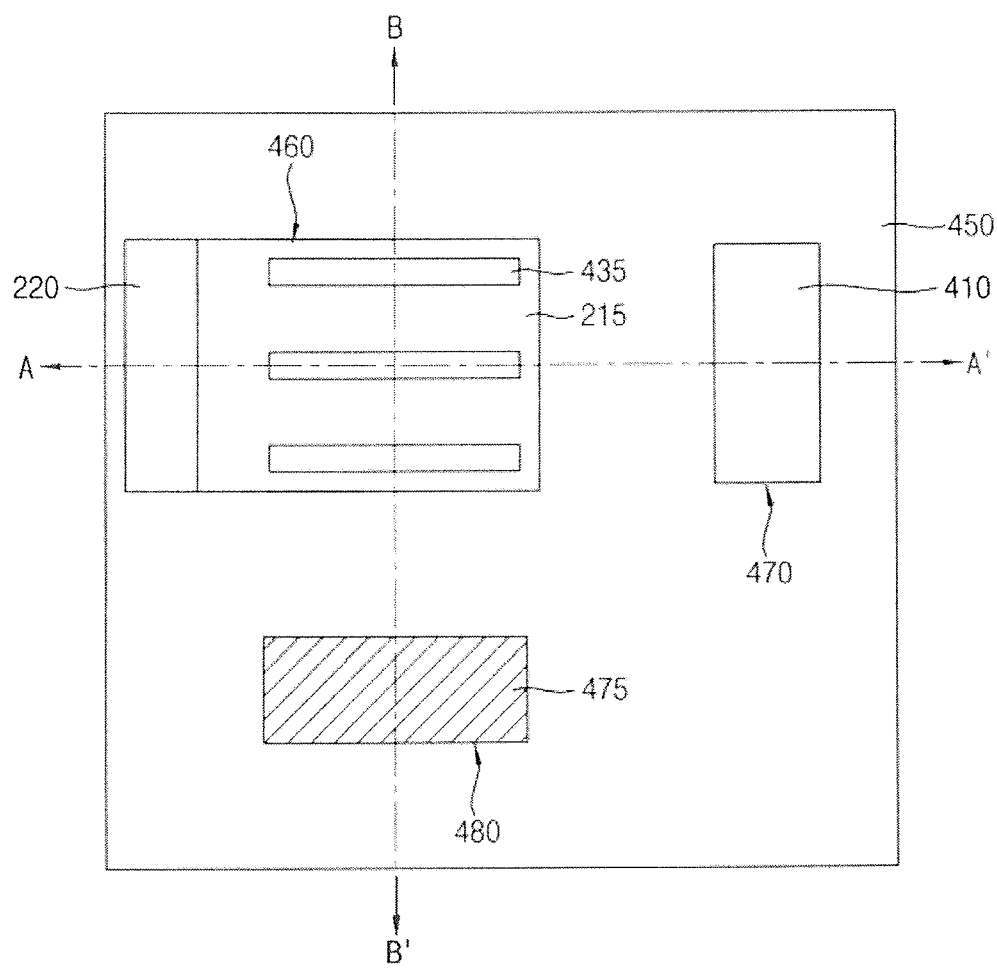
Figure 29:
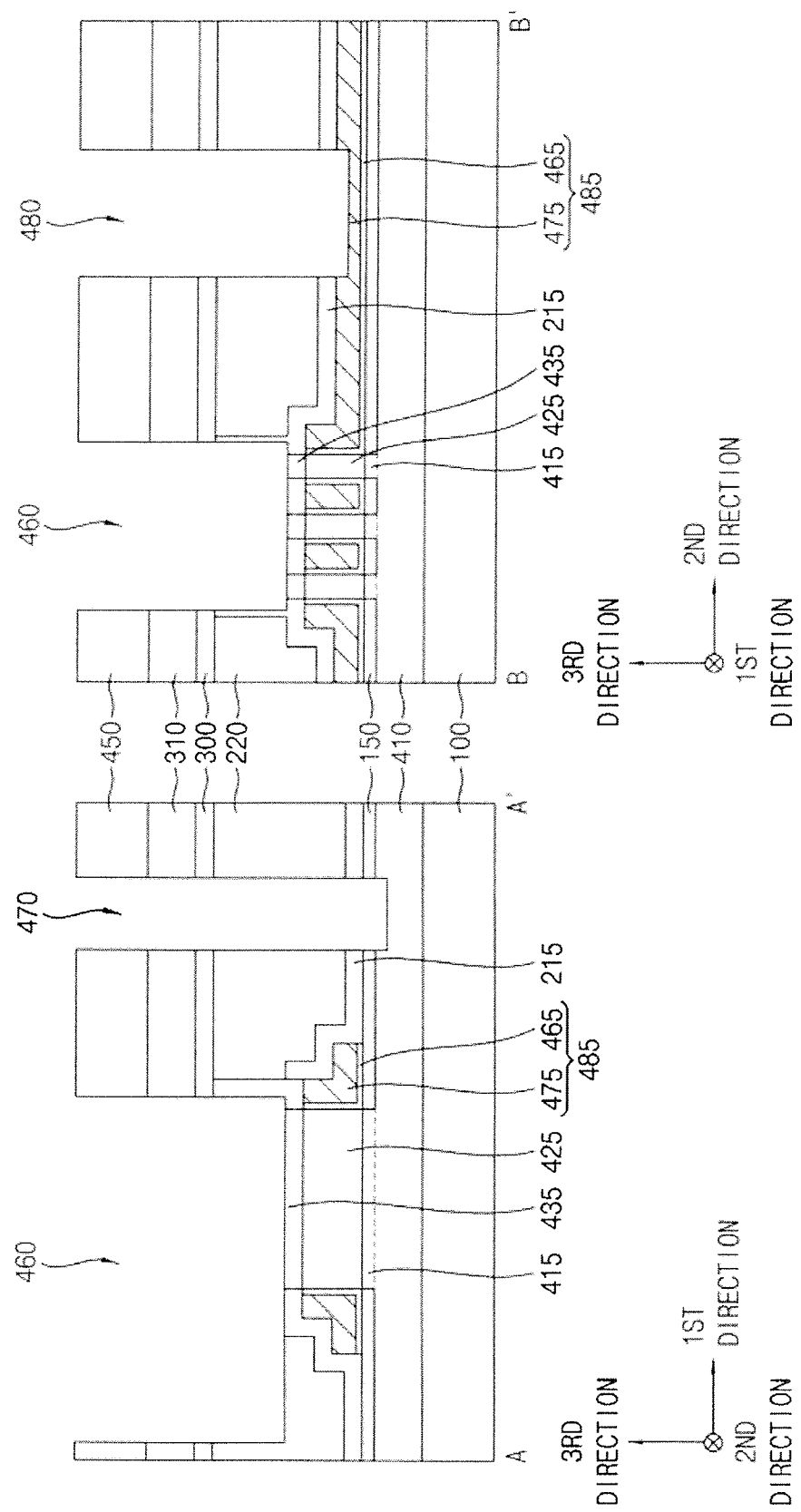

FIGS. 26 to 29 are plan views and cross-sectional views illustrating stages of a method of manufacturing a semiconductor device in accordance with exemplary embodiments of the present inventive concept. Particularly, FIGS. 26 and 28 are plan views, and FIGS. 27 and 29 are cross-sectional views. Each of the cross-sectional views of FIGS. 27 and 29 include cross-sections taken along lines A-A' and B-B' of FIGS. 26 and 28, respectively. This method may include processes substantially the same as or similar to those of FIGS. 1 to 23, and thus detailed descriptions thereon may be omitted below in the interest of brevity.

Referring to FIGS. 26 and 27, processes substantially the same as or similar to those illustrated with reference to FIGS. 3 and 4 may be performed.

Thus, a fourth semiconductor layer 410, a second channel layer 420, and a fifth semiconductor layer 430 may be sequentially disposed on the substrate 100.

The fourth semiconductor layer 410 may include a semiconductor material doped with fourth impurities, the second channel layer 420 may include an undoped semiconductor material, and the fifth semiconductor layer 430 may include a semiconductor material doped with fifth impurities. The fourth and fifth impurities may have the same conductivity type.

Referring to FIGS. 28 and 29, processes substantially the same as or similar to those illustrated with reference to FIGS. 5 to 13 may be performed.

Thus, a second structure including a fourth semiconductor pattern 415, a second channel pattern 425, a fifth semiconductor pattern 435, and a fifth mask (not shown) sequentially stacked may be disposed on the fourth semiconductor layer 410, the first insulation pattern 150 may be disposed on an upper surface of the fourth semiconductor layer 410, and a second gate structure 485 may be disposed to cover a sidewall of the second channel pattern 425. A second capping layer 215 may be disposed on the first insulation pattern 150 to cover an upper sidewall of the second structure, and an upper surface of the second gate structure 485. The first insulating interlayer 220 may be disposed on the second capping layer 215, and a planarization process may be performed to expose an upper surface of the second capping layer 215.

Processes substantially the same as or similar to those illustrated with reference to FIGS. 22 and 23 may be performed.

For example, the etch stop layer 300 and the second insulating interlayer 310 may be sequentially disposed on the second capping layer 215 and the first insulating interlayer 220, and a sixth mask 450 may be disposed on the second insulating interlayer 310.

An etching process using the sixth mask 450 as an etching mask may be performed to form a seventh opening 460 exposing the fifth semiconductor pattern 435 through the second insulating interlayer 110, the etch stop layer 100, the second capping layer 215, and the fifth mask. An eighth opening 470 may be formed by exposing the fourth semiconductor layer 410 through the second insulating interlayer 310, the etch stop layer 300, the first insulating interlayer 220, the second capping layer 215, and the first insulation pattern 150. A ninth opening 480 may be formed by exposing the second gate electrode 475 through the second insulating interlayer 310, the etch stop layer 300, the first insulating interlayer 220, and the second capping layer 215.

When the seventh opening 460 is formed, a portion of the first insulating interlayer 220 adjacent the fifth semiconductor pattern 435 may be removed, and an upper surface of the second capping layer 215 may be partially exposed. When the eighth opening 470 is formed, an upper portion of the fourth semiconductor layer 410 may be partially exposed, and when the ninth opening 480 is formed, an upper portion of the second gate electrode 475 may be also partially removed.

Referring to FIGS. 24 and 25 again, processes substantially the same as or similar to those illustrated with reference to FIGS. 1 and 2 may be performed.

Thus, after removing the sixth mask 450, third to fifth contact plugs 490, 500 and 510 may be disposed to fill the seventh to ninth openings 460, 470 and 480, respectively.

Figure 30:
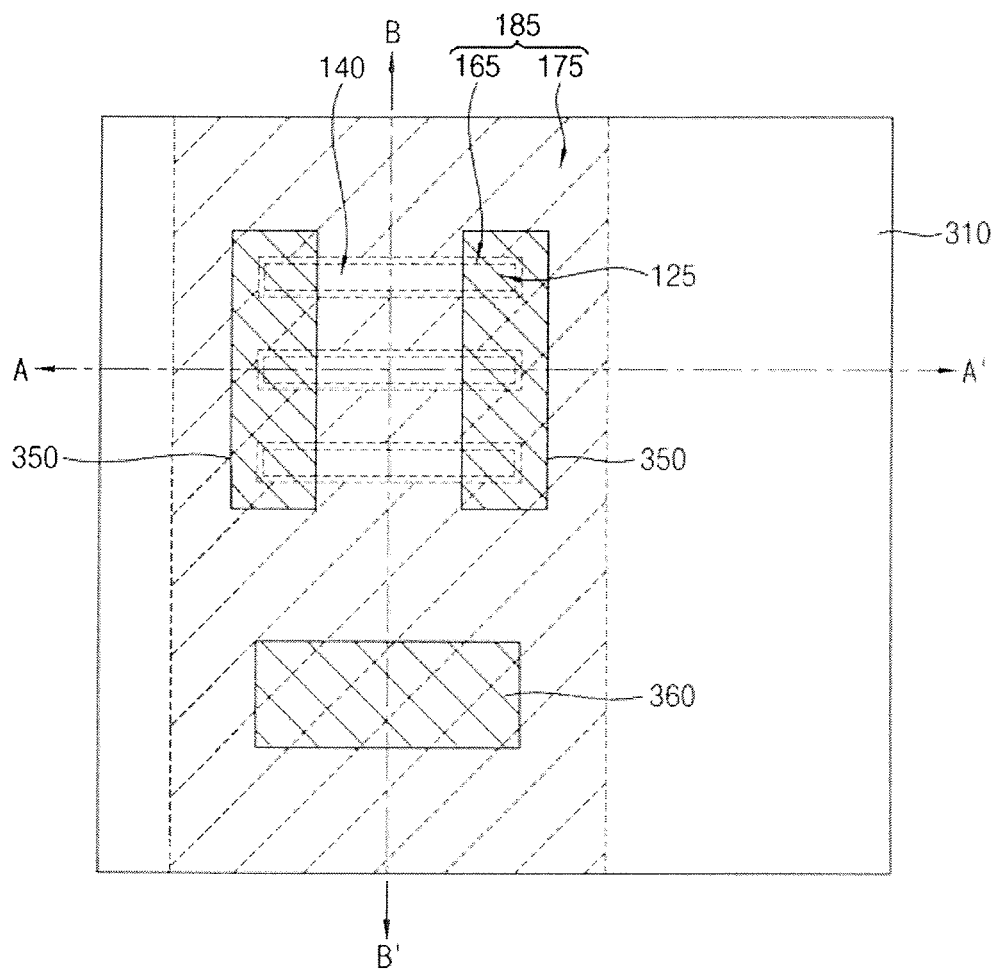
FIGS. 30 and 31 are a plan view and a cross-sectional view illustrating a semiconductor device in accordance with exemplary embodiments of the present inventive concept.
Figure 31:
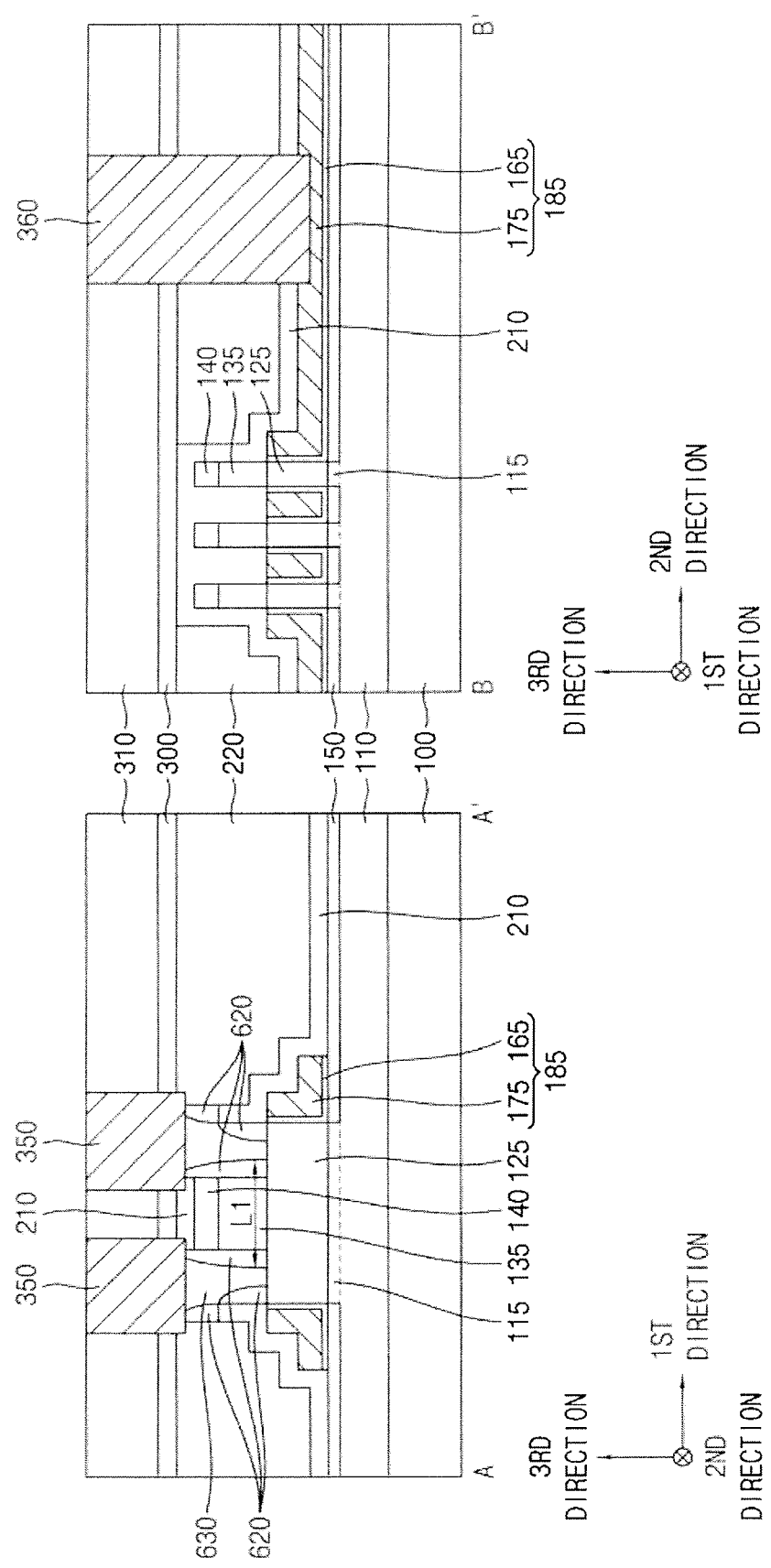

FIGS. 30 and 31 are a plan view and a cross-sectional view illustrating a semiconductor device in accordance with exemplary embodiments of the present inventive concept, respectively. FIG. 31 includes cross-sections taken along lines A-A' and B-B', respectively, of FIG. 30. This semiconductor device may include elements substantially the same as or similar to those of FIGS. 1 and 2, and thus detailed descriptions thereon may be omitted below in the interest of brevity.

Referring to FIGS. 30 and 31, the semiconductor device may include the first semiconductor pattern 115 and the first channel pattern 125 sequentially stacked on the first semiconductor layer 110 that is disposed on the substrate 100, a third structure including the second semiconductor pattern 135, the first mask 140, and the first capping layer 210 sequentially stacked on a central upper surface of the first channel pattern 125 extending in the first direction, and a sixth semiconductor pattern 630 on each of opposite upper edge surfaces of the first channel pattern 125 in the first direction. The semiconductor device may further include a second spacer 620 covering a sidewall of the sixth semiconductor pattern 630.

In an exemplary embodiment of the present inventive concept, the first semiconductor layer 110 and the first semiconductor pattern 115 may include a semiconductor material doped with n-type impurities, the first channel pattern 125 may include an undoped semiconductor material, the second semiconductor pattern 135 may include silicon phosphide (SiP) doped with n-type impurities, and the sixth semiconductor pattern 630 may include silicon-germanium (SiGe) doped with p-type impurities.

Alternatively, the first semiconductor layer 110 and the first semiconductor pattern 115 may include a semiconductor material doped with p-type impurities, the first channel pattern 125 may include an undoped semiconductor material, the second semiconductor pattern 135 may include silicon-germanium (SiGe) doped with p-type impurities, and the sixth semiconductor pattern 630 may include silicon phosphide (SiP) doped with p-type impurities.

The second spacer 620 may include an oxide, e.g., silicon oxide.

The sixth semiconductor pattern 630 may be disposed not only on the upper edge surfaces of the first channel pattern 125 in the first direction but also on a sidewall of the second spacer 620 and makes contact with a portion of the first capping layer 210 adjacent the first channel pattern 125 in the second direction.

The sixth semiconductor patterns 630 on each of the first channel patterns 125 disposed in the second direction may be spaced apart from each other in the second direction, or neighboring ones of the sixth semiconductor patterns 630 in the second direction may be merged with each other to form a single structure.

In the semiconductor device, when a voltage is applied to the first contact plugs 350, a current may flow through the sixth semiconductor patterns 630 and the first channel pattern 125 contacting the sixth semiconductor patterns 630. Thus, a channel may be generated in the first direction, i.e., in the horizontal direction in the first channel pattern 125. A gate length may be a distance between neighboring ones of the sixth semiconductor patterns 630 in the first direction, i.e., the first length L1.

Figure 32:
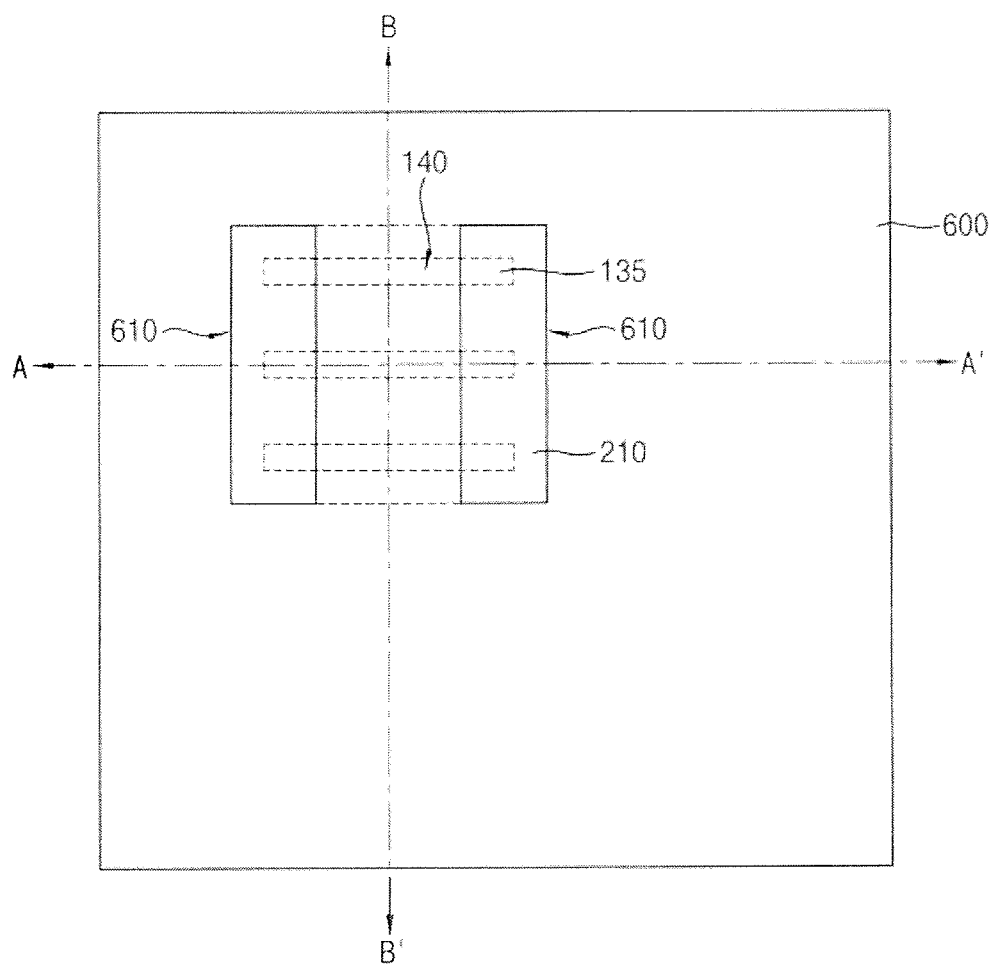
FIGS. 32 to 37 are plan views and cross-sectional views illustrating stages of a method of manufacturing a semiconductor device in accordance with exemplary embodiments of the present inventive concept.
Figure 33:
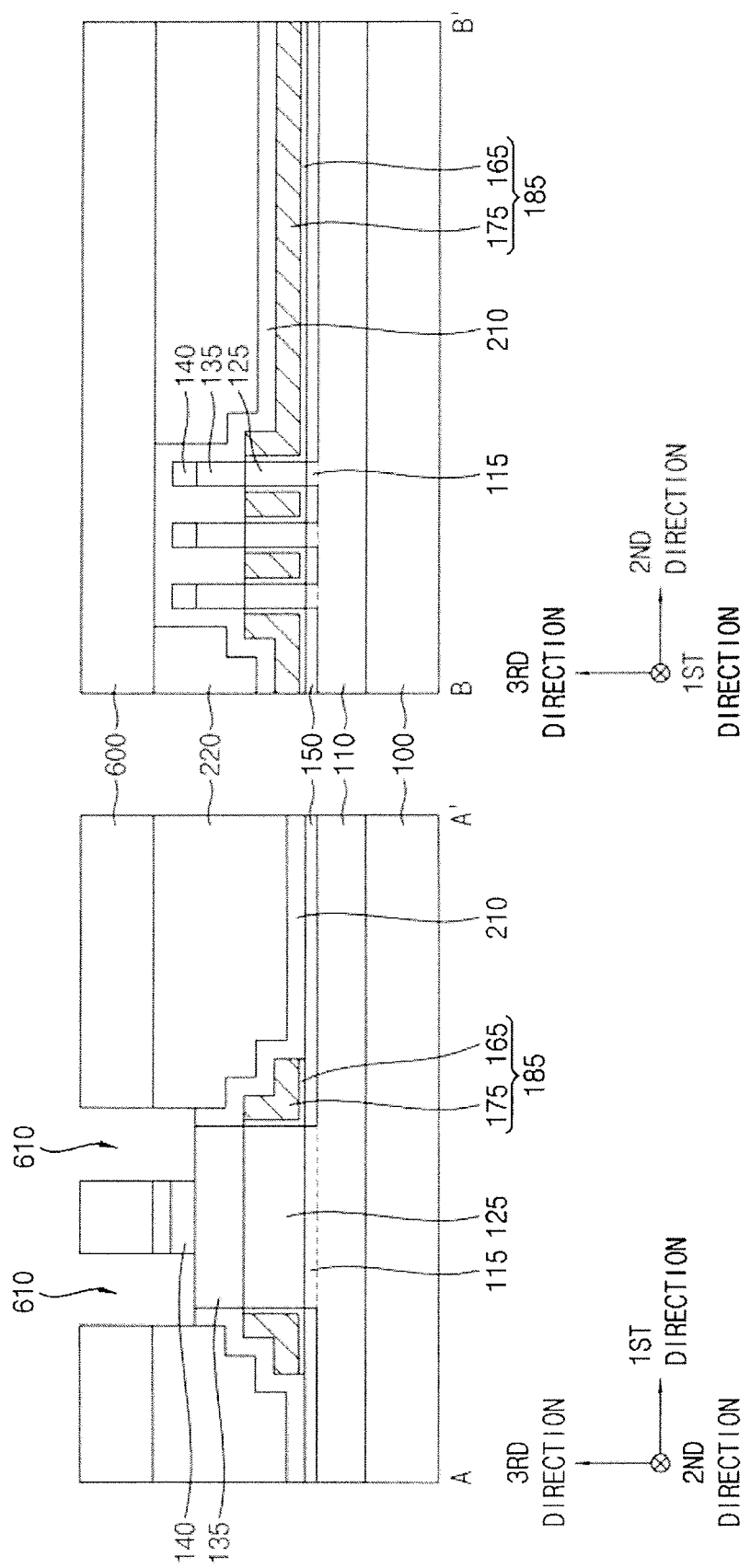
Figure 34:
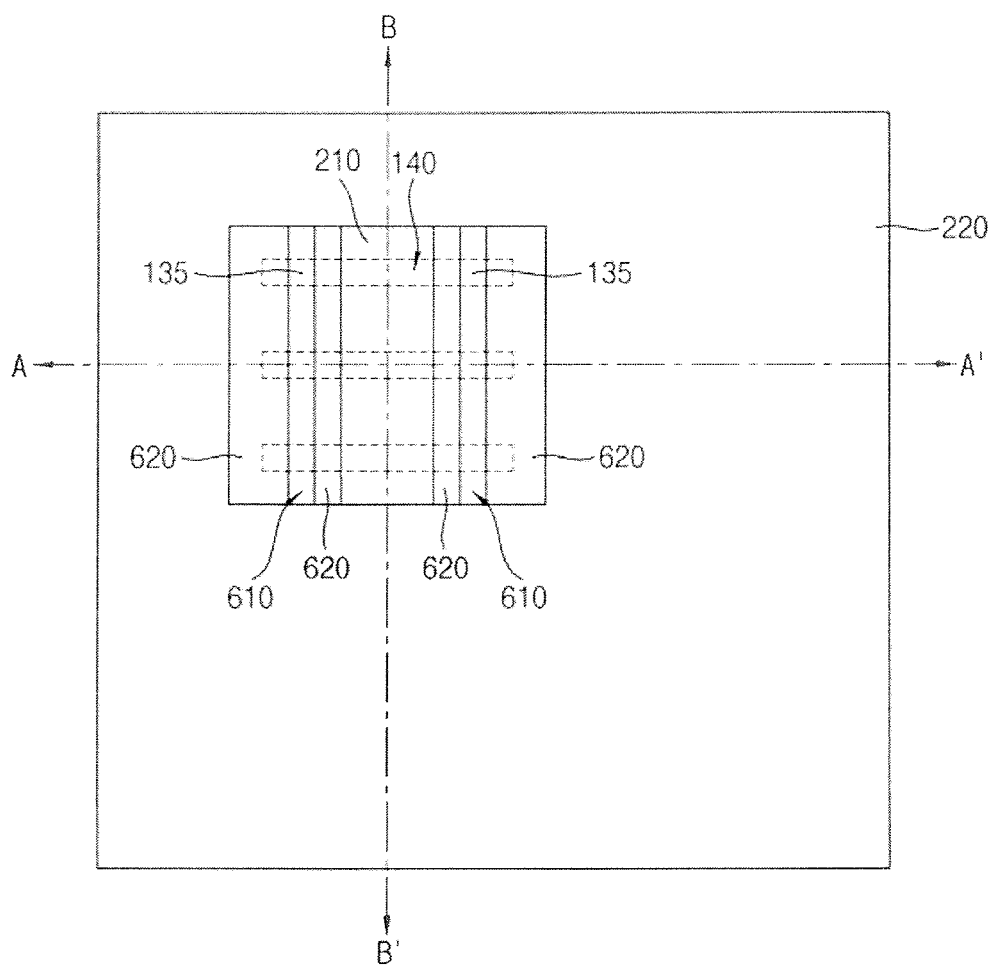
Figure 35:
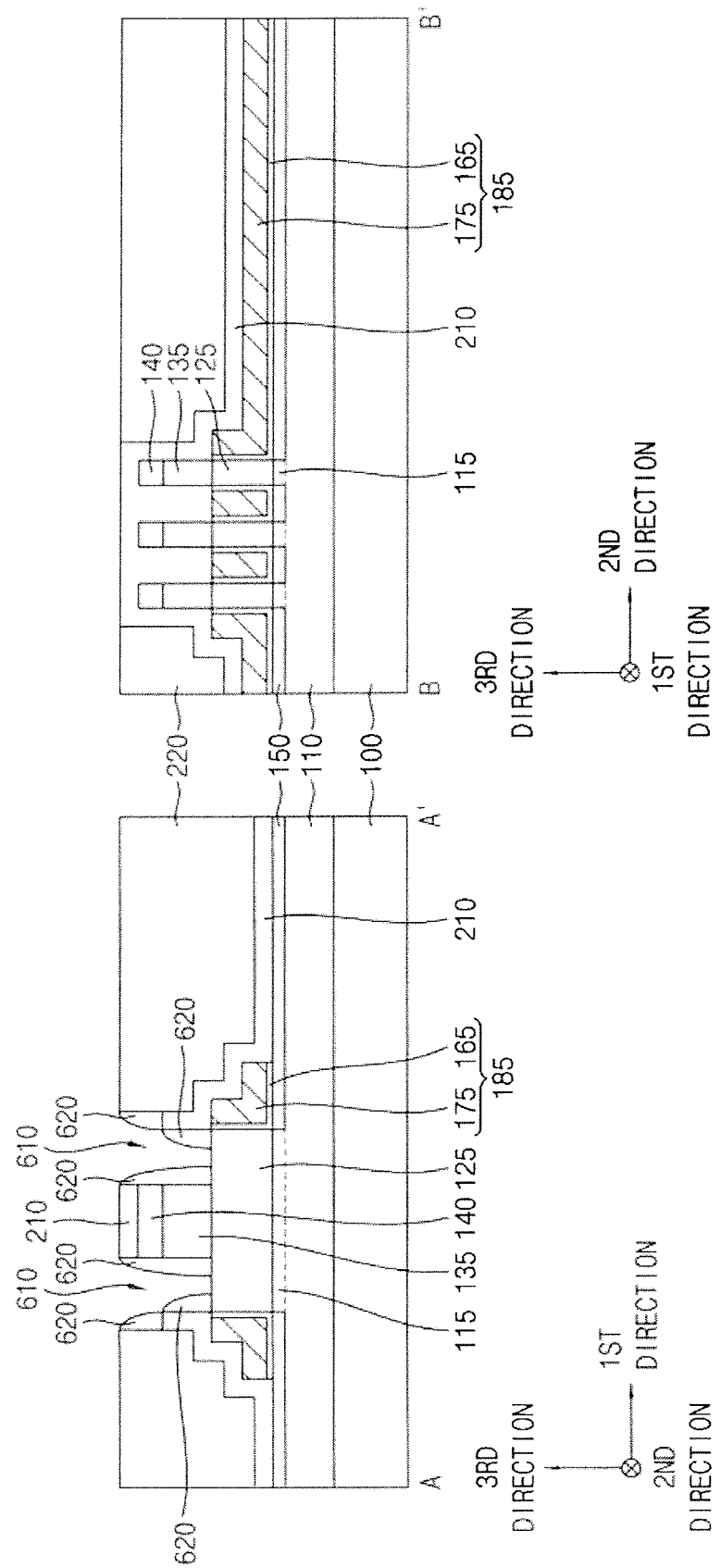
Figure 36:
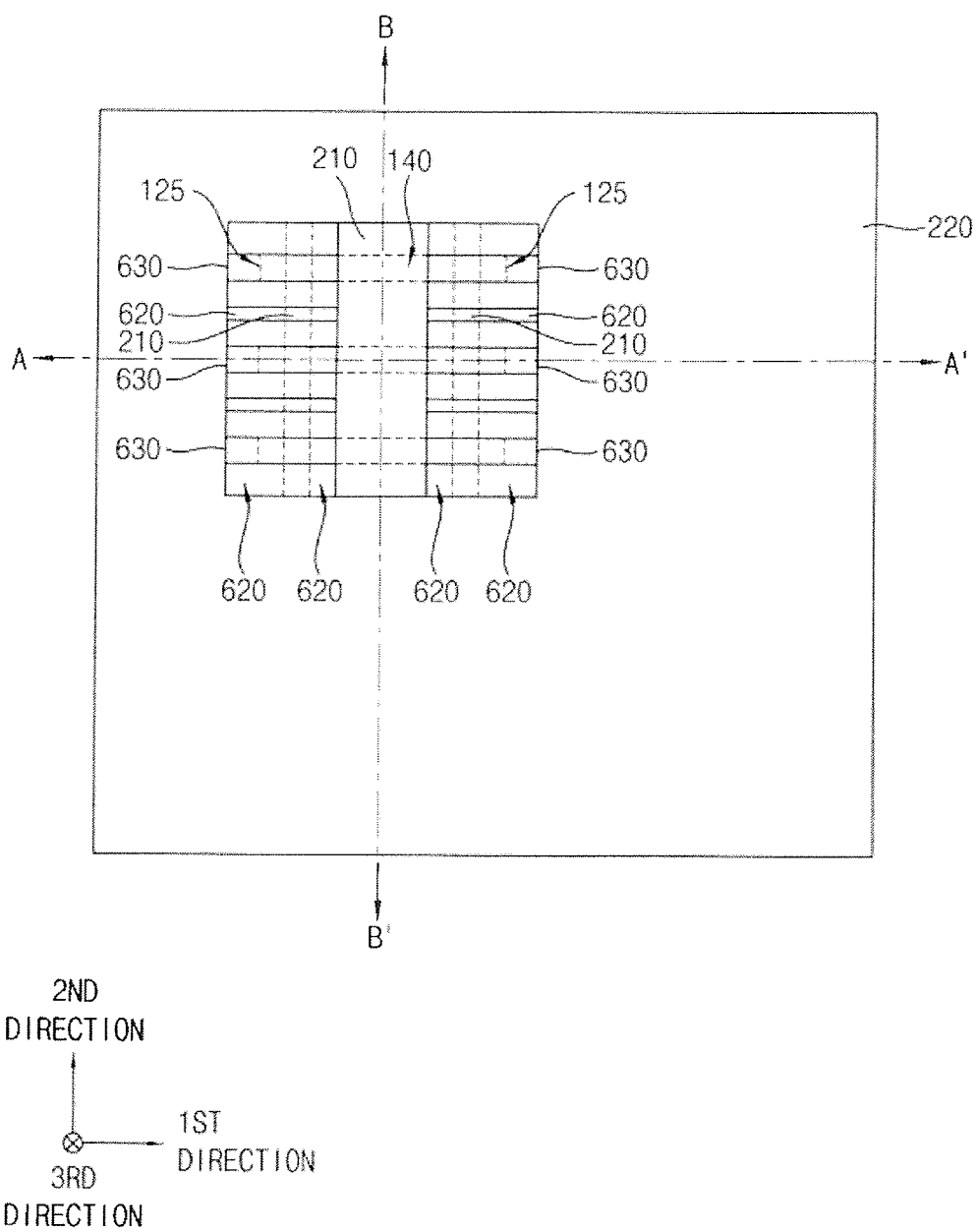
Figure 37:
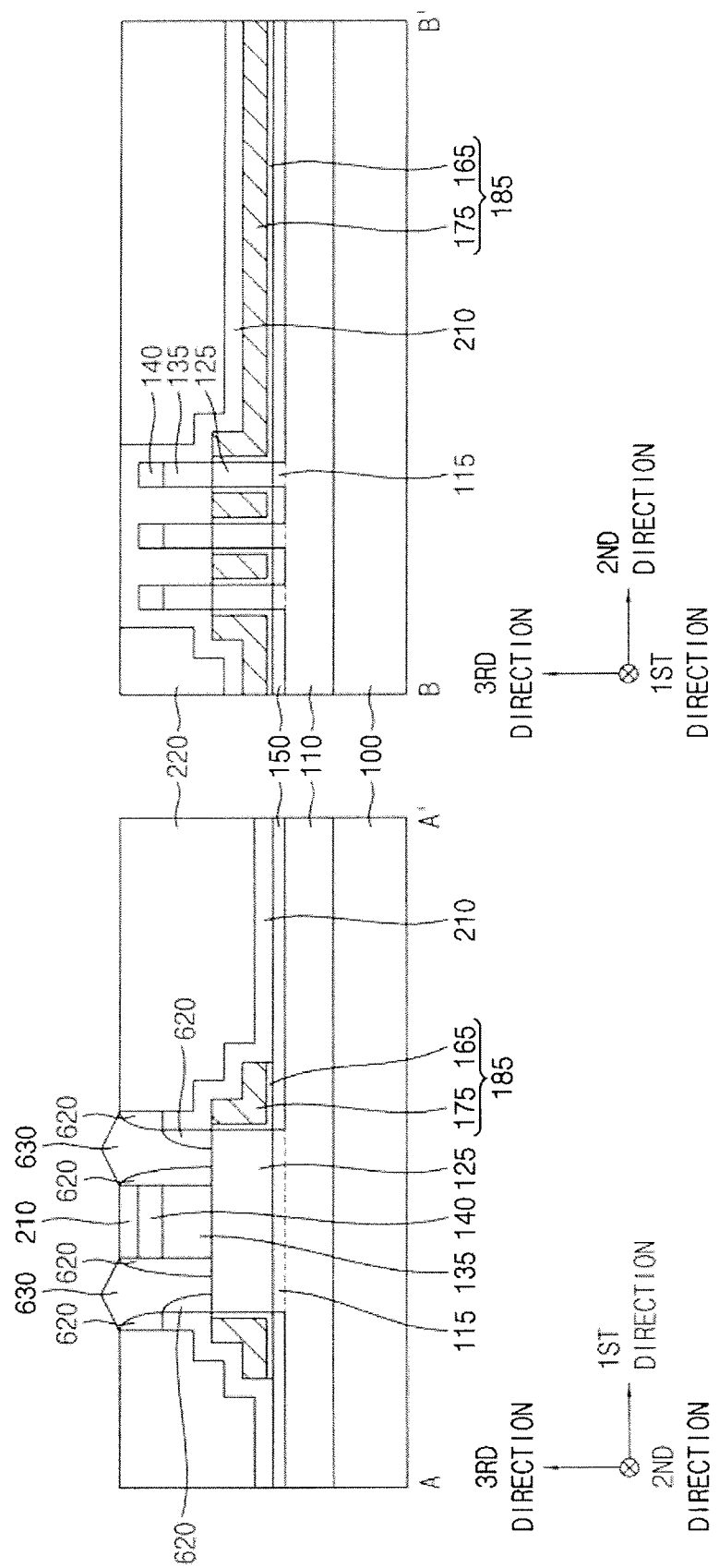

FIGS. 32 to 37 are plan views and cross-sectional views illustrating stages of a method of manufacturing a semiconductor device in accordance with exemplary embodiments of the present inventive concept. FIGS. 32, 34 and 36 are plan views, and FIGS. 33, 35 and 37 are cross-sectional views. Each of the cross-sectional views includes cross-sections taken along lines A-A' and B-B', respectively, of a corresponding plan view. This method may include processes substantially the same as or similar to those of FIGS. 1 to 23, and thus detailed descriptions thereon may be omitted below in the interest of brevity.

Referring to FIGS. 32 and 33, processes substantially the same as or similar to those illustrated with reference to FIGS. 3 to 13 may be performed.

When the first semiconductor pattern 115 includes n-type impurities, the second semiconductor pattern 135 may be disposed to include silicon phosphide doped with n-type impurities. Alternatively, when the first semiconductor pattern 115 includes p-type impurities, the second semiconductor pattern 135 may be disposed to include silicon-germanium doped with p-type impurities.

A seventh mask 600 including tenth openings 610 overlapping opposite end portions, respectively, of the first mask 140 in the first direction may be disposed on the first capping layer 210 and the first insulating interlayer 220, and the underlying first capping layer 210 and the first mask 140 may be etched using the seventh mask 600 as an etching mask to expose opposite ends of the second semiconductor pattern 135 in the first direction. A portion of the first capping layer 210 adjacent each of opposite end portions of the second semiconductor pattern 135 may be partially exposed by each tenth opening 610.

Referring to FIGS. 34 and 35, the exposed opposite end portions of the second semiconductor pattern 135 by the tenth openings 610 may be etched to enlarge the tenth openings 610 so that opposite ends of the first channel pattern 125 in the first direction may be exposed. The seventh mask 600 may be removed to expose upper surfaces of the first capping layer 210 and the first insulating interlayer 220, and a second spacer 620 may be disposed on a sidewall of each tenth opening 610.

The second spacer 620 may be disposed by forming a second spacer layer on the exposed opposite ends of the first channel pattern 125 by the tenth openings 610, sidewalls of the tenth openings 610, and the exposed upper surfaces of the first capping layer 210 and the first insulating interlayer 220, and anisotropically etching the second spacer layer. Thus, the second spacer 620 may be disposed on each of opposite sidewalls of a third structure including the second semiconductor pattern 135, the first mask 140, and the first capping layer 210 sequentially stacked on the central upper surface of the first channel pattern 125 in the first direction, a sidewall of the first capping layer 210 on each of opposite ends of the first channel pattern 125 in the first direction, and a sidewall of the first insulating interlayer 220 exposed by each tenth opening 610.

The second spacer 620 may include an oxide, e.g., silicon oxide.

Referring to FIGS. 36 and 37, a SEG process may be performed using the exposed upper surface of the first channel pattern 125 as seed to form a sixth semiconductor pattern 630 in each tenth opening 610.

In an exemplary embodiment of the present inventive concept, when the second semiconductor pattern 135 includes silicon phosphide doped with n-type impurities, the sixth semiconductor pattern 630 may be disposed to include silicon-germanium doped with p-type impurities. Alternatively, when the second semiconductor pattern 135 includes silicon-germanium doped with p-type impurities, the sixth semiconductor pattern 630 may be disposed to include silicon phosphide doped with n-type impurities.

The sixth semiconductor pattern 630 may grow in the vertical direction to fill each tenth opening 610, and protrude from each tenth opening 610 in third direction. The sixth semiconductor pattern 630 may grow in the horizontal direction to be disposed not only on the exposed first channel pattern 125 but also on a sidewall of the second spacer 620 and makes contact with a portion of the first capping layer 210. In a plan view as shown, for example, in FIG. 36, the sixth semiconductor pattern 630 may have an area greater than that of the first channel pattern 125.

FIGS. 36 and 37 show the sixth semiconductor patterns 630 on each of the first channel patterns 125 disposed in the second direction are spaced apart from each other in the second direction, however, the inventive concepts may not be limited thereto. That is, neighboring ones of the sixth semiconductor patterns 630 in the second direction may be merged with each other to form a single structure.

Referring to FIGS. 30 and 31, processes substantially the same as or similar to those illustrated with reference to FIGS. 22 to 23 and 1 to 2 may be performed to complete the semiconductor device.

For example, the sixth semiconductor patterns 630 may be planarized until an upper surface of the first insulating interlayer 220 may be exposed, and the etch stop layer 300 and the second insulating interlayer 310 may be sequentially disposed on the planarized sixth semiconductor patterns 630 and the first insulating interlayer 220. The first contact plugs 350 may be disposed to contact the sixth semiconductor patterns 630, respectively, and the second contact plug 360 may be disposed to contact the first gate electrode 175. The first contact plug 350 may contact not only the sixth semiconductor pattern 630 but also an upper surface of the second spacer 620 surrounding the sixth semiconductor pattern 630.

Figure 38:
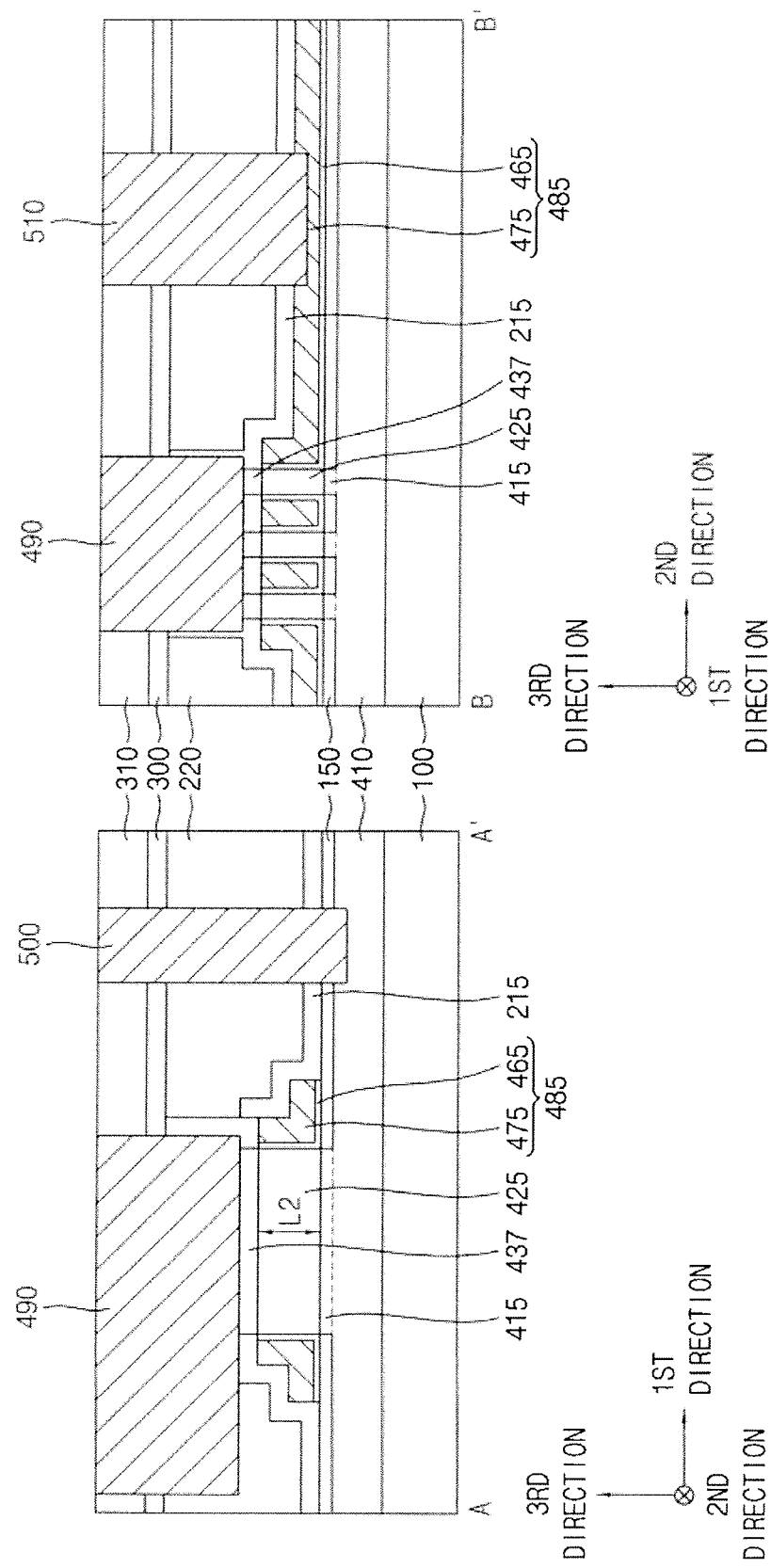
FIG. 38 is a cross-sectional view illustrating a semiconductor device in accordance with exemplary embodiments of the present inventive concept.

FIG. 38 is a cross-sectional view illustrating a semiconductor device in accordance with an exemplary embodiment of the present inventive concept. This semiconductor device may be substantially the same as or similar to that of FIGS. 24 and 25, except for including a seventh semiconductor pattern 437 instead of the fifth semiconductor pattern 435, and thus detailed descriptions thereon may be omitted below in the interest of brevity.

Referring to FIG. 38, the semiconductor device may include the fourth semiconductor pattern 415, the second channel pattern 425, and a seventh semiconductor pattern 437 sequentially stacked on the substrate 100, and the second gate structure 485 surrounding a sidewall of the second channel pattern 425.

In an exemplary embodiment of the present inventive concept, when the fourth semiconductor pattern 415 includes a semiconductor material doped with p-type impurities, the seventh channel pattern 437 may include silicon-germanium doped with p-type impurities. Alternatively, when the fourth semiconductor pattern 415 includes a semiconductor material doped with n-type impurities, the seventh channel pattern 437 may include silicon phosphide doped with n-type impurities.

The second spacer 620 may include an oxide, e.g., silicon oxide.

In the semiconductor device, when a voltage is applied to the third and fourth contact plugs 490 and 500, a current may flow through the seventh semiconductor pattern 437 and the second channel pattern 425. Thus, a channel may be generated in the second channel pattern 425 in the third direction, i.e., in the vertical direction. A gate length may be a distance between the fourth and seventh semiconductor patterns 415 and 437 spaced apart from each other in the third direction, i.e., the second length L2.

Figure 39:
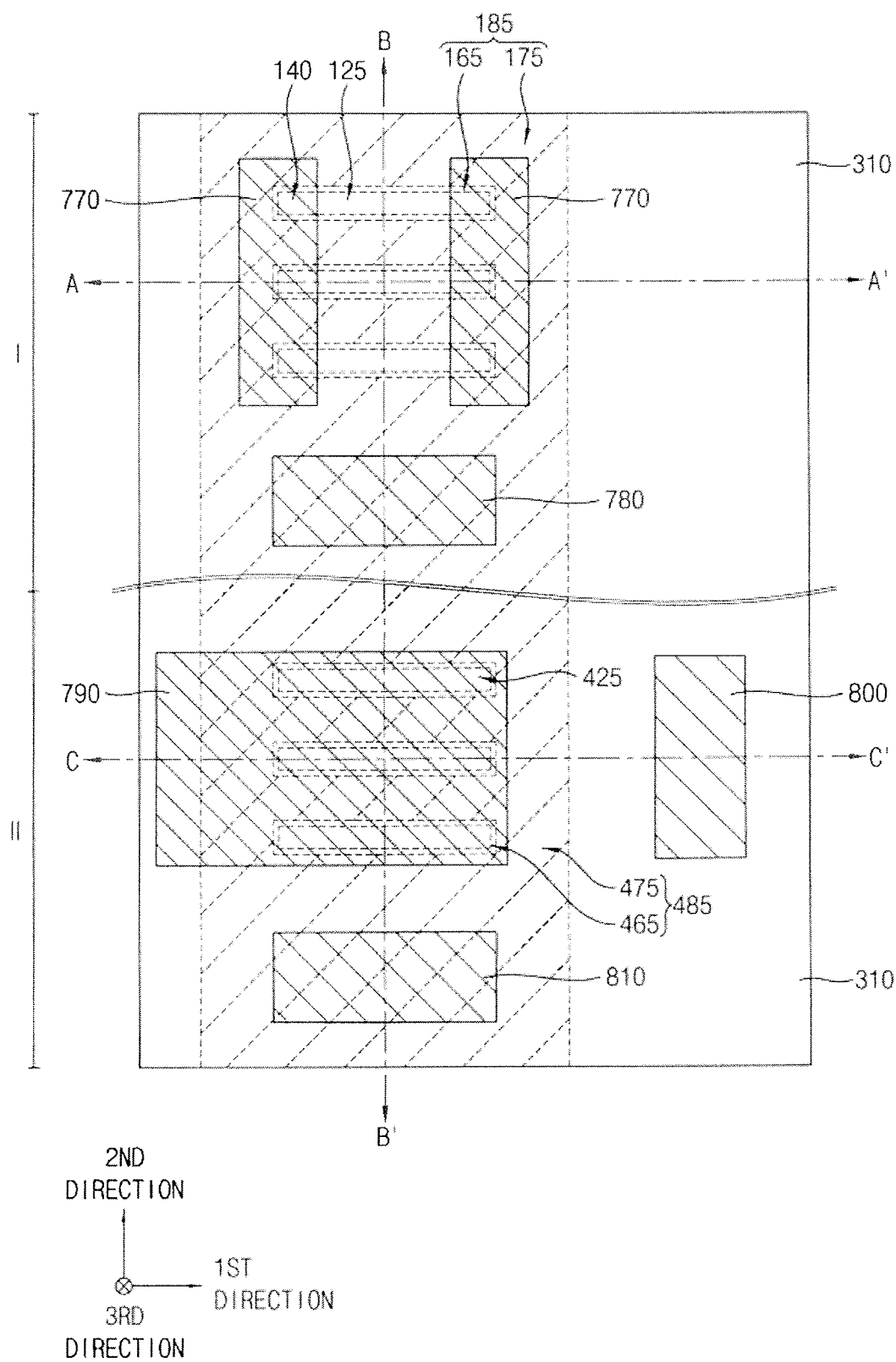
FIGS. 39 to 41 are a plan view and cross-sectional views illustrating a semiconductor device in accordance with exemplary embodiments of the present inventive concept.
Figure 40:
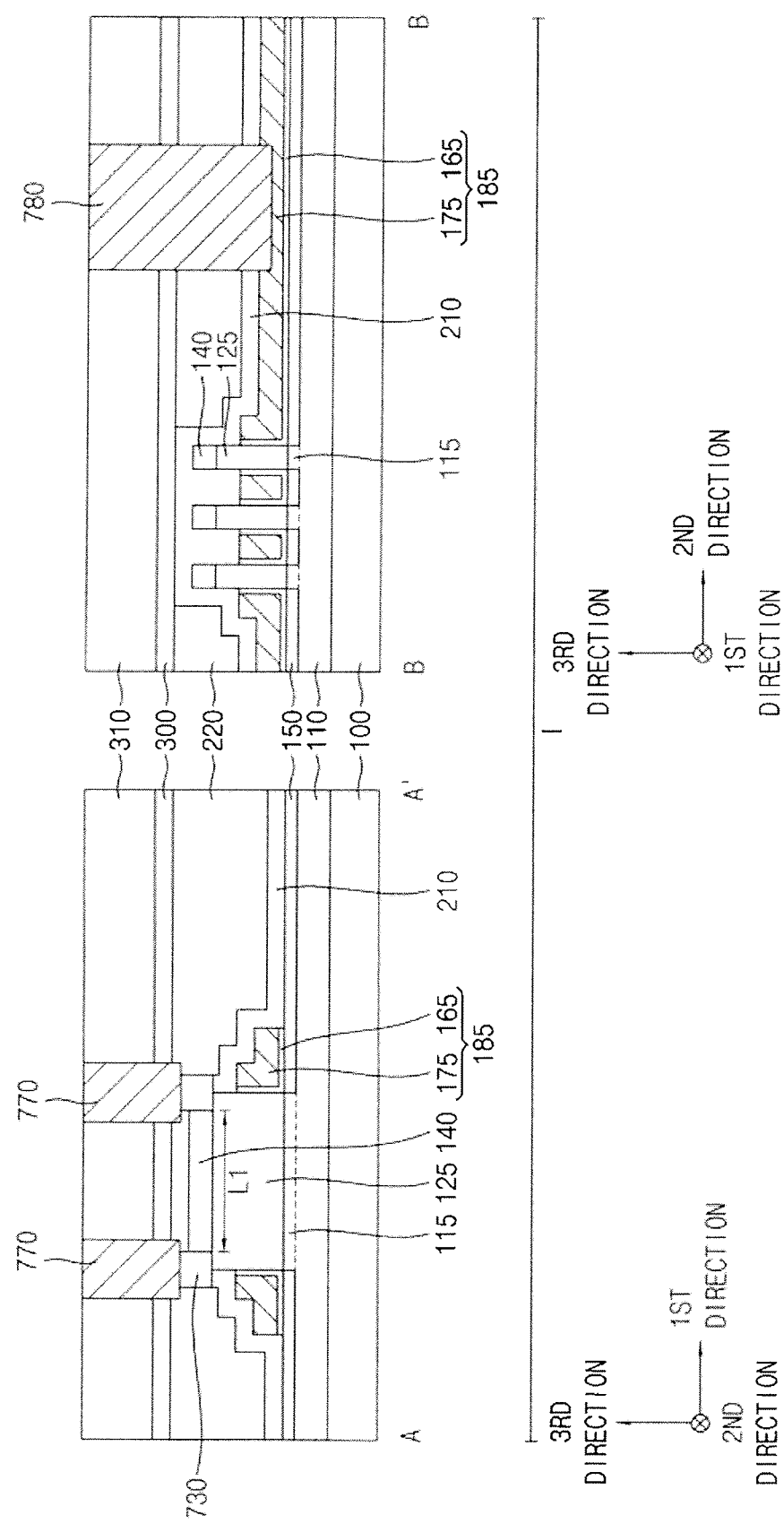
Figure 41:
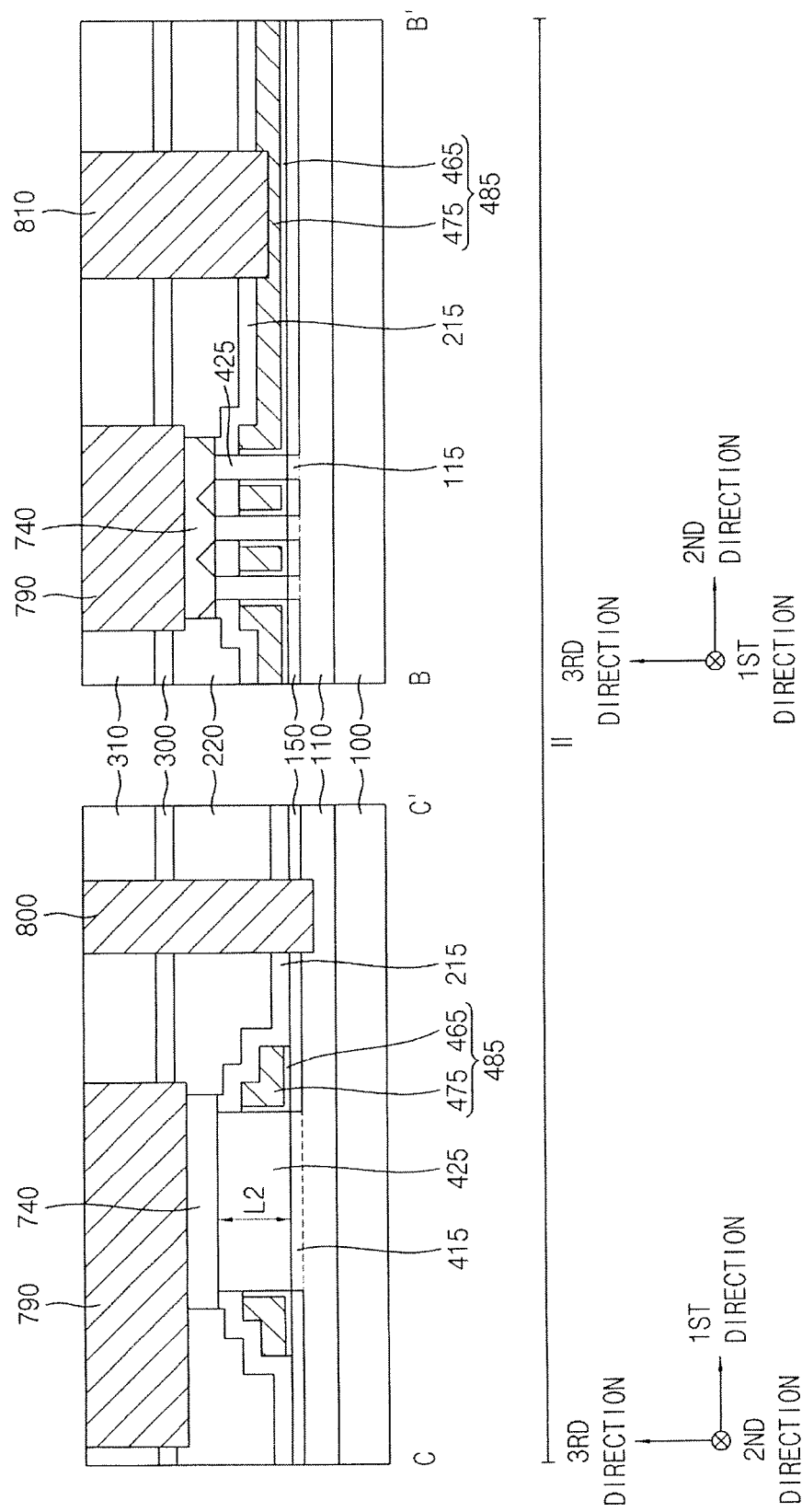

FIGS. 39 to 41 are a plan view and cross-sectional views illustrating a semiconductor device in accordance with exemplary embodiments of the present inventive concept.

FIG. 40 includes cross-sections taken along the line A-A' and the portion of the line B-B' in region I, respectively, of FIG. 39, and FIG. 41 includes cross-sections taken along the portion of the line B-B' in region II and the line C-C', respectively, of FIG. 39.

This semiconductor device may include elements substantially the same as or similar to those of FIGS. 1 and 2 and FIGS. 24 and 25, and thus detailed descriptions thereon may be omitted below in the interest of brevity.

Referring to FIGS. 39 to 41, the semiconductor device may be disposed on the substrate 100 including first and second regions I and II. In an exemplary embodiment of the present inventive concept, the first region I may be a region on which an I/O device of a logic device may be disposed, and the second region II may be a region on which a core device of the logic device may be disposed.

The semiconductor device may include, on the first region I of the substrate 100, the first semiconductor pattern 115 and the first channel pattern 125 sequentially stacked on the first semiconductor layer 110, the first mask 140 and the first capping layer 210 sequentially stacked on a central upper surface of the first channel pattern 125 extending in the first direction, and eighth semiconductor patterns 730 on each of opposite upper edge surfaces of the first channel pattern 125 extending in the first direction.

The semiconductor device may further include, on the first region I of the substrate 100, the first gate structure 185 covering a lower sidewall of the first channel pattern 125, a sixth contact plug 770 contacting an upper surface of each eighth semiconductor pattern 730, and a seventh contact plug 780 contacting the first gate electrode 175.

The semiconductor device may include, on the second region II of the substrate 100, the fourth semiconductor pattern 415, the second channel pattern 425, and the ninth semiconductor pattern 740 sequentially stacked on the second channel pattern 425.

The semiconductor device may further include, on the second region II of the substrate 100, the second gate structure 485 covering a lower sidewall of the second channel pattern 425, an eighth contact plug 790 contacting an upper surface of the ninth semiconductor pattern 740, a ninth contact plug 800 contacting an upper surface of the first semiconductor layer 110, and a tenth contact plug 810 contacting the second gate electrode 475.

The first semiconductor layer 110 and the first semiconductor pattern 115 may include a semiconductor material doped with n-type impurities, and each eighth semiconductor pattern 730 may include a semiconductor material doped with p-type impurities. Thus, a channel may be generated in the horizontal direction in the first channel pattern 125 between the first and eighth semiconductor patterns 115 and 730, and a gate length may be a distance between neighboring ones of the eighth semiconductor patterns 730, i.e., the first length L1.

The first semiconductor layer 110 and the fourth and ninth semiconductor patterns 415 and 740 may include a semiconductor material doped with p-type impurities. Thus, a channel may be generated in the vertical direction in the second channel pattern 425 between the fourth and ninth semiconductor patterns 415 and 740, and a gate length may be a distance between the fourth and ninth semiconductor patterns 415 and 740, i.e., the second length L2 that is a thickness of the second channel pattern 425.

A transistor on the first region I of the substrate 100 on which an I/O device is disposed to which an increased voltage is applied may have an increased gate length L1, and a transistor on the second region II of the substrate 100 on which a core device is disposed to which a decreased voltage is applied may have a reduced gate length L2.

Up to now, a PMOS transistor has been illustrated, however, the inventive concepts may not be limited thereto, and the inventive concepts may be applied to an NMOS transistor.

For example, in region I, the first semiconductor layer 110 and the first semiconductor pattern 115 may include a semiconductor material doped with p-type impurities, and each eighth semiconductor pattern 730 may include a semiconductor material doped with n-type impurities. In another example, in region II, the first semiconductor layer 110 and the fourth and ninth semiconductor patterns 415 and 740 may include a semiconductor material doped with n-type impurities.

FIGS. 42 to 53 are plan views and cross-sectional views illustrating stages of a method of manufacturing a semiconductor device in accordance with exemplary embodiments of the present inventive concept. For example, FIGS. 42, 45, 48 and 51 are plan views, and FIGS. 43-44, 46-47, 49-50 and 52-53 are cross-sectional views. Each of FIGS. 43, 46, 49 and 52 includes cross-sections taken along lines A-A' and B-B', respectively, of a corresponding plan view, and each of FIGS. 44, 47, 50 and 53 includes cross-sections taken along lines B-B' and C-C', respectively, of a corresponding plan view. This method may include processes substantially the same as or similar to those of FIGS. 1 to 23, and thus detailed descriptions thereon may be omitted below in the interest of brevity.

Figure 42:
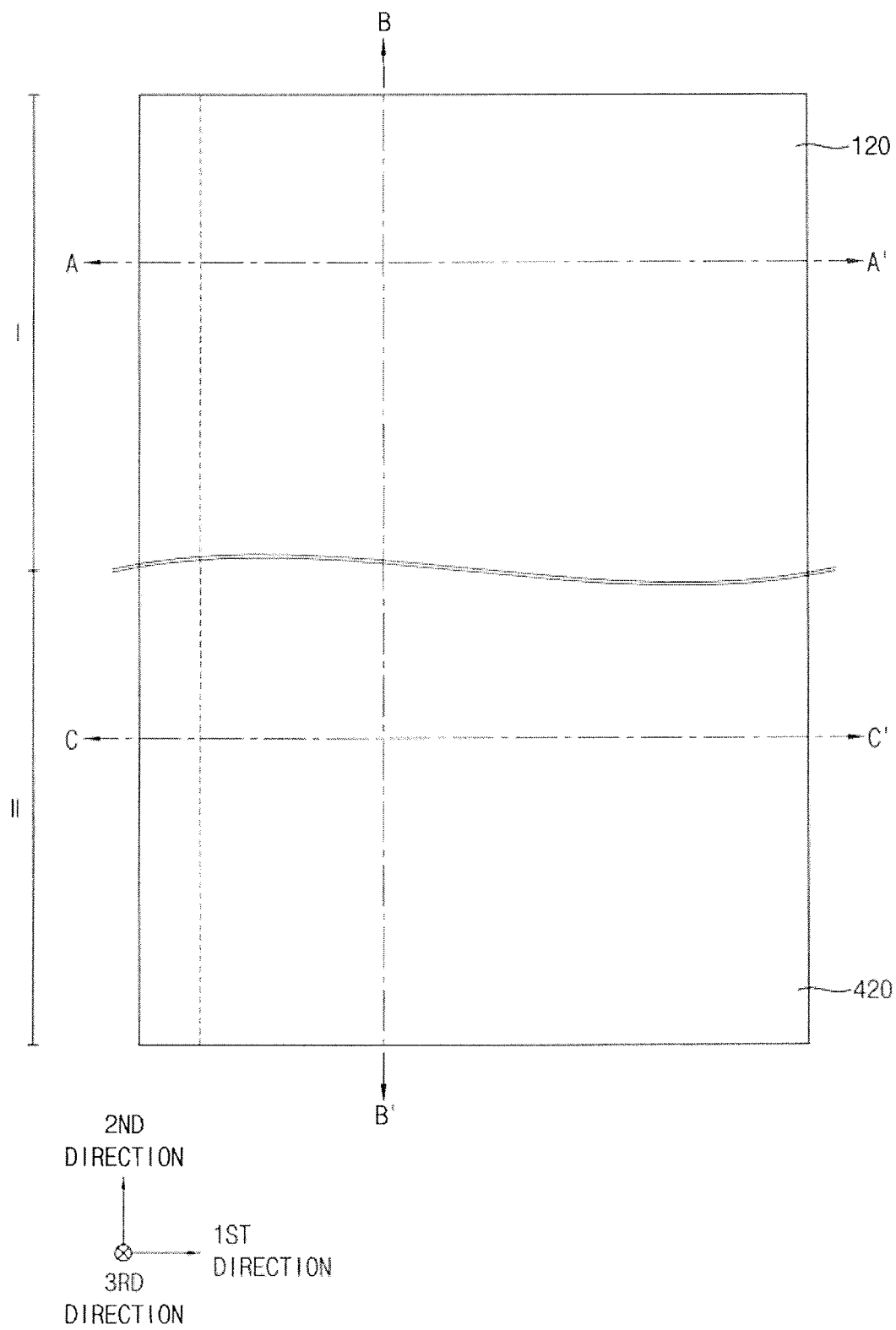
FIGS. 42 to 53 are plan views and cross-sectional views illustrating stages of a method of manufacturing a semiconductor device in accordance with exemplary embodiments of the present inventive concept.
Figure 43:
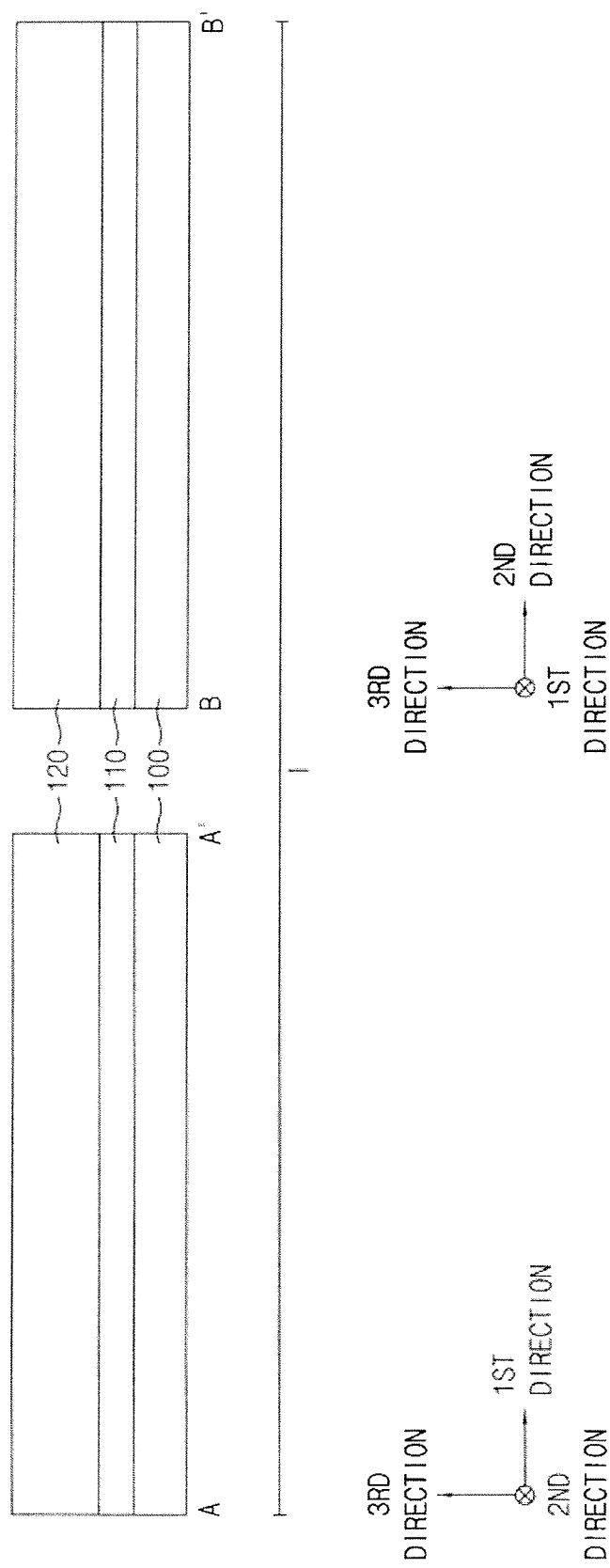
Figure 44:
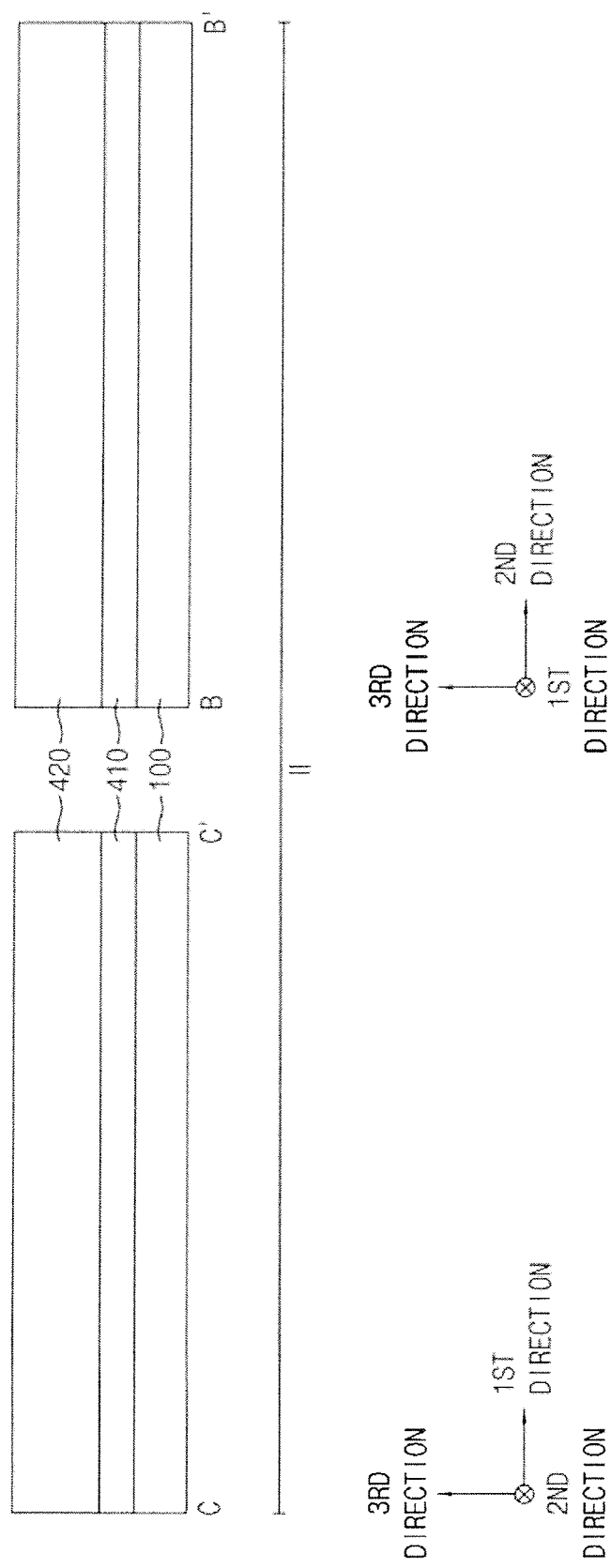

Referring to FIGS. 42 to 44, the first semiconductor layer 110 and the first channel layer 120 may be sequentially disposed on a first region I of the substrate 100, and the fourth semiconductor layer 410 and the second channel layer 420 may be sequentially disposed on a second region II of the substrate 100.

In an exemplary embodiment of the present inventive concept, the first region I may be a region on which an I/O device of a logic device may be disposed, and the second region II may be a region on which a core device of the logic device may be disposed.

The first semiconductor layer 110 and the fourth semiconductor layer 410 may include a semiconductor material doped with n-type impurities and a semiconductor material doped with p-type impurities, respectively. Alternatively, the first semiconductor layer 110 and the fourth semiconductor layer 410 may include a semiconductor material doped with p-type impurities and a semiconductor material doped with n-type impurities, respectively. Hereinafter, only the former case will be illustrated. Each of the first and second channel layers 120 and 420 may include an undoped semiconductor material.

Figure 45:
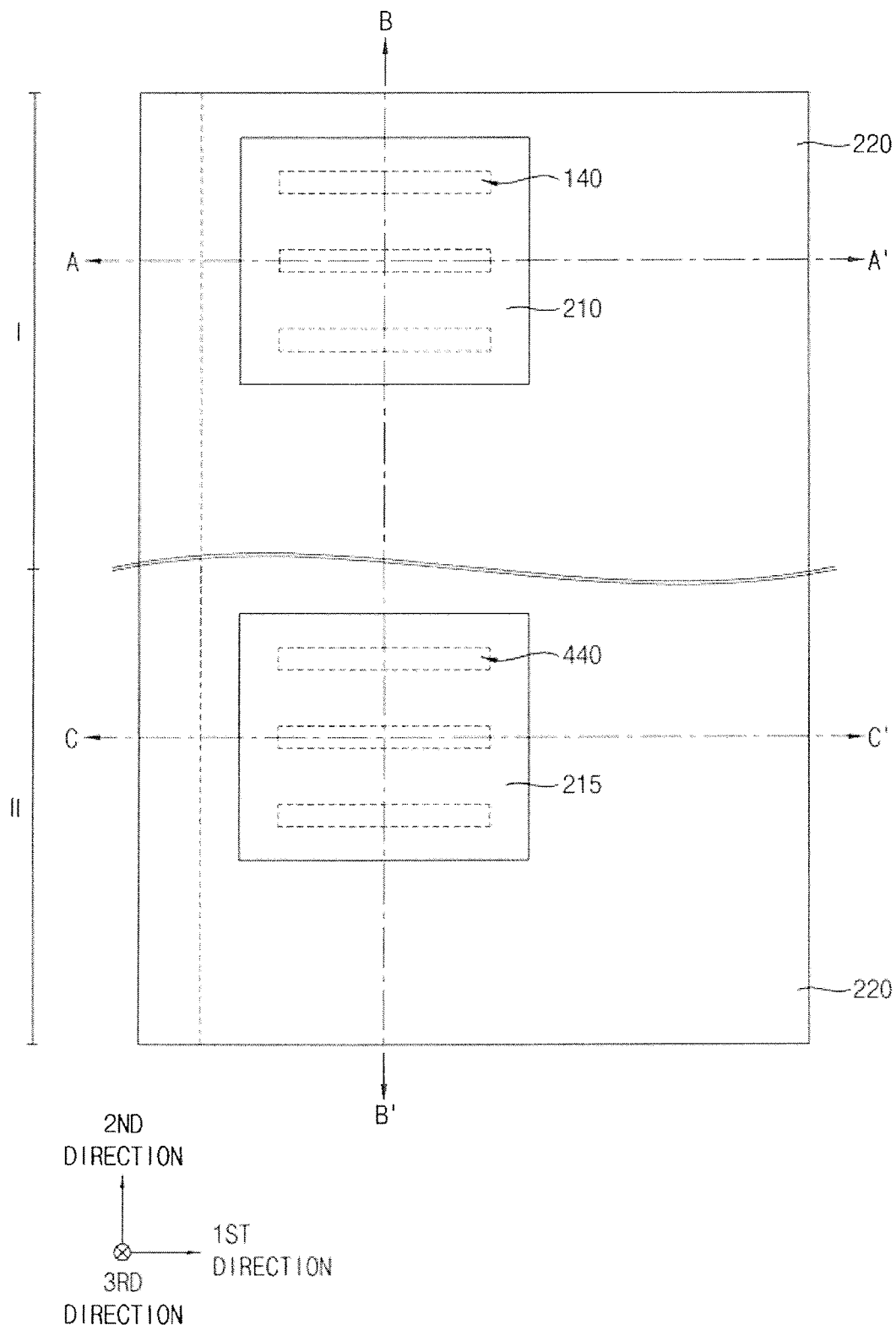
Figure 46:
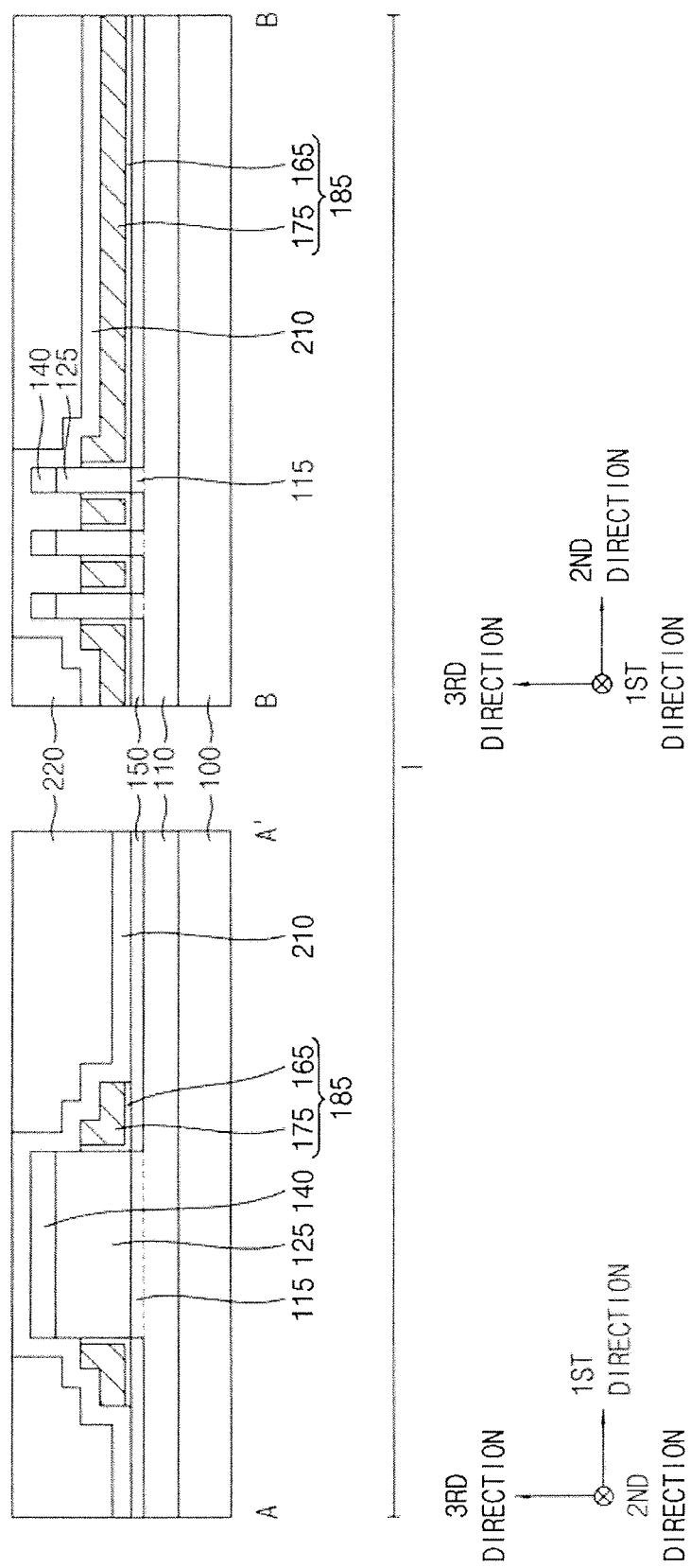
Figure 47:
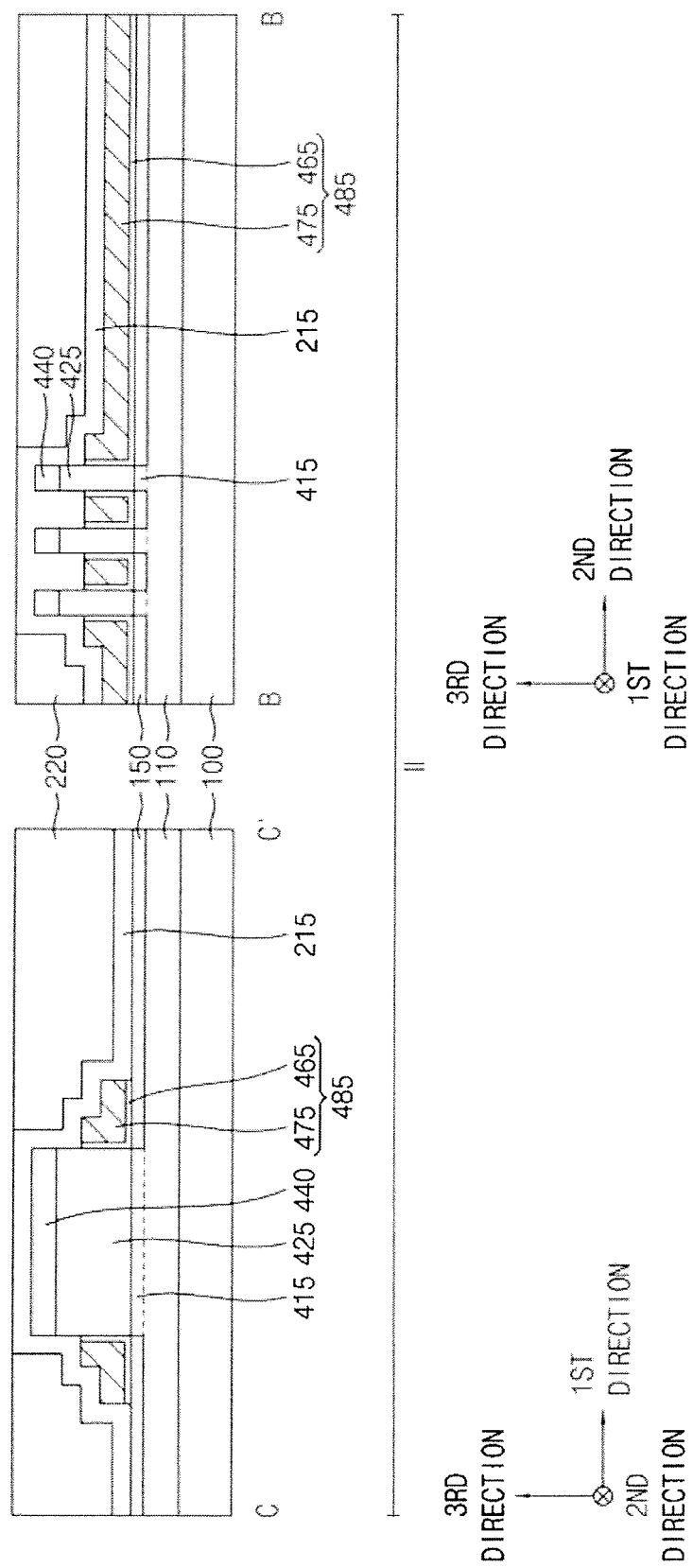

Referring to FIGS. 45 to 47, processes substantially the same as or similar to those illustrated with reference to FIGS. 5 to 13 may be performed.

Thus, on the first region I of the substrate 100, a fourth structure including the first semiconductor pattern 115, the first channel pattern 125, and the first mask 140 sequentially stacked, the first gate structure 185 covering a sidewall of the first channel pattern 125, and the first capping layer 210 covering the first gate structure 185 and the fourth structure may be disposed. The first gate structure 185 may cover not the entire sidewall of the first channel pattern 125 but only a lower sidewall of the first channel pattern 125.

Additionally, on the second region II of the substrate 100, a fifth structure including the fourth semiconductor pattern 415, the second channel pattern 425, and a fifth mask 440 sequentially stacked, the second gate structure 485 covering a sidewall of the second channel pattern 425, and the second capping layer 215 covering the second gate structure 485 and the fifth structure may be disposed. The second gate structure 485 may cover only a lower sidewall of the second channel pattern 425.

Figure 48:
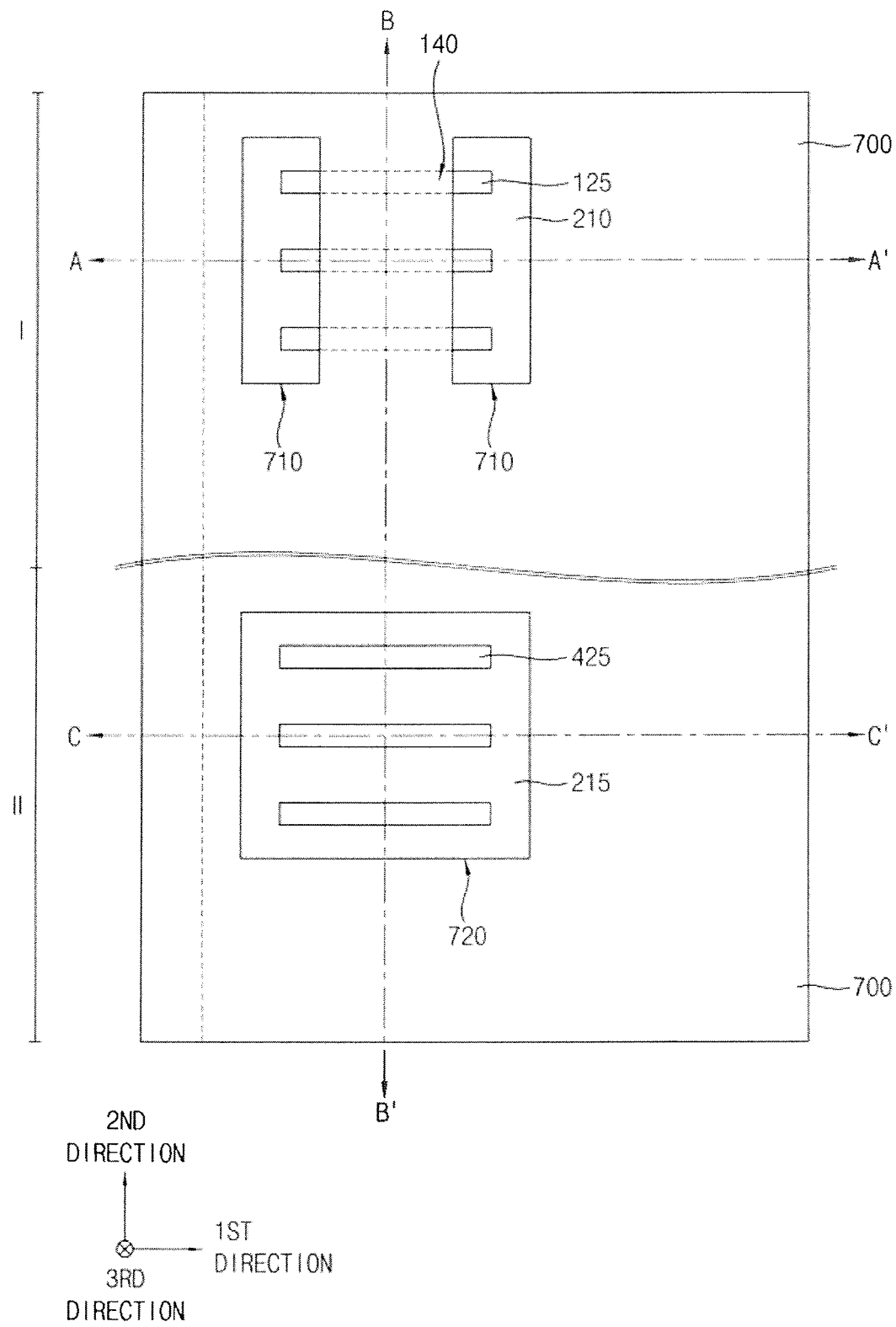
Figure 49:
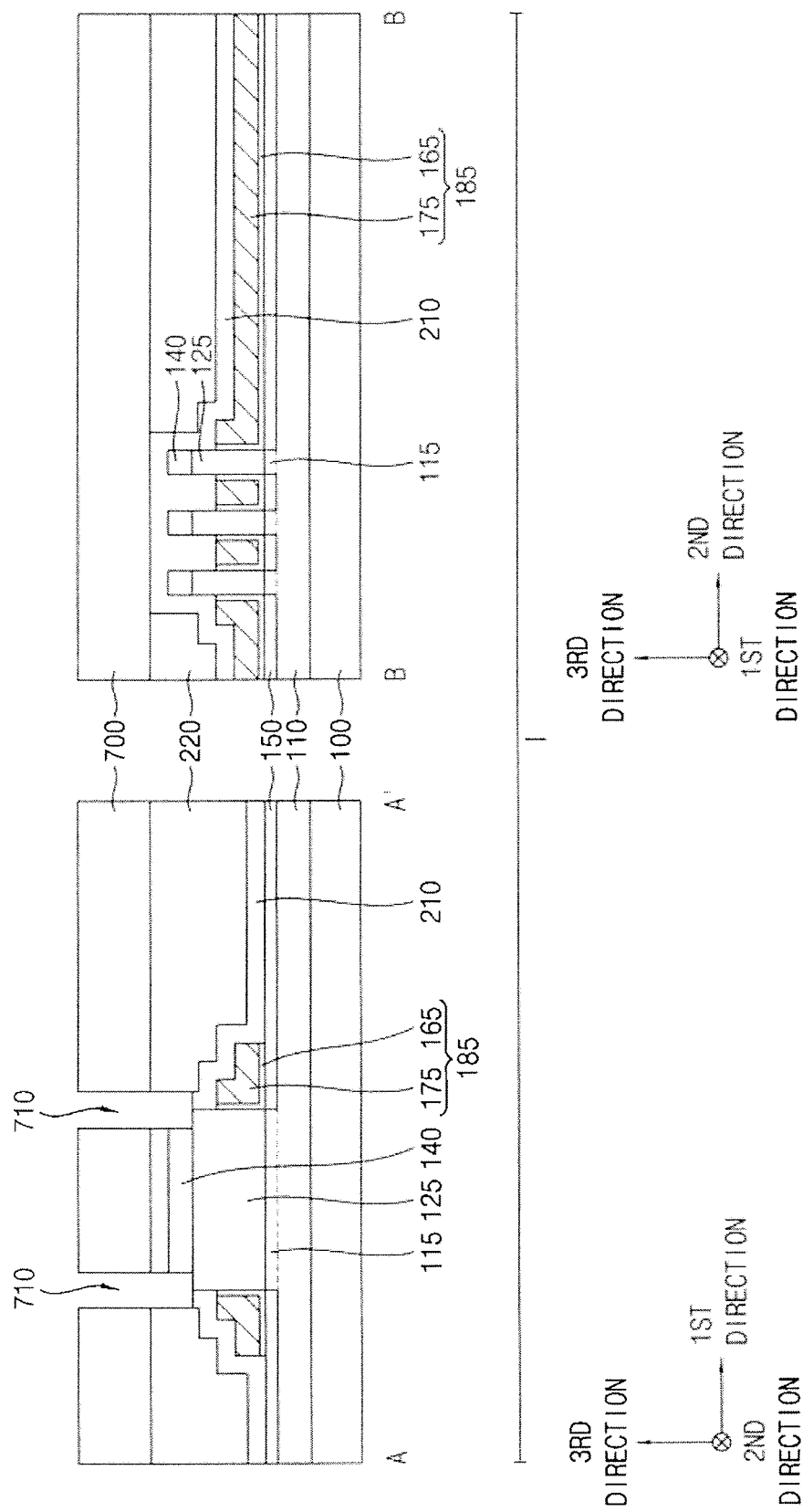
Figure 50:
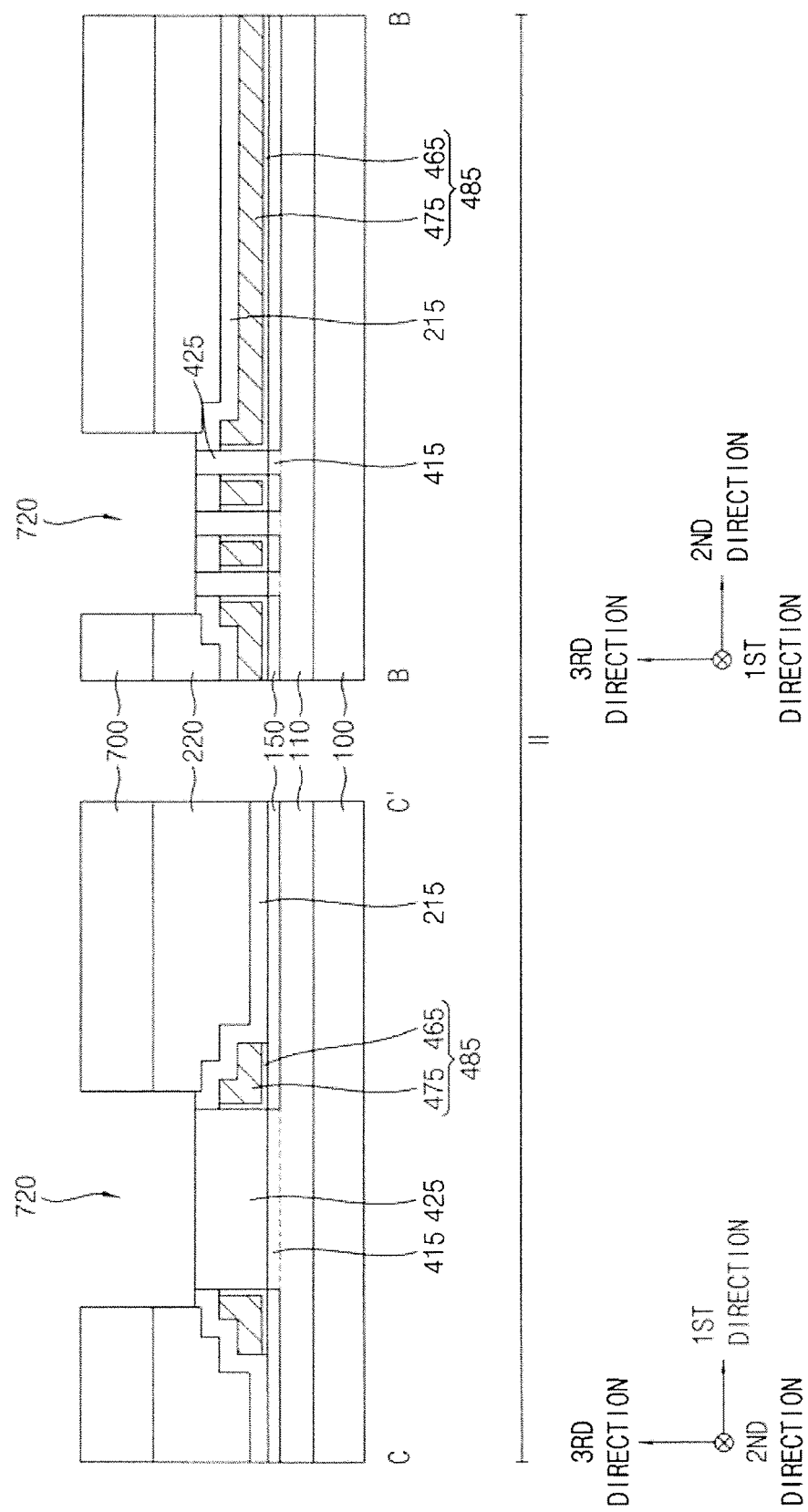

Referring to FIGS. 48 to 50, processes substantially the same as or similar to those illustrated with reference to FIGS. 18 to 19 may be performed.

For example, an eighth mask 700 including eleventh openings 710 overlapping opposite ends of the fourth structure in the first direction and a twelfth opening 720 overlapping the fifth structure may be disposed on the first insulating interlayer 220 and the first capping layer 210, and the first insulating interlayer 220 and the second capping layer 215. The underlying first and second capping layers 210 and 215 and the first and fifth masks 140 and 440 may be etched using the eighth mask 700 as an etching mask.

Thus, on the first region I of the substrate 100, opposite ends of each first channel pattern 125 in the first direction may be exposed by each of the eleventh openings 710, and a portion of the first capping layer 210 adjacent thereto may be also exposed. Additionally, on the second region II of the substrate 100, the second channel pattern 425 may be exposed by the second opening 720, and a portion of the second capping layer 215 adjacent thereto may be also exposed.

Figure 51:
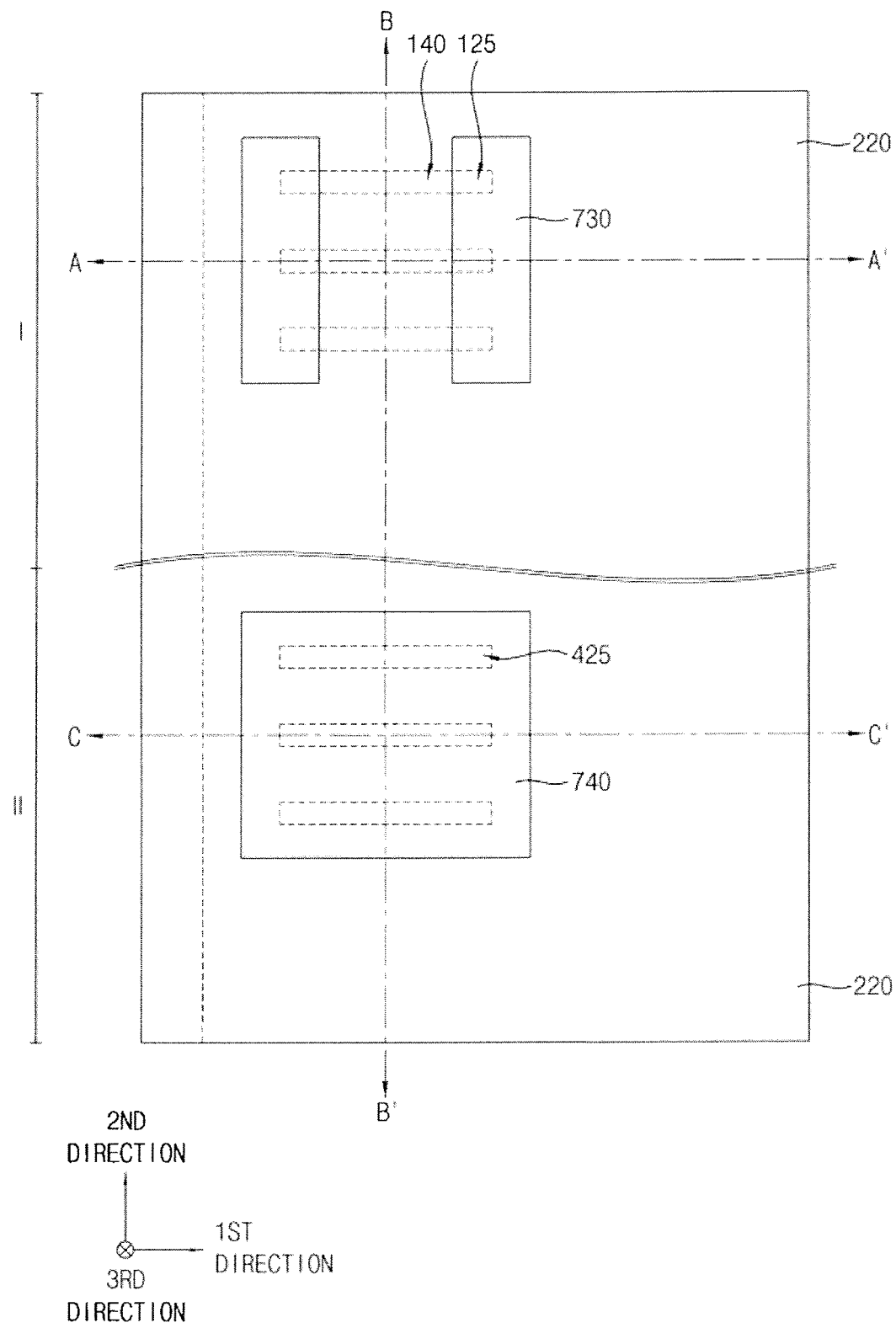
Figure 52:
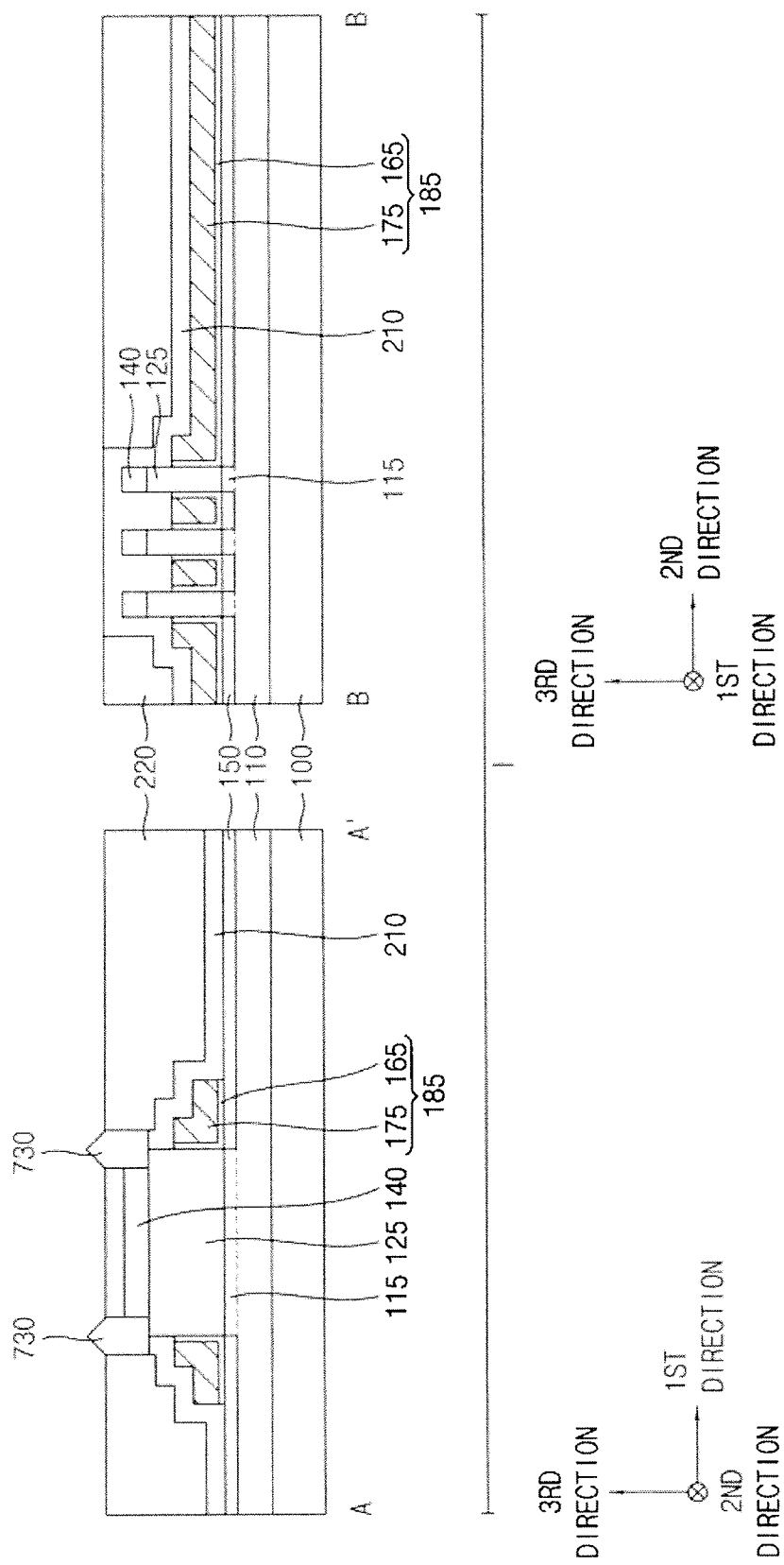
Figure 53:
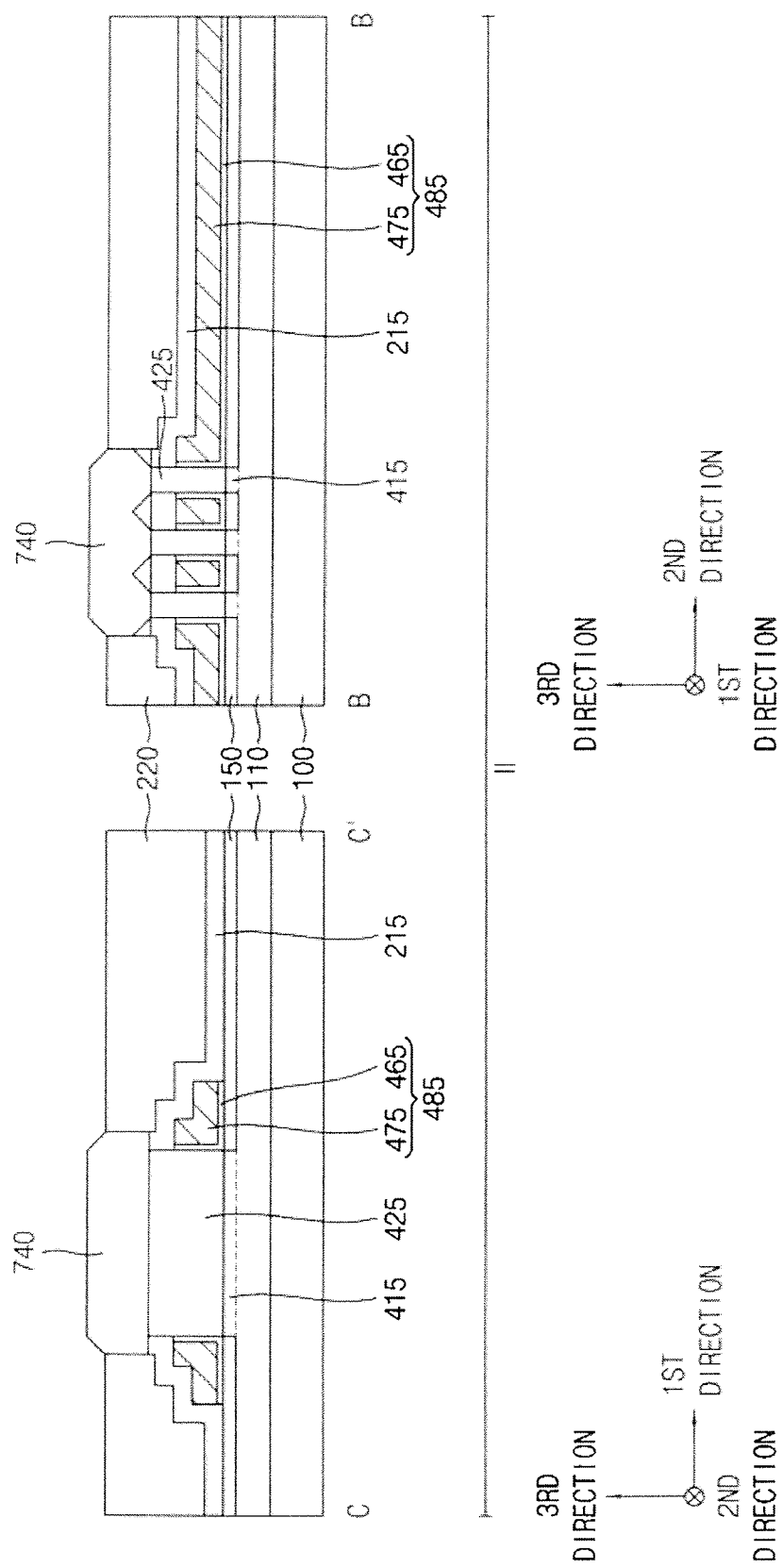

Referring to FIGS. 51 to 53, processes substantially the same as or similar to those illustrated with reference to FIGS. 49 to 50 may be performed.

Thus, the eighth mask 700 is removed, and a SEG process may be performed using the exposed upper surfaces of the first and second channel patterns 125 and 425, respectively, as a seed to form eighth and ninth semiconductor patterns 730 and 740 filling the eleventh and twelfth openings 710 and 720, respectively, and including a semiconductor material doped with p-type impurities. When the first and fourth semiconductor patterns 115 and 415 include p-type impurities and n-type impurities, respectively, the eighth and ninth semiconductor patterns 730 and 740 may include a semiconductor material doped with n-type impurities.

FIGS. 51 to 53 show the eighth semiconductor pattern 730 commonly contacts the first channel patterns 125 spaced apart from each other in the second direction, and the ninth semiconductor pattern 740 commonly contacts the second channel patterns 425 spaced apart from each other in the second direction, however, the inventive concepts may not be limited thereto. That is, two eighth semiconductor patterns 730 may be disposed on the first channel patterns 125, respectively, spaced apart from each other in the second direction to be spaced apart from each other, and two ninth semiconductor patterns 740 may be disposed on the second channel patterns 425, respectively, spaced apart from each other in the second direction to be spaced apart from each other.

Referring to FIGS. 39 to 41 again, processes substantially the same as or similar to those illustrated with reference to FIGS. 22 to 23 and FIGS. 1 and 2 may be performed to complete the semiconductor device.

For example, after planarizing upper portions of the eighth and ninth semiconductor patterns 730 and 740, the etch stop layer 300 and the second insulating interlayer 310 may be sequentially disposed on the planarized eighth and ninth semiconductor patterns 730 and 740 and the first insulating interlayer 220. The etch stop layer 300 and the second insulating interlayer 310 may not partially fill a space between the eighth semiconductor pattern 730, which may commonly contact the upper surfaces of the first channel patterns 125 spaced apart from each other in the second direction, and the first capping layer 210, which may cover the upper sidewalls of the first channel patterns 125, and thus a first air gap (not shown) may be disposed. Likewise, the etch stop layer 300 and the second insulating interlayer 310 may not partially fill a space between the ninth semiconductor pattern 740, which may commonly contact the upper surfaces of the second channel patterns 425 spaced apart from each other in the second direction, and the second capping layer 215, which may cover the upper sidewalls of the second channel patterns 425, and thus a second air gap (not shown) may be disposed.

Still refereeing to FIGS. 39 to 41, sixth contact plugs 770, which may extend through the second insulating interlayer 310 and the etch stop layer 300 and contact upper surfaces of the eighth semiconductor patterns 730, respectively, and a seventh contact plug 780, which may extend through the second insulating interlayer 310, the etch stop layer 300, the first insulating interlayer 220, and the first capping layer 210 and contact the first gate electrode 175, may be disposed on the first region I of the substrate 100. Additionally, an eighth contact plug 790, which may extend through the second insulating interlayer 310 and the etch stop layer 300 and contact an upper surface of the ninth semiconductor pattern 740; a ninth contact plug 800, which may extend through the second insulating interlayer 310, the etch stop layer 300, the first insulating interlayer 220, the first capping layer 215, and the first insulation pattern 150 and contact the second gate electrode 475; and a tenth contact plug 810, which may extend through the second insulating interlayer 310, the etch stop layer 300, the first insulating interlayer 220, and the first capping layer 215 and contact the second gate electrode 475 may be disposed on the second region II of the substrate 100.

By the above processes, a logic device including an I/O device having a horizontal channel, and a core device having a vertical channel may be disposed, where the gate length of the logic device may be longer than the gate length of the core device.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A semiconductor device, comprising:
   a first transistor on a substrate, the first transistor including:
      a first semiconductor pattern doped with first impurities;
      a first channel pattern on the first semiconductor pattern;
      second semiconductor patterns contacting upper edge surfaces, respectively, of the first channel pattern, each of the second semiconductor patterns doped with second impurities; and
      a first gate structure surrounding at least a portion of a sidewall of the first channel pattern; and
   a second transistor on the substrate, the second transistor including:
      a third semiconductor pattern doped with third impurities;
      a second channel pattern on the third semiconductor pattern;
      a fourth semiconductor pattern on the second channel pattern, the fourth semiconductor pattern doped with fourth impurities; and a second gate structure surrounding at least a portion of a sidewall of the second channel pattern, wherein the first and second impurities have different conductivity types from each other, and the third and fourth impurities have the same conductivity type as each other, and wherein a first channel is generated in a direction parallel to an upper surface of the substrate in the first channel pattern, and a second channel is generated in a direction perpendicular to the upper surface of the substrate in the second channel pattern.

2. The semiconductor device of claim 1, wherein the first channel pattern including a first channel with a first gate length, and the second channel pattern including a second channel with a second gate length, and wherein the first channel is formed in the direction parallel to the substrate surface, and the second channel is formed in the direction perpendicular to the substrate surface.

3. The semiconductor device of claim 2, wherein the first gate length is greater than the second gate length.

4. The semiconductor device of claim 2, wherein the first transistor comprises an input/output transistor, and the second transistor comprises a core transistor.

\* \* \* \* \*